United States Patent
Xu et al.

(10) Patent No.: US 12,052,031 B2
(45) Date of Patent: Jul. 30, 2024

(54) POLAR CODES FOR UPLINK CONTROL INFORMATION

(71) Applicant: Qualcomm Incorporated, San Diego, CA (US)

(72) Inventors: Changlong Xu, Beijing (CN); Jian Li, Beijing (CN); Liangming Wu, Beijing (CN); Joseph Binamira Soriaga, San Diego, CA (US); Jilei Hou, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/494,621

(22) PCT Filed: Jan. 11, 2018

(86) PCT No.: PCT/CN2018/072202
§ 371 (c)(1),
(2) Date: Sep. 16, 2019

(87) PCT Pub. No.: WO2018/201753
PCT Pub. Date: Nov. 8, 2018

(65) Prior Publication Data
US 2020/0099393 A1   Mar. 26, 2020

(30) Foreign Application Priority Data
May 4, 2017   (WO) ................ PCT/CN2017/083088

(51) Int. Cl.
*H03M 13/09* (2006.01)
*H03M 13/00* (2006.01)
(Continued)

(52) U.S. Cl.
CPC .......... *H03M 13/09* (2013.01); *H03M 13/13* (2013.01); *H03M 13/2927* (2013.01);
(Continued)

(58) Field of Classification Search
CPC .. H03M 13/09; H03M 13/13; H03M 13/2927; H03M 13/616; H04L 1/0061; H04L 1/0072; H04W 72/0413
(Continued)

(56) References Cited

U.S. PATENT DOCUMENTS

| 8,503,375 B2 | 8/2013 | Malladi et al. |
| 2003/0123470 A1 | 7/2003 | Kim et al. |

(Continued)

FOREIGN PATENT DOCUMENTS

| CN | 102017492 A | 4/2011 |
| CN | 102939739 A | 2/2013 |

(Continued)

OTHER PUBLICATIONS

Bin Li et al: "A RM-Polar Codes", Jul. 21, 2014 (Jul. 2014), XP055270196, Retrieved from https://arxiv.org/ftp/arxiv/papers/1407/1407.5483.pdf (Year: 2014).*

(Continued)

*Primary Examiner* — Xuan Lu
(74) *Attorney, Agent, or Firm* — Holland & Hart LLP

(57) ABSTRACT

Methods, systems, and devices for wireless communication are described. A transmitter may generate a first segmentation based on a first subset of control information and a second segmentation based on jointly encoding the first subset and a second subset of the control information. The transmitter may polar encode the first segmentation to generate a first codeword and the second segmentation to generate a second codeword, and transmit the first and second codewords. A receiver may determine a first bit sequence corresponding to the first subset based on decoding a first codeword and determine an error detection code (EDC) and a second bit sequence corresponding to the second subset based on decoding a second codeword. The (Continued)

receiver may perform error detection on the first and second bit sequences based on the determined EDC, and output the first bit sequence and the second bit sequence or a decoding error.

55 Claims, 26 Drawing Sheets

(51) Int. Cl.

| | | |
|---|---|---|
| H03M 13/13 | (2006.01) | |
| H03M 13/29 | (2006.01) | |
| H03M 13/35 | (2006.01) | |
| H03M 13/37 | (2006.01) | |
| H04L 1/00 | (2006.01) | |
| H04W 72/21 | (2023.01) | |

(52) U.S. Cl.
CPC ........ *H03M 13/616* (2013.01); *H04L 1/0061* (2013.01); *H04L 1/0072* (2013.01); *H04W 72/21* (2023.01)

(58) Field of Classification Search
USPC .......................................................... 370/329
See application file for complete search history.

(56) References Cited

U.S. PATENT DOCUMENTS

| | | | |
|---|---|---|---|
| 2009/0262838 A1 | 10/2009 | Gholmieh et al. | |
| 2012/0210187 A1 | 8/2012 | Yin et al. | |
| 2012/0314613 A1* | 12/2012 | Zhang ................... | H04B 7/0619 370/252 |
| 2013/0117622 A1* | 5/2013 | Blankenship ........... | H04L 1/007 714/751 |
| 2014/0169388 A1 | 6/2014 | Jeong et al. | |
| 2015/0091742 A1* | 4/2015 | Ionita ................... | H03M 13/251 341/57 |
| 2015/0295593 A1* | 10/2015 | Trifonov ............... | H03M 13/13 714/776 |
| 2015/0358113 A1 | 12/2015 | Callard et al. | |
| 2016/0182187 A1 | 6/2016 | Kim et al. | |
| 2017/0047947 A1* | 2/2017 | Hong ................. | H03M 13/2906 |
| 2017/0214416 A1* | 7/2017 | Ge ......................... | H03M 13/13 |
| 2017/0353193 A1* | 12/2017 | Jang .................. | H03M 13/2906 |
| 2019/0158219 A1* | 5/2019 | Blankenship ......... | H03M 13/35 |
| 2019/0190655 A1* | 6/2019 | Pan ...................... | H04L 1/0072 |
| 2019/0238270 A1* | 8/2019 | Pan ....................... | H04L 1/0067 |
| 2019/0334659 A1* | 10/2019 | Ye ........................ | H04L 1/0057 |
| 2019/0335431 A1* | 10/2019 | Wang .................... | H04L 1/0041 |
| 2019/0393987 A1* | 12/2019 | Hong .................... | H04L 1/0061 |
| 2020/0076534 A1* | 3/2020 | Wang .................... | H03M 13/13 |
| 2021/0021283 A1* | 1/2021 | Zhou ..................... | H04L 1/0057 |

FOREIGN PATENT DOCUMENTS

| | | |
|---|---|---|
| CN | 103220083 A | 7/2013 |
| CN | 105227189 A | 1/2016 |
| JP | 2014531825 A | 11/2014 |
| JP | 2020511027 A | 4/2020 |
| WO | WO-2009023730 | 2/2009 |
| WO | WO-2009131979 A2 | 10/2009 |
| WO | WO-2014092516 A1 | 6/2014 |
| WO | WO-2017051724 A1 | 3/2017 |
| WO | WO-2017054164 A1 | 4/2017 |
| WO | WO-2018144683 A1 | 8/2018 |

OTHER PUBLICATIONS

International Search Report and Written Opinion—PCT/CN2018/072202—ISA/EPO—dated Apr. 8, 2018.
Du W., et al., "Exploiting the UEP Property of Polar Codes to Reduce Image Distortions Induced by Transmission Errors", 2015 IEEE/CIC International Conference on Communications in China (ICCC), Nov. 2, 2015 (Nov. 2, 2015), pp. 1-5.
International Search Report and Written Opinion—PCT/CN2017/083088—ISA/EPO—dated Jan. 12, 2018.
Samsung: "Timing Offset of HS-SCCH", 3GPP Draft, R3-020678, TSG-RAN WG 3 meeting #27, HS-SCCH Timing, 3rd Generation Partnership Project (3GPP), Mobile Competence Centre, 650, Route Des Lucioles, F-06921 Sophia-Antipolis Cedex, France, vol. RAN WG3, No. Orlando, USA, Feb. 25, 2002, Feb. 25, 2002 (Feb. 25, 2002), XP050152456, 6 Pages, [retrieved on Feb. 25, 2002].
Supplementary European Search Report—EP18794772—Search Authority—Munich—dated Jan. 12, 2021.
Taiwan Search Report—TW107115064—TIPO—dated Sep. 27, 2021.
Huawei, et al., "Handling Collision Between sTTI and 1ms TTI," 3GPP Draft, 3GPP TSG RAN WG1 Meeting #86bis, R1-1608640, 3rd Generation Partnership Project (3GPP), Mobile Competence Centre; 650, Route Des Lucioles; F-06921 Sophia-antipolis Cedex; France, vol. RAN WG1, No. Lisbon, Portugal; Oct. 10, 2016-Oct. 14, 2016, Oct. 9, 2016 (Oct. 9, 2016), XP051148699, 5 pages, Retrieved from the Internet: URL:http://www.3gpp.org/ftp/Meetings_3GPP_SYNC/RAN1/Docs/ [retrieved on Oct. 9, 2016], Fig. 1, Sections 1, 2, 3.1, 3.2, 3.3 and 3.4.
Sharp: "Concatenation of Dual RM Coding Bits for UCI on PUSCH", 3GPP TSG RAN WG1 Meeting #63bis, R1-110274, Dublin, Ireland, Jan. 17-21, 2011, pp. 1-7.
LG Electronics: "Enhancement to UCI on PUSCH for Rel-13 CA", R1-152719, 3GPP TSG RAN WG1 Meeting #81, Fukuoka, Japan, May 25-29, 2015, May 14, 2015, 4 Pages.
Huawei, et al., "Polar Code Construction for NR", 3GPP TSG RAN WG1 Meeting #86bis, 3GPP Draft, R1-1608862, Polar Code Construction for NR, 3rd Generation Partnership Project (3GPP), Mobile Competence Centre, 650, Route Des Lucioles, F-06921 Sophia-Antipolis Cedex, France, vol. RAN WG1, No. Lisbon, Portugal, Oct. 10, 2016-Oct. 14, 2016, Oct. 14, 2016 (Oct. 14, 2016), 8 Pages, XP051159189, XP051148916, Oct. 9, 2016, Retrieved from the Internet: URL: https://www.3gpp.org/ftp/TSG_RAN/WG1_RL1/TSGR1_86b/Docs/R1-1608862.zip [retrieved on Oct. 1, 2016] the whole document, p. 1 and 2.
Samsung: "Timing offset of HS-SCCH", 3GPP TSG-RAN WG1 #24, Tdoc R1-02-0243, HS-SCCH Timing, 3rd Generation Partnership Project, Mobile Competence Centre, 650, Route Des Lucioles, F-06921 Sophia-Antipolis Cedex, France, vol. RAN WG1, No. Orlando, USA, Feb. 15, 2002, Feb. 15, 2002, XP050095833, 8 Pages.
Ericsson: "Polar Code Design for Control Channel of NR", 3GPP TSG RAN WG1 AH_NR Meeting, R1-1700112 Spokane, USA, Jan. 16-20, 2017, 3 Pages, URL: https://www.3gpp.org/ftp/tsg_ran/WG1_RL1/TSGR1_AH/NR_AH_1701/Docs/R1-1700112.zip.
Hadi A., et al., "On Enhancing the Minimum Hamming Distance of Polar Codes", 2016 IEEE 17th International Workshop on Signal Processing Advances in Wireless Communications (SPAWC), 5 Pages, IEEE, 2016, https://ieeexplore.ieee.org/stamp/stamp.jsp?tp=arnumber=7536756, DOI:10.1109/SPAWC.2016.7536756.
Intel Corporation: "On Multi-Stage Physical DL Control[online]", 3GPP TSG RAN WG1 adhoc_NR_AH_1701, R1-1700361, Spokane, WA, USA, Jan. 16-20, 2017, pp. 1-2, URL: http://www.3gpp.org/ftp/tsg_ran/WG1_RL1/TSGR1_AH/NR_AH_1701/Docs/R1-1700361.zip.

\* cited by examiner

POLAR CODES FOR UPLINK CONTROL INFORMATION

CROSS REFERENCE

The present Application is a 371 national phase filing of International Patent Application No. PCT/CN2018/072202 by Xu et al., titled "POLAR CODES FOR UPLINK CONTROL INFORMATION", filed Jan. 11, 2018, and to International Patent Application No. PCT/CN2017/083088 to Xu et. al., titled "POLAR CODES FOR UPLINK CONTROL INFORMATION", filed May 4, 2017, each of which is assigned to the assignee hereof which is hereby incorporated by reference in their entirety.

BACKGROUND

The following relates generally to wireless communication, and more specifically to polar codes for uplink control information.

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include code division multiple access (CDMA) systems, time division multiple access (TDMA) systems, frequency division multiple access (FDMA) systems, and orthogonal frequency division multiple access (OFDMA) systems, (e.g., a Long Term Evolution (LTE) system, or a New Radio (NR) system). A wireless multiple-access communications system may include a number of base stations or access network nodes, each simultaneously supporting communication for multiple communication devices, which may be otherwise known as user equipment (UE).

Data transmission, however, often involves sending data over a noisy communication channel. To combat noise, a transmitter may encode code blocks using error correcting codes that introduce redundancy in the code block so that transmission errors may be detected and corrected. Some examples of encoding algorithms with error correcting codes include convolutional codes (CCs), low-density parity-check (LDDC) codes, and polar codes. A polar code is an example of a linear block error correcting code and is the first coding technique to provably approach channel capacity. A transmitter may use error correcting codes for correcting errors in control information being transmitted to a receiver. The receiver may process the control information and perform an operation as instructed in the control information. Existing implementations, however, do not efficiently utilize polar codes and use bit repetition techniques that detrimentally impact information throughput.

SUMMARY

The described techniques relate to improved methods, systems, devices, or apparatuses that support polar codes for uplink control information. Generally, the described techniques provide for improved coding gain when transmitting control information having a large block size. In some examples, control information is separated into segmentations based on priority and unequal error protection (UEP) is provided to different control information segmentations. A high priority subset may permit early decoding, may be encoded using the most reliable sub-channels of a polar code, may be encoded using an adaptive coding rate, and may be self-decodable. A low priority subset may be encoded using less reliable sub-channels of a polar code, and decoding of the low priority subset may depend on the decoding of the high priority subset. Beneficially, the segmentation techniques described herein provide higher coding gain than conventional techniques that use repetition to transmit control information. The techniques described herein also beneficially support early termination of decoding and improved decoder power efficiency.

A method of wireless communication is described. The method may include generating a first control information segmentation based at least in part on a first subset of control information, generating a second control information segmentation based at least in part on jointly encoding the first subset of the control information and a second subset of the control information, polar encoding the first control information segmentation to generate a first codeword and the second control information segmentation to generate a second codeword, and transmitting the first codeword and the second codeword.

An apparatus for wireless communication is described. The apparatus may include means for generating a first control information segmentation based at least in part on a first subset of control information, means for generating a second control information segmentation based at least in part on jointly encoding the first subset of the control information and a second subset of the control information, means for polar encoding the first control information segmentation to generate a first codeword and the second control information segmentation to generate a second codeword, and means for transmitting the first codeword and the second codeword.

Another apparatus for wireless communication is described. The apparatus may include a processor, memory in electronic communication with the processor, and instructions stored in the memory. The instructions may be operable to cause the processor to generate a first control information segmentation based at least in part on a first subset of control information, generate a second control information segmentation based at least in part on jointly encoding the first subset of the control information and a second subset of the control information, polar encode the first control information segmentation to generate a first codeword and the second control information segmentation to generate a second codeword, and transmit the first codeword and the second codeword.

A non-transitory computer readable medium for wireless communication is described. The non-transitory computer-readable medium may include instructions operable to cause a processor to generate a first control information segmentation based at least in part on a first subset of control information, generate a second control information segmentation based at least in part on jointly encoding the first subset of the control information and a second subset of the control information, polar encode the first control information segmentation to generate a first codeword and the second control information segmentation to generate a second codeword, and transmit the first codeword and the second codeword.

Some examples of the method, apparatus, and non-transitory computer-readable medium described above may further include processes, features, means, or instructions for allocating the control information into the first subset and the second subset based at least in part on priority.

In some examples of the method, apparatus, and non-transitory computer-readable medium described above, jointly encoding the first subset of the control information and the second subset of the control information comprises: determining an error detection code (EDC) based at least in part on the first subset of the control information and the second subset of the control information.

In some examples of the method, apparatus, and non-transitory computer-readable medium described above, polar encoding the second control information segmentation to generate the second codeword further comprises: loading a plurality of frozen bits, bits of the EDC, bits of the first subset of the control information, and bits of the second subset of the control information into respective sub-channels of a polar code based at least in part on a reliability order of the sub-channels.

In some examples of the method, apparatus, and non-transitory computer-readable medium described above, the second control information segmentation comprises bits of the EDC, bits of the first subset of the control information, and bits of the second subset of the control information.

In some examples of the method, apparatus, and non-transitory computer-readable medium described above, the second control information segmentation comprises bits of the EDC and bits of the second subset of the control information.

In some examples of the method, apparatus, and non-transitory computer-readable medium described above, generating the first control information segmentation further comprises: determining an EDC based at least in part on the first subset of the control information.

In some examples of the method, apparatus, and non-transitory computer-readable medium described above, polar encoding the first control information segmentation to generate the first codeword comprises: loading a plurality of frozen bits, the bits of the EDC, and the bits of the first subset of the control information into respective sub-channels of a polar code based at least in part on a reliability order of the sub-channels.

In some examples of the method, apparatus, and non-transitory computer-readable medium described above, the first control information segmentation comprises bits of the EDC and bits of the first subset of the control information.

Some examples of the method, apparatus, and non-transitory computer-readable medium described above may further include processes, features, means, or instructions for generating a hybrid Reed-Muller Polar (RM-Polar) code based at least in part on the first subset of the control information, wherein the first control information segmentation comprises bits of the RM-Polar code.

In some examples of the method, apparatus, and non-transitory computer-readable medium described above, polar encoding the first control information segmentation to generate the first codeword comprises: loading a plurality of frozen bits and the bits of the KM-Polar code into respective sub-channels of a polar code based at least in part on a reliability order of the sub-channels.

In some examples of the method, apparatus, and non-transitory computer-readable medium described above, generating the RM-Polar code comprises: obtaining a generator matrix based at least in part on a coded block size. Some examples of the method, apparatus, and non-transitory computer-readable medium described above may further include processes, features, means, or instructions for determining a hamming distance such that a number of rows of the generator matrix with a weight exceeding the hamming distance at least may be the same as a number of bits of the first subset of the control information. Some examples of the method, apparatus, and non-transitory computer-readable medium described above may further include processes, features, means, or instructions for selecting a subset of the rows of the generator matrix based at least in part on a reliability of each sub-channel of a plurality of sub-channels of a polar code, Some examples of the method, apparatus, and non-transitory computer-readable medium described above may further include processes, features, means, or instructions for mapping the first subset of the control information to the selected subset of the rows.

Some examples of the method, apparatus, and non-transitory computer-readable medium described above may further include processes, features, means, or instructions for determining a first EDC based at least in part on the first subset of the control information and a second subset of the control information. Some examples of the method, apparatus, and non-transitory computer-readable medium described above may further include processes, features, means, or instructions for determining a second EDC based at least in part on the first subset of the control information, wherein a bit length of the first EDC differs from a bit length of the second EDC.

In some examples of the method, apparatus, and non-transitory computer-readable medium described above, the first subset of the control information includes one or more of acknowledgement data, rank index data, precode matrix index data, or any combination thereof. In some examples of the method, apparatus, and non-transitory computer-readable medium described above, the second subset of the control information includes channel quality indicator data.

A method of wireless communication is described. The method may include determining a first bit sequence corresponding to a first subset of control information based at least in part on decoding a first polar-encoded codeword, determining an EDC and a second bit sequence corresponding to a second subset of the control information based at least in part on decoding a second polar-encoded codeword, performing error detection on the first bit sequence and the second bit sequence based at least in part on the determined EDC, and outputting, based at least in part on the error detection, one of: a combination of the first bit sequence and the second bit sequence or a decoding error.

An apparatus for wireless communication is described. The apparatus may include means for determining a first bit sequence corresponding to a first subset of control information based at least in part on decoding a first polar-encoded codeword, means for determining an EDC and a second bit sequence corresponding to a second subset of the control information based at least in part on decoding a second polar-encoded codeword, means for performing error detection on the first bit sequence and the second bit sequence based at least in part on the determined EDC, and means for outputting, based at least in part on the error detection, one of a combination of the first bit sequence and the second bit sequence or a decoding error.

Another apparatus for wireless communication is described. The apparatus may include a processor, memory in electronic communication with the processor, and instructions stored in the memory. The instructions may be operable to cause the processor to determine a first bit sequence corresponding to a first subset of control information based at least in part on decoding a first polar-encoded codeword, determine an EDC and a second bit sequence corresponding to a second subset of the control information based at least in part on decoding a second polar-encoded codeword, perform error detection on the first bit sequence and the second bit sequence based at least in part on the determined EDC, and output, based at least in part on the error detection, one of: a combination of the first bit sequence and the second bit sequence or a decoding error.

A non-transitory computer readable medium for wireless communication is described. The non-transitory computer-readable medium may include instructions operable to cause a processor to determine a first bit sequence corresponding to a first subset of control information based at least in part on decoding a first polar-encoded codeword, determine an EDC and a second bit sequence corresponding to a second subset of the control information based at least in part on decoding a second polar-encoded codeword, perform error detection on the first bit sequence and the second bit sequence based at least in part on the determined EDC, and output, based at least in part on the error detection, one of: a combination of the first bit sequence and the second bit sequence or a decoding error.

In some examples of the method, apparatus, and non-transitory computer-readable medium described above, decoding the first polar-encoded codeword further comprises: determining a plurality of candidate paths through a code tree. Some examples of the method, apparatus, and non-transitory computer-readable medium described above may further include processes, features, means, or instructions for selecting a candidate path of the plurality of candidate paths. Some examples of the method, apparatus, and non-transitory computer-readable medium described above may further include processes, features, means, or instructions for obtaining the first bit sequence and a second EDC from the selected candidate path. Some examples of the method, apparatus, and non-transitory computer-readable medium described above may further include processes, features, means, or instructions for determining that the first bit sequence passes error detection based at least in part on the second EDC.

In some examples of the method, apparatus, and non-transitory computer-readable medium described above, decoding the second polar-encoded codeword further comprises: setting the first bit sequence as frozen bits in a successive cancellation list (SCL) decoding algorithm. Some examples of the method, apparatus, and non-transitory computer-readable medium described above may further include processes, features, means, or instructions for determining a second plurality of candidate paths through a second code tree based at least in part on the SCL decoding algorithm. Some examples of the method, apparatus, and non-transitory computer-readable medium described above may further include processes, features, means, or instructions for selecting a second candidate path of the second plurality of candidate paths. Some examples of the method, apparatus, and non-transitory computer-readable medium described above may further include processes, features, means, or instructions for obtaining the first bit sequence, the second bit sequence, and the determined EDC from the second candidate path.

In some examples of the method, apparatus, and non-transitory computer-readable medium described above, decoding the second polar-encoded codeword further comprises: calculating an EDC based at least in part on the first bit sequence and the second bit sequence, wherein performing the error detection may be based at least in a comparison of the calculated EDC and the determined EDC.

In some examples of the method, apparatus, and non-transitory computer-readable medium described above, decoding the second polar-encoded codeword further comprises: generating a second plurality of candidate paths through a second code tree based at least in part on a SCL decoding algorithm. Some examples of the method, apparatus, and non-transitory computer-readable medium described above may further include processes, features, means, or instructions for selecting a second candidate path of the second plurality of candidate paths. Some examples of the method, apparatus, and non-transitory computer-readable medium described above may further include processes, features, means, or instructions for obtaining the second bit sequence and the determined. EDC from the second candidate path. Some examples of the method, apparatus, and non-transitory computer-readable medium described above may further include processes, features, means, or instructions for calculating an EDC based at least in part on the first bit sequence and the second bit sequence, wherein performing the error detection may be based at least in a comparison of the calculated EDC and the determined EDC.

In some examples of the method, apparatus, and non-transitory computer-readable medium described above, decoding the first polar-encoded codeword further comprises: determining a plurality of candidate paths through a code tree. Some examples of the method, apparatus, and non-transitory computer-readable medium described above may further include processes, features, means, or instructions for selecting a candidate path of the plurality of candidate paths. Some examples of the method, apparatus, and non-transitory computer-readable medium described above may further include processes, features, means, or instructions for obtaining the first bit sequence and a second EDC from the selected candidate path. Some examples of the method, apparatus, and non-transitory computer-readable medium described above may further include processes, features, means, or instructions for making a decision on early termination of decoding of the second polar-encoded codeword based at least in part on the second EDC.

In some examples of the method, apparatus, and non-transitory computer-readable medium described above, decoding the second polar-encoded codeword further comprises: setting the first bit sequence as frozen bits in a SCL decoding algorithm. Some examples of the method, apparatus, and non-transitory computer-readable medium described above may further include processes, features, means, or instructions for generating a plurality of candidate paths through a code tree based at least in part on the SCL decoding algorithm. Some examples of the method, apparatus, and non-transitory computer-readable medium described above may further include processes, features, means, or instructions for selecting a candidate path of the plurality of candidate paths. Some examples of the method, apparatus, and non-transitory computer-readable medium described above may further include processes, features, means, or instructions for obtaining the second bit sequence and the determined EDC from the selected candidate path. Some examples of the method, apparatus, and non-transitory computer-readable medium described above may further include processes, features, means, or instructions for calculating an EDC based at least in part on the first bit sequence and the second bit sequence, wherein performing the error detection may be based at least in a comparison of the calculated EDC and the determined EDC.

In some examples of the method, apparatus, and non-transitory computer-readable medium described above, decoding the first polar-encoded codeword further comprises: determining a plurality of candidate paths through a code tree. Some examples of the method, apparatus, and non-transitory computer-readable medium described above may further include processes, features, means, or instructions for selecting a candidate path of the plurality of candidate paths. Some examples of the method, apparatus, and non-transitory computer-readable medium described above may further include processes, features, means, or instructions for obtaining the first bit sequence from the selected candidate path.

In some examples of the method, apparatus, and non-transitory computer-readable medium described above, decoding the second polar-encoded codeword further comprises: generating a second plurality of candidate paths through a second code tree based at least in part on a SCL decoding algorithm. Some examples of the method, apparatus, and non-transitory computer-readable medium described above may further include processes, features, means, or instructions for selecting a candidate path of the plurality of candidate paths. Some examples of the method, apparatus, and non-transitory computer-readable medium described above may further include processes, features, means, or instructions for obtaining the second bit sequence and the determined EDC from the selected candidate path. Some examples of the method, apparatus, and non-transitory computer-readable medium described above may further include processes, features, means, or instructions for calculating an EDC based at least in part on the first bit sequence and the second bit sequence, wherein performing the error detection may be based at least in a comparison of the calculated EDC and the determined EDC.

DETAILED DESCRIPTION

Figure 1:
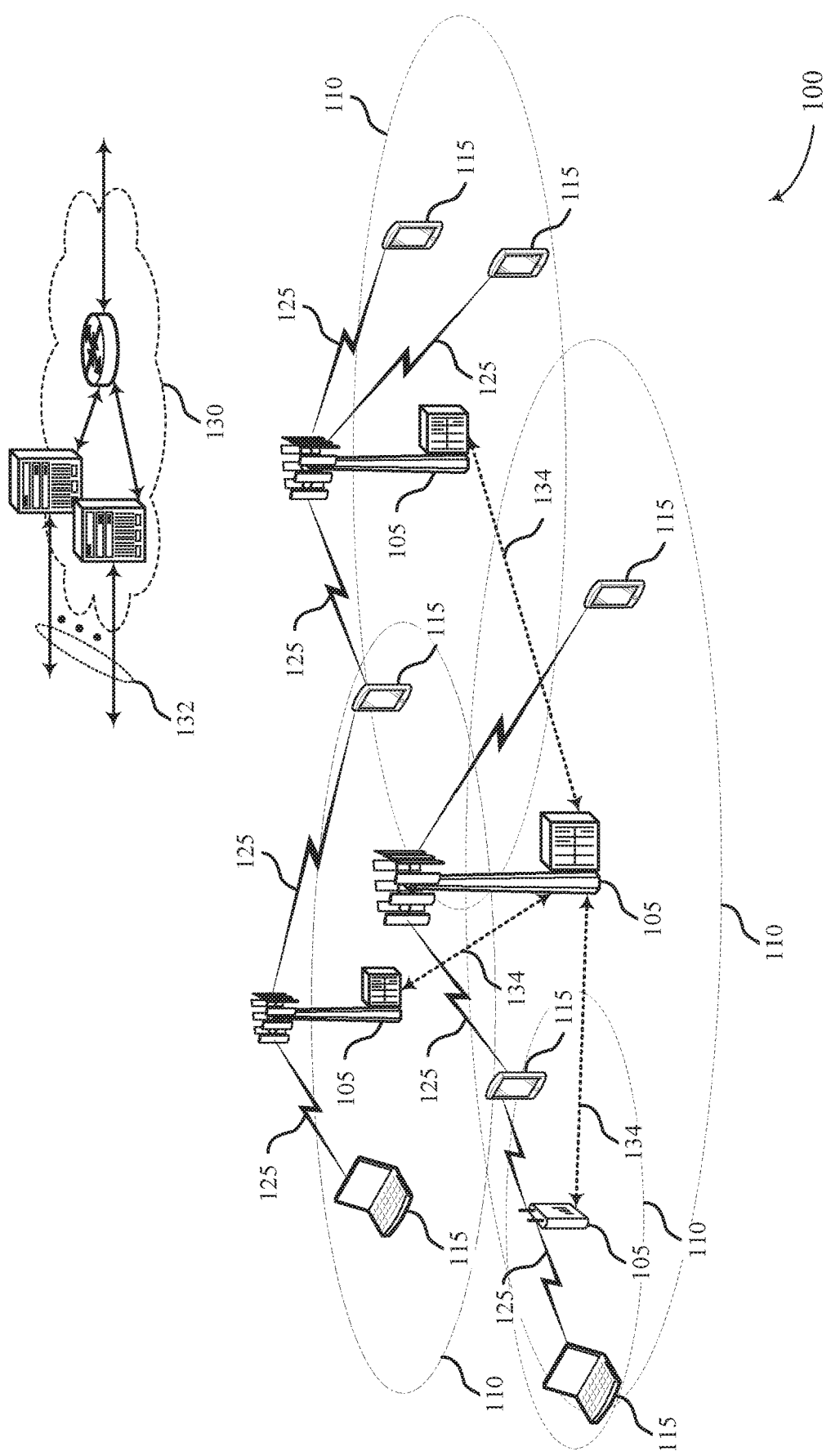
FIG. 1 illustrates an example of a system for wireless communication that supports polar codes for uplink control information in accordance with aspects of the present disclosure.

The described techniques relate to improved methods, systems, devices, or apparatuses that support polar codes for uplink control information. Generally, the described techniques provide for improved coding gain when transmitting control information having a large block size. In some examples, control information is separated into segmentations based on priority and unequal error protection (UEP) is provided to different control information segmentations. A high priority subset may permit early decoding, may be encoded using the most reliable sub-channels of a polar code, may be encoded using an adaptive coding rate, and may be self-decodable. A low priority subset may be encoded using less reliable sub-channels of a polar code, and decoding of the low priority subset may depend on the decoding of the high priority subset. Beneficially, the segmentation techniques described herein provide higher coding gain than conventional techniques that use repetition to transmit control information. The techniques described herein also beneficially support early termination of decoding and improved decoder power efficiency.

A polar code may be composed of multiple sub-channels having different levels of reliability. Sub-channel reliability may represent a capacity of the sub-channel to carry information as part of the encoded codeword. Sub-channels of a polar code having higher reliabilities are used to encode information bits and the remaining sub-channels are used to encode frozen bits. For N sub-channels, K information bits may be loaded into the K most reliable sub-channels and N-K frozen bits may be loaded into the N-K least reliable sub-channels, where K<N. A frozen bit is a bit having a known value to a decoder and is generally set as '0'. The value of a frozen bit, however, may be any value as long as the value of the frozen bit is known to the decoder.

An encoder may receive information bits for encoding, encode the information bits using a polar code to generate a codeword, and transmit the codeword via a wireless communication channel. A decoder may receive the codeword and use a decoding technique attempting to retrieve the information bits from the codeword. In some cases, Successive Cancellation List (SCL) decoding may be used for decoding the codeword. In SCL decoding, a decoder may determine candidate paths through a code tree and, to limit computational complexity, keep only a list size L number of paths through the code tree at each decoding level. A candidate path may also be referred to herein as a decoding path. In an example, during decoding, a candidate path may be extended at each sub-channel of a code tree through hard decision values of '0' or '1.' Extending L candidate paths by one additional bit results in 2L possible paths. In SCL decoding, a decoder may calculate a path metric for each candidate path and select L paths of the 2L possible paths having the best path metrics. A path metric may be a sum of costs for transitioning from bit value to bit value along a candidate path. Adding a bit having a particular value to a candidate path may be associated with a cost representing a probability of the bit value being correct.

In some cases, cyclic redundancy check (CRC) aided SCL (CA-SCL) decoding may be used to improve a detection rate at the expense of increasing a false alarm rate (FAR) (e.g., the FAR may increase as the list size L increases). In CA-SCL, the decoder may obtain a bit sequence corresponding to a candidate path, and extract information bits and CRC bits from the bit sequence. The decoder may apply the same CRC algorithm as applied by an encoder to the information bits to generate calculated CRC bits. The decoder may compare the calculated CRC bits with the extracted CRC bits looking for a match. If a match is found, the decoder determines that the codeword has been properly decoded and outputs the information bits from the bit sequence. If a match is not found, the decoder may check the bit sequence of a next candidate path. If all candidate paths fail CRC, the decoder may output a decoding error.

Polar codes may be used for channel coding of uplink control information (UCI) in new radio (NR) systems. In NR systems, a maximum coded block size is defined as 1024 bits for UCI, and a maximum number of UCI bits is 500 bits, Repetition has been proposed for UCI having a coded block size that is larger than the maximum coded block size (e.g., larger than 1024 bits).

The examples described herein provide improved performance as compared to using repetition for UCI having a large coded block size (e.g., exceeding the maximum coded block size). The examples described herein also provide unequal error protection (UEP) on different segmentations of UCI data. In some examples, UCI is separated into subsets based on priority. A high priority subset may permit early decoding, may be encoded using the most reliable sub-channels of a polar code, may be encoded using an adaptive coding rate, and may be self-decodable. A low priority subset may be encoded using less reliable sub-channels of a polar code, and decoding of the low priority subset may depend on the decoding of the high priority subset. Beneficially, the segmentation techniques described herein provide higher coding gain than conventional techniques that use repetition. In some examples, the gain of segmentation over repetition may be around 0.6 dB because of coding gain from a lower code rate. The techniques described herein also beneficially support early termination of decoding and improved decoder power efficiency.

Aspects of the disclosure are initially described in the context of a wireless communications system. The wireless communications system may generate segmentations to provide differing levels of error protection to subsets of control information. Aspects of the disclosure are further illustrated by and described with reference to apparatus diagrams, system diagrams, and flowcharts that relate to polar codes for uplink control information.

FIG. 1 illustrates an example of a wireless communications system 100 in accordance with various aspects of the present disclosure. The wireless communications system 100 includes base stations 105, UEs 115, and a core network 130. In some examples, the wireless communications system 100 may be a Long Term Evolution (LTE), LTE-Advanced (LTE-A) network, or a New Radio (NR) network. In some cases, wireless communications system 100 may support enhanced broadband communications, ultra-reliable (i.e., mission critical) communications, low latency communications, and communications with low-cost and low-complexity devices.

A transmitter, such as base stations 105 and UEs 115, may allocate control information, such as uplink control information (UCI), into subsets, and generate multiple segmentations that includes one or more of the subsets of control information. The transmitter may polar encode the segmentations to generate codewords and may transmit the codewords (e.g., via a wired or wireless communication channel). A receiver, such as base stations 105 and UEs 115, may receive a signal that includes the polar-encoded codewords, and perform multiple list decoding algorithms on the codewords corresponding to the segmentations to retrieve the subsets of control information from the received codewords. Beneficially, differing levels of error protection may be applied to the different subsets of control information and may support early termination of decoding. In some instances, the base station 105 may be the transmitter and the UE 115 may be the receiver. In other instances, the UE 115 may be the transmitter and the base station 105 may be the receiver. In further instances, a first base station 105 may be the transmitter and a second base station 105 may be the receiver, in additional instances, a first UE 115 may be the transmitter and a second UE 115 may be the receiver. Devices other than a base station and a receiver may also be one or both of the transmitter and receiver.

Base stations 105 may wirelessly communicate with UEs 115 via one or more base station antennas. Each base station 105 may provide communication coverage for a respective geographic coverage area 110. Communication links 125 shown in wireless communications system 100 may include uplink transmissions from a UE 115 to a base station 105, or downlink transmissions, from a base station 105 to a UE 115. Control information and data may be multiplexed on an uplink channel or downlink according to various techniques. Control information and data may be multiplexed on a downlink channel, for example, using time division multiplexing (TOM) techniques, frequency division multiplexing (FDM) techniques, or hybrid TDM-FDM techniques. In some examples, the control information transmitted during a transmission time interval (TTI) of a downlink channel may be distributed between different control regions in a cascaded manner (e.g., between a common control region and one or more UE-specific control regions).

UEs 115 may be dispersed throughout the wireless communications system 100, and each UE 115 may be stationary or mobile. A UE 115 may also be referred to as a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

A UE 115 may also be a cellular phone, a personal digital assistant (PDA), a wireless modem, a wireless communication device, a handheld device, a tablet computer, a laptop computer, a cordless phone, a personal electronic device, a handheld device, a personal computer, a wireless local loop (WLL) station, an Internet of Things (IoT) device, an Internet of Everything (IoE) device, a machine type communication (MTC) device, an appliance, an automobile, or the like.

In some cases, a UE 115 may also be able to communicate directly with other UEs (e.g., using a peer-to-peer (P2P) or device-to-device (D2D) protocol). One or more of a group of UEs 115 utilizing D2D communications may be within the coverage area 110 of a cell. Other UEs 115 in such a group may be outside the coverage area 110 of a cell, or otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out independent of a base station 105.

Some UEs 115, such as MTC or IoT devices, may be low cost or low complexity devices, and may provide for automated communication between machines, i.e., Machine-to-Machine (M2M) communication. M2M or MTC may refer to data communication technologies that allow devices to communicate with one another or a base station without human intervention. For example, M2M or MTC may refer to communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

In some cases, an MTC device may operate using half-duplex (one-way) communications at a reduced peak rate. MTC devices may also be configured to enter a power saving "deep sleep" mode when not engaging in active communications. In some cases, MTC or IoT devices may be designed to support mission critical functions and wireless communications system may be configured to provide ultra-reliable communications for these functions.

Base stations 105 may communicate with the core network 130 and with one another. For example, base stations 105 may interface with the core network 130 through backhaul links 132 (e.g., S1, etc.). Base stations 105 may communicate with one another over backhaul links 134 (e.g., X2, etc.) either directly or indirectly (e.g., through core network 130). Base stations 105 may perform radio configuration and scheduling for communication with UEs 115, or may operate under the control of a base station controller (not shown). In some examples, base stations 105 may be macro cells, small cells, hot spots, or the like. Base stations 105 may also be referred to as evolved NodeBs (eNBs) 105.

A base station 105 may be connected by an Si interface to the core network 130. The core network may be an evolved packet core (EPC), which may include at least one mobility management entity (MME), at least one serving gateway (S-GW), and at least one Packet Data Network (PDN) gateway (P-GW). The MME may be the control node that processes the signaling between the UE 115 and the EPC. All user Internet Protocol (IP) packets may be transferred through the S-GW, which itself may be connected to the P-GW. The P-GW may provide IP address allocation as well as other functions. The P-GW may be connected to the network operators IP services. The operators IP services may include the Internet, the Intranet, an IP Multimedia Subsystem (IMS), and a Packet-Switched (PS) Streaming Service.

The core network 130 may provide user authentication, access authorization, tracking, Internet Protocol (IP) connectivity, and other access, routing, or mobility functions. At least some of the network devices, such as base station 105 may include subcomponents such as an access network entity, which may be an example of an access node controller (ANC). Each access network entity may communicate with a number of UEs 115 through a number of other access network transmission entities, each of which may be an example of a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate in an ultra-high frequency (UHF) frequency region using frequency bands from 700 MHz to 2600 MHz (2.6 GHz), although some networks (e.g., a wireless local area network (WLAN)) may use frequencies as high as 4 GHz. This region may also be known as the decimeter band, since the wavelengths range from approximately one decimeter to one meter in length. UHF waves may propagate mainly by line of sight, and may be blocked by buildings and environmental features. However, the waves may penetrate walls sufficiently to provide service to UEs 115 located indoors. Transmission of UHF waves is characterized by smaller antennas and shorter range (e.g., less than 100 km) compared to transmission using the smaller frequencies (and longer waves) of the high frequency (HF) or very high frequency (VHF) portion of the spectrum. In some cases, wireless communications system 100 may also utilize extremely high frequency (EHF) portions of the spectrum (e.g., from 30 GHz to 300 GHz). This region may also be known as the millimeter band, since the wavelengths range from approximately one millimeter to one centimeter in length. Thus, EHF antennas may be even smaller and more closely spaced than UHF antennas. In some cases, this may facilitate use of antenna arrays within a UE 115 (e.g., for directional beamforming). However, EHF transmissions may be subject to even greater atmospheric attenuation and shorter range than UHF transmissions.

Thus, wireless communications system 100 may support millimeter wave (mmW) communications between UEs 115 and base stations 105. Devices operating in mmW or EHF bands may have multiple antennas to allow beamforming. That is, a base station 105 may use multiple antennas or antenna arrays to conduct beamforming operations for directional communications with a UE 115, Beamforming (which may also be referred to as spatial filtering or directional transmission) is a signal processing technique that may be used at a transmitter (e.g., a base station 105) to shape and/or steer an overall antenna beam in the direction of a target receiver (e.g., a UE 115). This may be achieved by combining elements in an antenna array in such a way that transmitted signals at particular angles experience constructive interference while others experience destructive interference.

Multiple-input multiple-output (MIMO) wireless systems use a transmission scheme between a transmitter (e.g., a base station 105) and a receiver (e.g., a UE 115), where both transmitter and receiver are equipped with multiple antennas. Some portions of wireless communications system 100 may use beamforming. For example, base station 105 may have an antenna array with a number of rows and columns of antenna ports that the base station 105 may use for beamforming in its communication with UE 115. Signals may be transmitted multiple times in different directions (e.g., each transmission may be beamformed differently). A mmW receiver (e.g., a UE 115) may try multiple beams (e.g., antenna subarrays) while receiving the synchronization signals.

In some cases, the antennas of a base station 105 or UE 115 may be located within one or more antenna arrays, which may support beamforming or MIMO operation. One or more base station antennas or antenna arrays may be collocated at an antenna assembly, such as an antenna tower. In some cases, antennas or antenna arrays associated with a base station 105 may be located in diverse geographic locations. A base station 105 may multiple use antennas or antenna arrays to conduct beamforming operations for directional communications with a UE 115.

In some cases, wireless communications system 100 may be a packet-based network that operate according to a layered protocol stack, in the user plane, communications at the bearer or Packet Data Convergence Protocol (PDCP) layer may be IP-based. A Radio Link Control (RLC) layer may in some cases perform packet segmentation and reassembly to communicate over logical channels, A Medium Access Control (MAC) layer may perform priority handling and multiplexing of logical channels into transport channels. The MAC layer may also use Hybrid ARQ (HARQ) to provide retransmission at the MAC layer to improve link efficiency. In the control plane, the Radio Resource Control (RRC) protocol layer may provide establishment, configuration, and maintenance of an RRC connection between a UE 115 and a base station 105, network device, or core network 130 supporting radio bearers for user plane data. At the Physical (PHY) layer, transport channels may be mapped to physical channels.

Time intervals in LTE or NR may be expressed in multiples of a basic time unit (which may be a sampling period of $T_s=1/30,720,000$ seconds). Time resources may be organized according to radio frames of length of 10 ms ($T_f=307200\ T_s$), which may be identified by a system frame number (SFN) ranging from 0 to 1023, Each frame may include ten 1 ms subframes numbered from 0 to 9. A subframe may be further divided into two 0.5 ms slots, each of which contains 6 or 7 modulation symbol periods (depending on the length of the cyclic prefix prepended to each symbol). Excluding the cyclic prefix, each symbol contains 2048 sample periods. In some cases the subframe may be the smallest scheduling unit, also known as a TTI. In other cases, a TTI may be shorter than a subframe or may be dynamically selected (e.g., in short TTI bursts or in selected component carriers using short TTIs).

A resource element may consist of one symbol period and one subcarrier (e.g., a 15 KHz frequency range). A resource block may contain 12 consecutive subcarriers in the frequency domain and, for a normal cyclic prefix in each OFDM symbol, 7 consecutive OFDM symbols in the time domain (1 slot), or 84 resource elements. The number of bits carried by each resource element may depend on the modulation scheme (the configuration of symbols that may be selected during each symbol period). Thus, the more resource blocks that a UE receives and the higher the modulation scheme, the higher the data rate may be, Wireless communications system 100 may support operation on multiple cells or carriers, a feature which may be referred to as carrier aggregation (CA) or multi-carrier operation, A carrier may also be referred to as a component carrier (CC), a layer, a channel, etc. The terms "carrier," "component carrier," "cell," and "channel" may be used interchangeably herein. A UE 115 may be configured with multiple downlink CCs and one or more uplink CCs for carrier aggregation. Carrier aggregation may be used with both FDD and TDD component carriers.

In some cases, wireless communications system 100 may utilize enhanced component carriers (eCCs). An eCC may be characterized by one or more features including: wider bandwidth, shorter symbol duration, shorter TTIs, and modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (where more than one operator is allowed to use the spectrum). An eCC characterized by wide bandwidth may include one or more segments that may be utilized by UEs 115 that are not capable of monitoring the whole bandwidth or prefer to use a limited bandwidth (e.g., to conserve power).

In some cases, an eCC may utilize a different symbol duration than other CCs, which may include use of a reduced symbol duration as compared with symbol durations of the other CCs. A shorter symbol duration is associated with increased subcarrier spacing, A device, such as a UE 115 or base station 105, utilizing eCCs may transmit wideband signals (e.g., 20, 40, 60, 80 MHz, etc.) at reduced symbol durations (e.g., 16.67 microseconds). A TTI in eCC may consist of one or multiple symbols. In some cases, the TTI duration (that is, the number of symbols in a TTI) may be variable.

A shared radio frequency spectrum band may be utilized in an NR shared spectrum system. For example, an NR shared spectrum may utilize any combination of licensed, shared, and unlicensed spectrums, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across frequency) and horizontal (e.g., across time) sharing of resources.

In some cases, wireless system 100 may utilize both licensed and unlicensed radio frequency spectrum bands. For example, wireless system 100 may employ LTE License Assisted Access (LTE-LAA) or LTE Unlicensed (LTE U) radio access technology or NR technology in an unlicensed band such as the 5 Ghz Industrial, Scientific, and Medical (ISM) band. When operating in unlicensed radio frequency spectrum bands, wireless devices such as base stations 105 and UEs 115 may employ listen-before-talk (LBT) procedures to ensure the channel is clear before transmitting data. In some cases, operations in unlicensed bands may be based on a CA configuration in conjunction with CCs operating in a licensed band. Operations in unlicensed spectrum may include downlink transmissions, uplink transmissions, or both. Duplexing in unlicensed spectrum may be based on frequency division duplexing (FDD), time division duplexing (TDD) or a combination of both.

The wireless communications system 100 may allocate subsets of control information into different segmentations and apply differing levels of error protection to the segmentations, A polar encoder may separately encode the different segmentations to generate codewords for transmission. The codewords may be separately decoded and decoding of a first codeword may be used for making an early termination determination when decoding a second codeword.

Figure 2:
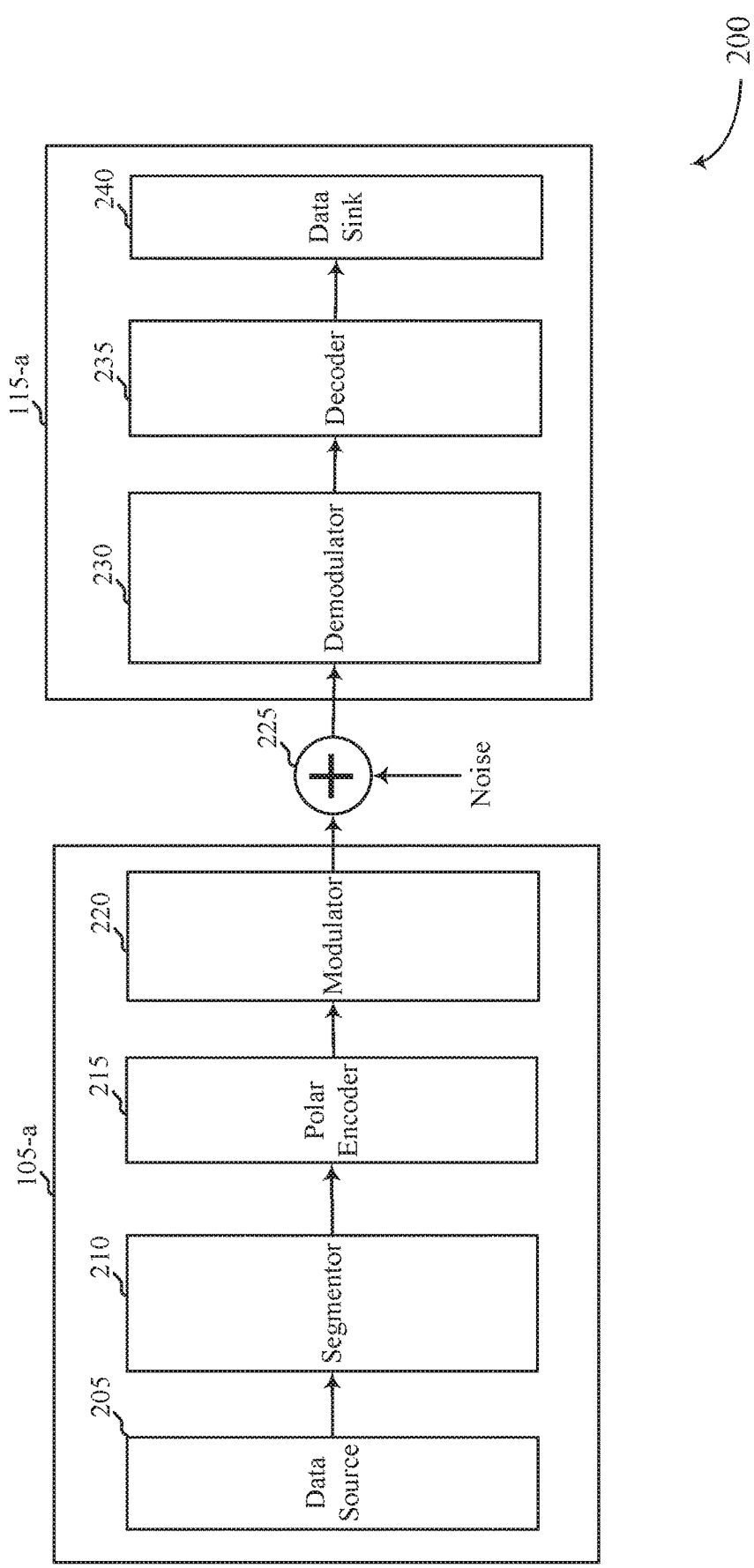
FIG. 2 illustrates an example of a wireless communications system that supports polar codes for uplink control information in accordance with aspects of the present disclosure.

FIG. 2 illustrates an example of a wireless communications system 200 that supports polar codes for uplink control information in accordance with various aspects of the present disclosure. In some examples, wireless communications system 200 may implement aspects of wireless communications system 100. Wireless communications system 200 may include a base station 105-*a* and a UE 115-*a*. Base station 105-*a* is an example of base station 105 of FIG. 1, and UE 115-*a* is an example of UE 115 of FIG. 1.

Base station 105-*a* may generate control information segmentations and polar encode the control information segmentations into codewords that are transmitted to UE 115-*a*, to a different base station, or to another device, via a wireless communication channel 225. In other examples, UE 115-*a* may generate control information segmentations and polar encode the control information segmentations for transmission to base station 105-*a*, another UE, or another device, using these same techniques. Moreover, devices other than base station 105-*a* and UE 115-*a* may use the techniques described herein.

In the depicted example, base station 105-*a* may include a data source 205, a segmentor 210, a polar encoder 215, and a modulator 220. The data source 205 may provide control information to be encoded and transmitted to the UE 115-*a*. The control information may be a sequence of bits and may include one or more of acknowledgement (ACK) data, negative acknowledgement KNACK) data, rank index (RI) data, precode matrix index (PMI) data, channel quality indicator (CQI) data, or the like, or any combination thereof. The data source 205 may be coupled to a network, a storage device, or the like. The data source 205 may output the control information to the segmentor 210.

The segmentor 210 may generate control information segmentations based on the control information. A segmentation may include one or more subsets of the control information and reflect a particular bit arrangement of the subset(s) of the control information provided to a polar encoder. For example, the first segmentation may include ACK/NACK data, RI data, PMI data, and the second segmentation may include CQI data. The segmentations may provide differing levels of error protection to the one or more subsets of the control information. The bit order of the segmentations may reflect into which sub-channel of a polar code a particular bit is loaded for polar encoding. Each sub-channel of a polar code may have a reliability relative to other sub-channels of the polar code, with some sub-channels being more reliable and others being less reliable. Additional aspects of the control information segmentations are described below with reference to FIGS. 3-14. The segmentor 210 may output multiple control information segmentations to the polar encoder 215 for encoding using a polar code.

The polar encoder 215 may polar encode a first control information segmentation to generate a first polar-encoded codeword and may polar encode a second control information segmentation to generate a second polar-encoded codeword. The polar encoder 215 may output the first and second polar-encoded codewords to the modulator 220. The modulator 220 may modulate the first and second polar-encoded codewords for transmission via wireless communication channel 225 which may distort the signal carrying the polar-encoded codeword with noise.

The UE 115-*a* may receive a signal that includes the polar-encoded codewords. In an example, the UE 115-*a* may include a demodulator 230, a decoder 235, and a data sink 240. The demodulator 230 may receive at least one signal including the first and second polar-encoded codewords and input the demodulated at least one signal into decoder 235 for decoding of the polar-encoded codewords. The demodulated signal(s) may be, for example, a sequence of logarithmic-likelihood ratio (LLR) values representing a probability value of a received bit being a '0' or a '1', The decoder 235 may perform a list decoding algorithm on the LLR values (e.g., CA-SCL decoding, SCL decoding,) and may provide an output. If successfully able to decode the first and second polar-encoded codewords, the decoder 235 may output bit sequence(s) of the subsets of the control information (e.g., the UCI) to a data sink 240 for use, storage, communication to another device (e.g., transmission via a wired or wireless communication channel), communication via a network, or the like. Otherwise, the decoder 235 may indicate that decoding was unsuccessful. As noted above, while the example of FIG. 2 describes the base station 105-*a* performing the encoding and UE 115-*a* performing the decoding, the roles may be reversed. Moreover, devices other than the base station 105-*a* and the UE 115-*a* may perform the encoding and decoding.

Figure 3:
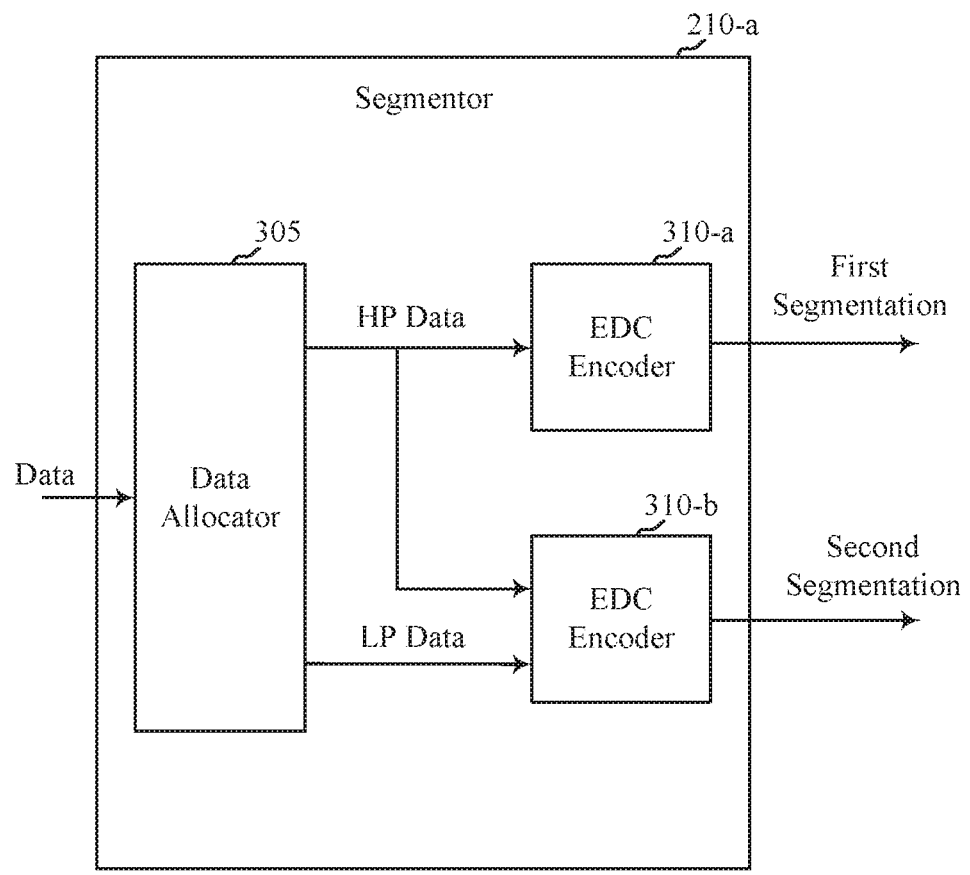
FIG. 3 illustrates an example of a segmentor that supports polar codes for uplink control information in accordance with aspects of the present disclosure.

FIG. 3 illustrates an example diagram 300 of a segmentor 210-*a* that supports polar codes for uplink control information in accordance with various aspects of the present disclosure. In some examples, segmentor 210-*a* may implement aspects of segmentor 210. The segmentor 210-*a* may receive control information and may generate segmentations from the control information that are output to the polar encoder 215. In an example, the segmentor 210-*a* may include a data allocator 305, a first error detecting code (EDC) encoder 310-*a*, and a second EDC encoder 310-*b*. The data allocator 305 may allocate control information into at least two subsets. In an example, the control information may be allocated based on priority, such as into a high priority (HP) subset and low priority (HP) subset. Two or more subsets may be defined. A priority level may reflect the amount of error protection provided to a subset, with a higher priority subset receiving higher error protection as compared to a lower priority subset. In an example, the high priority subset may include ACK/NACK data, RI data, PMI data, or the like, The low priority subset may include COI data. The data allocator 305 may output the HP data to the first EDC encoder 310-*a* and the second EDC encoder 310-*b*. The data allocator 305 may output the LP data to the second EDC encoder 310-*b*. The HP data may be a bit sequence, and the LP data may be a bit sequence. In some examples, the first and second EDC encoders may be a single device, a processor, or the like.

The first EDC encoder 310-*a* may separately encode the HP data with a flexible code rate to achieve a specified performance and to allow early decoding of the HP data (relative to the LP data) to improve decoder performance. In an example, the first EDC encoder 310-*a* may apply an error detecting algorithm to the HP data to generate a first EDC. The first EDC may be a bit sequence to enable the UE 115-*a* to detect an error in transmission of the HP data due to, for example, corruption caused by noise in a wireless communication channel 225. In an example, the EDC algorithm may be a cyclic redundancy check (CRC) algorithm and the first EDC may be a CRC. The first EDC encoder 310-*a* may output a first segmentation including the first EDC to the polar encoder 215 for encoding using a polar code.

The second EDC encoder 310-*b* may jointly encode the HP data and the LP data to generate a single EDC that applies to both of the HP data and the LP data. The second EDC may be a bit sequence to enable the UE 115-*a* to detect an error in transmission of the HP data, the LP data, or both, due to, for example, corruption caused by noise in a wireless communication channel 225. Joint encoding may refer to the ability to detect an error in the HP data, the LP data, or both. In an example, the second EDC encoder 310-*b* may apply an error detecting algorithm to the HP data and to the LP data to generate a second EDC. The second EDC encoder 310-*b* may output a second segmentation including the second EDC to the polar encoder 215 for encoding using a polar code.

Figure 4:
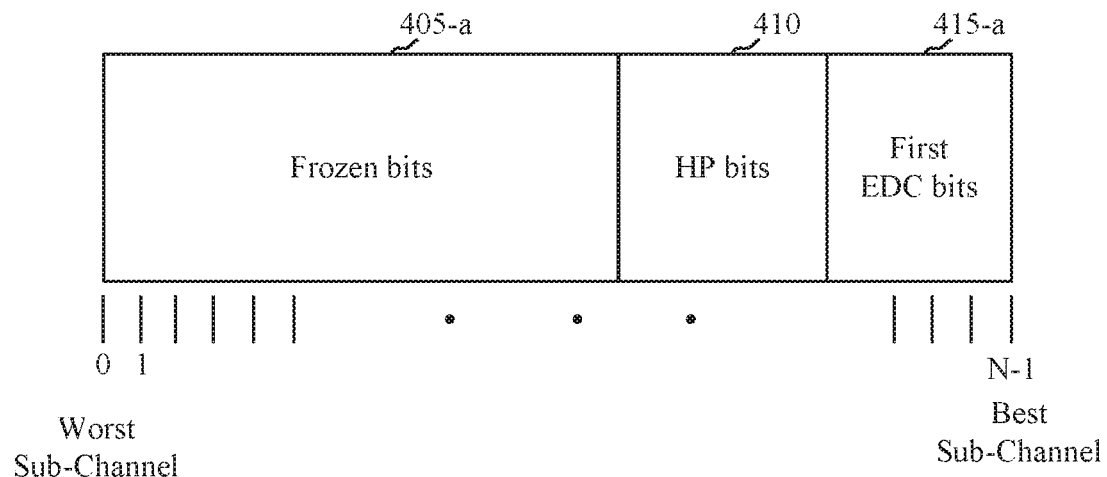
FIG. 4 illustrates an example of control information segmentations that support polar codes for uplink control information in accordance with aspects of the present disclosure.
Figure 4:
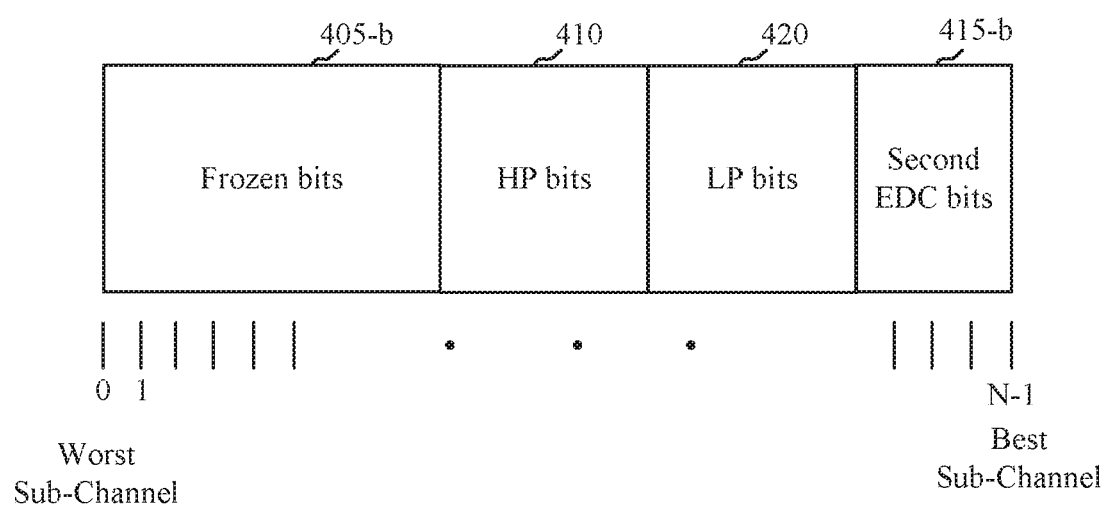

FIG. 4 illustrates an example diagram of control information segmentations 400-*a*, 400-*b* that support polar codes for uplink control information in accordance with various aspects of the present disclosure. First segmentation 400-*a* may include frozen bits 405-*a*, HP bits 410, and first EDC bits 415-*a*. The HP bits 410 may be the bits of the HP data output by the data allocator 305. The first EDC bits 415-*a* may be the bits of the first EDC generated by the EDC encoder 310-*a*. The frozen bits 405-*a* may be bits set to a defined value(s) that are known by each of the transmitter and receiver (e.g., each of base station 105-*a* and UE 115-*a*), and the number of frozen bits 405-*a* may be known by each of the transmitter and receiver, Each of the transmitter and receiver may also know which sub-channels within the polar code are to be loaded with the frozen bits 405-*a*. The first EDC encoder 310-*a* may add the frozen bits 405-*a* to the HP bits 410 and the first EDC bits 415-*a* to generate the first segmentation 400-*a*, or the polar encoder 215 may add the frozen bits 405-*a* to the HP bits 410 and the first EDC bits 415-*a* to generate the first segmentation 400-*a*.

The first segmentation 400-*a* may be loaded into sub-channels of a polar code based on the reliability of each sub-channel relative to the other sub-channels. In the depicted example, first segmentation 400-*a* is a bit sequence of length N where N is a positive integer. In an example, N=1024. Dashes underneath the first segmentation 400-*a* correspond to sub-channels in which the respective bits are to be loaded, with the least reliable sub-channel being on the left and the most reliable sub-channel being on the right. From left to right, each sub-channel may be at least as reliable or more reliable than a preceding sub-channel. In an example, the first segmentation 400-*a* may include p frozen bits 405-*a*, q HP bits 410, and r first EDC bits, where each of v, q, and r is an integer less than N. In the depicted example, the frozen bits 405-*a* are loaded into the least reliable sub-channels, the HP bits 410 are loaded into the next most reliable sub-channels, and the first EDC bits 415-*a* are loaded into the most reliable sub-channels of the polar code.

Second segmentation 400-*b* may include frozen bits 405-*b*, HP bits 410, LP bits 420, and second EDC bits 415-*b*. The HP bits 410 may be the bits of the HP data output by the data allocator 305, and may be the same as in the first segmentation 400-*a*. The LP bits 420 may be the bits of the LP data output by the data allocator 305. The second EDC bits 415-*b* may be the bits of the second EDC generated by the second EDC encoder 310-*b*. The frozen bits 405-*b* may be bits set to a defined value that are known by each of the transmitter and receiver (e.g., each of base station 105-*a* and UE 115-*a*), and the number of and sub-channel location of the frozen bits 405-*a* within the polar code may be known by each of the transmitter and receiver. Similar to the first segmentation 400-*a*, bits of the second segmentation 400-*b* may be loaded into sub-channels of a polar code based on the reliability of each sub-channel relative to the other sub-channels. In an example, the second segmentation 400-*b* may include s frozen bits 405-*b*, q HP bits 410, t LP bits 420, and u first EDC bits 415-*b*, where each of s, q, t, and u is less than A. In an example, N=1024 bits, and the sum of q and t is less than or equal to 500 bits. In the depicted example, the frozen bits 405-*b* are loaded into the least reliable sub-channels, the HP bits 410 are loaded into the next least reliable sub-channels, the LP bits 420 are loaded into the next most reliable sub-channels, and the second EDC bits 415-*b* are loaded into the most reliable sub-channels of the polar code.

In some examples, the bit-length of the first and second EDCs 415-*a*, 415-*b* may differ and each of the EDCs 415 may be used for decoding, detection, or both. In an example, the first EDC 415-*a* may he used for decoding the HP bits 410 while the second EDC 415-*b* may be used jointly for both decoding and detection of the HP bits 410 and the LP bits 420. In an example, the bit length of the first EDC 415-*a* may be 8 bits and the bit length of the second EDC 415-*b* may be 11 bits. The longer length of the second EDC 415-*b* may be used for both decoding and detection by the DE 115-*a*. The segmentor 210-*a* may provide the first and second segmentations 400-*a*, 400-*b*, to the polar encoder 215 (see FIG. 2). The polar encoder 215 may respectively load the N bits of the first segmentation 400-*a* into N sub-channels of a polar code for polar encoding and output a first codeword of length N. The polar encoder 215 may similarly load N bits of the second segmentation 400-*b* into N sub-channels of a polar code for polar encoding and output a second codeword of length N. The polar encoder 215 may output the first and second codewords to the modulator 220 for transmission to the UE 115-*a*.

Figure 5:
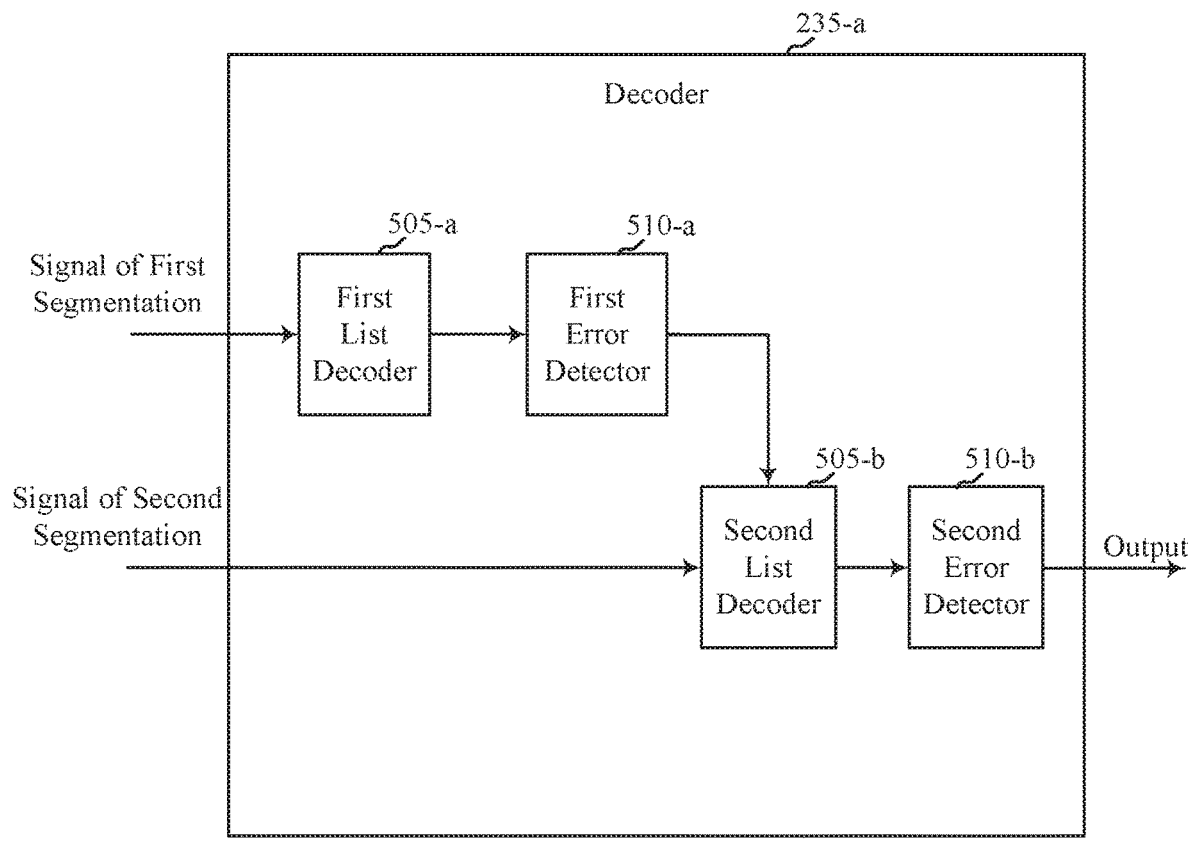
FIG. 5 illustrates an example of a decoder that supports polar codes for uplink control information in accordance with aspects of the present disclosure.

The UE 115-*a* may receive at least one signal that includes the first and second codewords and a decoder of the UE 115-*a* may attempt to retrieve the control information from the received codewords. FIG. 5 illustrates an example diagram 500 of a decoder 235-*a* that supports polar codes for uplink control information in accordance with various aspects of the present disclosure. In some examples, decoder 235-*a* may implement aspects of decoder 235. The decoder 235-*a* may implement a two-stage decoding process. In a first stage, the decoder 235-*a* attempts to decode a signal including a codeword generated from the first segmentation 400-*a*. If unable to successfully decode the first segmentation 400-*a*, the decoder 235-*a* terminates the decoding process and does not attempt to decode the second segmentation 400-*b* in a second stage. If successfully able to decode the first segmentation 400-*a*, the decoder 235-*a* may set the HP bits of the first segmentation 400-*a* as frozen bits and then attempt to decode a signal including a codeword generated from the second segmentation 400-*b* in a second decoding stage.

In an example, the decoder 235-*a* may include a first list decoder 505-*a*, a first error detector 510-*a*, a second list decoder 505-*b*, and a second error detector 510-*b*. The first list decoder 505-*a* may perform a successive cancellation list (SCL) decoding algorithm that searches for candidate paths through a code tree for decoding a received polar-encoded codeword. To do so, the first list decoder 505-*a* may determine a list size L of candidate paths through the code tree and select one or more bit sequences of length N corresponding to the L candidate paths that are output to the first error detector 510-*a* for error detection. The first list decoder 505-*a* may obtain a first bit sequence and an EDC from the selected candidate path, and the first error detector 510-*a* may determine whether the first bit sequence passes error detection based at least in part on the EDC.

Figure 6:
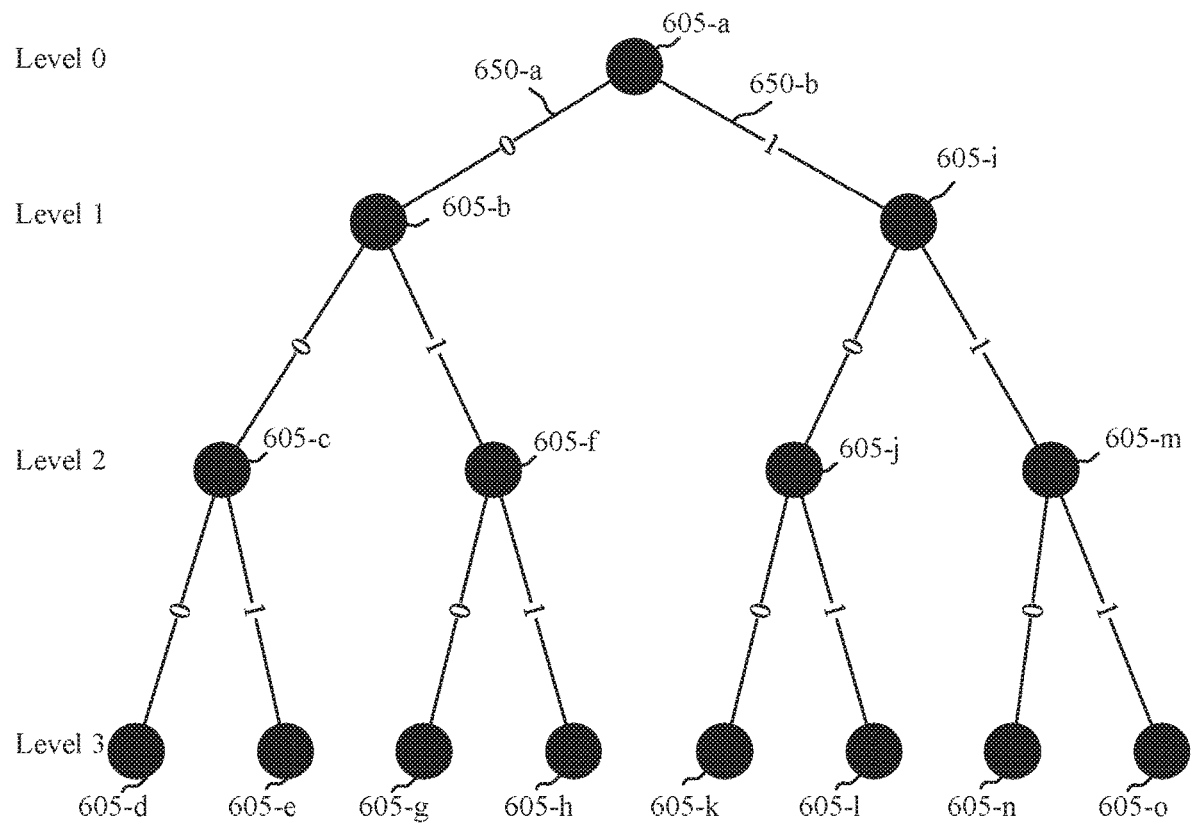
FIG. 6 illustrates an example of a code tree that supports polar codes for uplink control information in accordance with aspects of the present disclosure.

FIG. 6 illustrates an example of a code tree 600 that supports polar codes for uplink control information in accordance with various aspects of the present disclosure. Code tree 600 is a graphical representation of how first list decoder 505-*a* performs the list decoding process. The code tree 600 includes multiple nodes 605 and a line between pairs of nodes is referred to herein as a branch 650 (e.g., branch 650-*a* connects node 605-*a* to node 605-*b*, and branch 650-*b* connects node 605-*a* to node 605-*i*). Each branch 650 is associated with a possible value for a bit, which may be a '1' or a '0'. Branch 650-*a* is associated with a bit being a '0', and branch 650-*b* is associated with the bit being a '1'. Each branch 650 is also associated with a value for a metric. The metric value may represent a cost for proceeding from one node to the next. The metric may be, for example, a distance metric (e.g., LLR converted to a distance) or a probability metric (e.g., LLR, etc.). The metric may represent a likelihood of moving from one node to the next based on whether the next bit in the sequence is a 1 or a 0. In some instances, the metric may represent a distance value between nodes.

A first list decoder 505-*a* may process demapped symbols output by the demodulator 230 and determine the probability (e.g., LLR value) of whether bits corresponding to the demapped symbols are '0s' or '1s'. The determination of the probability of whether a particular bit value is a '0' or a '1' may also be a function of prior decoding decisions. This process is reflected in the code tree 600.

101011 The first list decoder 505-*a* may initially begin at node 605-*a* and process the LLR values to determine along which branch to proceed. At node 605-*a*, the first list decoder 505-*a* may determine the likelihood of whether a LLR value is a '0' or a '1', and hence may proceed to either node 605-*b* or node 605-*i*. Node 605-*b* may be associated with the first bit being a '0', and node 605-*i* may be associated with the first bit being a '1'. Each branch 650-*a*, 650-*b* is associated with a value for a metric and the first list decoder 505-*a* accumulates the metric values as it traverses branches 650 in the code tree 600 to generate a path metric. Accumulation to form the path metric may be determined at the node level and may involve, for example, adding the metric value of each branch along a path. A path may refer to a particular route between nodes 605 through the code tree 600. The first list decoder 505-*a* selects which of the paths is the best using path metrics.

In some instances, the first list decoder 505-*a* may maintain a respective path metric for every possible path through code tree 600. Retaining path metrics for all possible paths may be computationally expensive and, in other instances, the first list decoder 505-*a* may use the path metrics to prune selected paths. For example, the first list decoder 505-*a* may have a list size L that limits the number of paths that are maintained at each level of the code tree. To do so, the first list decoder 505-*a* may maintain up to L candidate paths at each level, and discard the remaining candidate paths. In an example, FIG. 6 depicts level 0 to level 3. If L=4, the first list decoder 505-*a* may maintain up to 4 paths at each level, and may discard any additional paths. At level 1, there are two possible paths (e.g., node 605-*a* to node 605-*b*, and node 605-*a* to node 605-*i*), and hence the first list decoder 505-*a* may maintain both paths. At level 2, there are four possible paths (e.g., node 605-*a* to node 605-*b* to node 605-*c*, node 605-*a* to node 605-*b* to node 605-*f*, node 605-*a* to node 605-*i* to node 605-*j*, and node 605-*a* to node 605-*i* to node 605-*m*), and hence the first list decoder 505-*a* may maintain all 4 paths. At level three, there are 8 possible paths, and hence the first list decoder 505-*a* may maintain 4 of the 8 paths. At each subsequent level the number of possible paths doubles (e.g., level four has 16 possible paths, level five has 32 possible paths, and so forth), and the first list decoder 505-*a* may maintain 4 of the paths.

Figure 7:
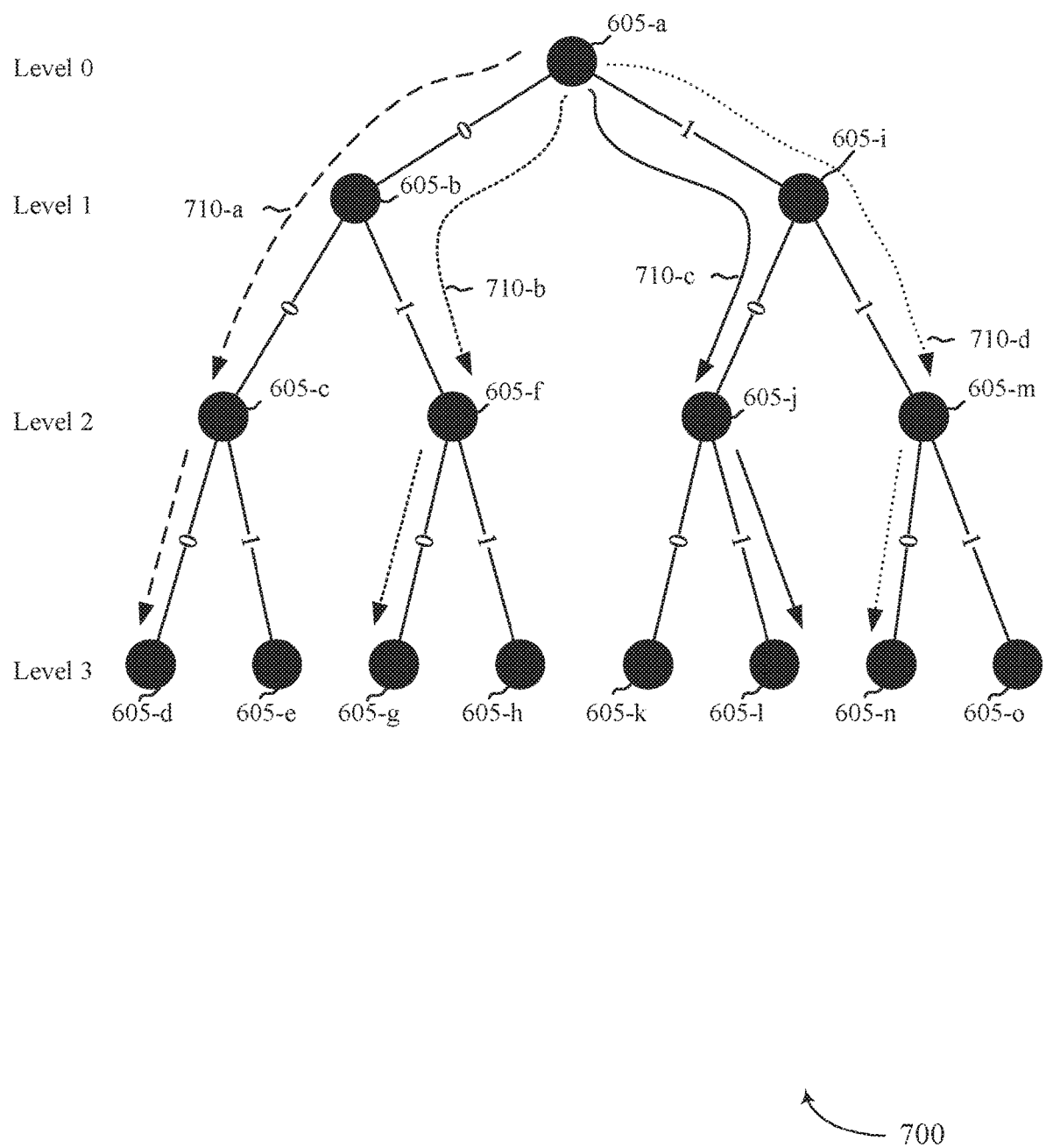
FIG. 7 illustrates an example of a code tree that supports polar codes for uplink control information in accordance with aspects of the present disclosure.

To decode a next bit, the first list decoder 505-*a* may extend L candidate paths from one level to the next to identify 2L possible candidate paths. FIG. 7 illustrates an example of a code tree 700 that supports polar codes for uplink control information in accordance with various aspects of the present disclosure. As shown, the first list decoder 505-*a* is extending the paths 710 from the nodes at level 2 to the nodes at level 3. As depicted, path 710-*a* includes node 605-*a*, 605-*b*, and 605-*c*, and may be extended to either node 605-*d* or 605-*e*. Path 710-*b* includes node 605-*a*, 605-*b*, and 605-*f*, and may be extended to either node 605-*g* or 605-*h*. Path 710-*c* includes node 605-*a*, 605-*i*, and 605-*j*, and may be extended to either node 605-*k* or 605-*l*. Path 710-*d* includes node 605-*a*, 605-*i*, and 605-*m*, and may be extended to either node 605-*n* or 605-*o*.

The first list decoder 505-*a* may select a first subset of the extended set of candidate paths according to a first path selection criterion. In an example, the path selection criterion may be a path metric, and the first list decoder 505-*a* may retain L paths of the 2L possible paths having the best path metrics. The first list decoder 505-*a* may use the path metrics, which are accumulated metric values, for determining which paths to keep (e.g., minimum accumulated distance, highest accumulated probability, etc.). For example, with reference to FIG. 7, the first list decoder 505-*a* may add a metric value for the branch proceeding from node 605-*c* to node 605-*d* to an accumulated value for path 710-*a* to determine a path metric to extend path 710-*a* to node 605-*d*. The first list decoder 505-*a* may make a similar determination for extending all of the paths 710 to any of the nodes in level 3. In this example, the first list decoder 505-*a* may have 8 possible paths to the nodes in level 3 and determine a path metric for each of the 8 possible paths. Because L=4, the first list decoder 505-*a* may select 4 of the 8 paths that have the best path metric (e.g., minimum accumulated distance, highest accumulated probability, etc.), For example, the first list decoder 505-*a* determine, based on the path metrics, that the 4 best of the extended candidate paths are extending candidate path 710-*a* to node 605-*d*, extending candidate path 710-*b* to node 605-*g*, extending candidate path 710-*c* to node 605-*l*, and extending candidate path 710-*d* to node 605-*n*.

During decoding to the first polar-encoded codeword, the first list decoder 505-*a* may determine a list size L of candidate paths where each of the L candidate paths through the code tree 700 corresponds to a bit sequence of length N. The first list decoder 505-*a* may extract a N bit sequence bits from each of the candidate paths (e.g., p frozen bits 405-*a*, q HP bits 410-*a*, and r first EDC bits 415-*a*). The first list decoder 505 may be aware of the locations of the frozen bits within each of the candidate paths and may not include the values of the frozen bits in the extracted bit sequences. The first list decoder 505-*a* may output each bit sequence to the first error detector 510-*a* for error detection. The first list decoder 505-*a* also may output an order in which to check the bit sequences based on a path metric of corresponding candidate paths, such that a bit sequence corresponding to the best path metric is checked first, followed by a bit sequence corresponding to the next best path metric is checked second, and so forth until a bit sequence corresponding to the worst path metric is checked last.

The first error detector 510-a may perform an error detecting algorithm for determining whether any of the bit sequences passes EDC (e.g., a CRC algorithm). As described above, the first polar-encoded codeword may be generated by polar encoding first segmentation 400-a that includes HP bits 410 and EDC bits 415-a. If the bit sequence obtained from a selected candidate path is the same as the bit sequence of the first segmentation 400-a, the first error detector 510-a should be able to parse the bit sequence to extract the HP bits 410 and the first EDC bits 415-a. The first error detector 510-a may then generate a calculated EDC using the extracted HP bits 410 by applying the same algorithm to the HP bits 410 as applied by the EDC encoder 310-a. If the calculated EDC is the same as the extracted EDC, the first error detector 510-a determines that it was able to successfully decode the first polar-encoded codeword and outputs the bit sequence of the HP bits 410 with or without the first EDC bits 415-a.

If the calculated and extracted EDCs are not the same, the first error detector 510-a indicates a decoding failure for that bit sequence. The first error detector 510-a checks a bit sequence associated with a next highest path metric to see if that bit sequence passes error detection. The first error detector 510-a thus proceeds from bit sequence to bit sequence until one of the bit sequences passes or all fail, if all paths have been checked, the first error detector 510-a indicates a decoding failure and does not attempt to decode a signal including the second polar-encoded codeword generated from the second segmentation 400-b. This technique beneficially improves power efficiency of the UE 115-a by supporting early termination of decoding if the UE 115-a is unable to successfully decode the signal of the first segmentation. Thus, the UE 115-a may skip attempting to decode the signal of the second segmentation if unable to successfully decode the first segmentation.

If decoding of the first segmentation 400-a is successful, the first error detector 510-a may output the HP bits 410 to the second list decoder 505-b. The second list decoder 505-b may set the HP bits 410 as frozen bits. The second list decoder 505-b may also process a signal including the second polar-encoded codeword generated from the second segmentation 400-b. The second list decoder 505-b may attempt to decode the second segmentation 400-b from the signal. Similar to the operation of the first list decoder 505-a discussed with reference to FIGS. 6-7, the second list decoder 505-b may perform a path search algorithm to search a code tree for decoding the signal including the second polar-encoded codeword. To do so, the second list decoder 505-b may determine a list size L of candidate paths through the code tree and select one or more bit sequences corresponding to the L candidate paths to the second error detector 510-b for error detection. The second list decoder 505-b may use the HP bits 410 set as frozen bits for calculating the path metrics of the respective candidate paths, and may assign a penalty to paths where a bit value at a particular node along a candidate path differs from the value of a HP bit 410 set as a frozen bit.

The second list decoder 505-b may extract a bit sequence of length N from each of the candidate paths for output to the second error detector 510-b, The second error detector 510-b may iteratively perform an error detection algorithm on the bit sequences in an order based on path metrics for each path. The second error detector 510-a may perform an error detecting algorithm for determining whether any of the bit sequences passes EDC (e.g., a CRC algorithm). As described above, the second polar-encoded codeword may be generated by polar encoding second segmentation 400-b that includes HP bits 410, LP bits 420, and second EDC bits 415-b. If the bit sequence obtained from a selected candidate path is the same as the bit sequence of the second segmentation 400-b, the second error detector 510-b should be able to parse the bit sequence to extract the HP bits 410, the LP bits 420, and the second EDC bits 415-b. The second error detector 510-b may then generate a calculated. EDC using the extracted HP bits 410 and the extracted LP bits 420 by applying the same algorithm to the HP bits 410 and the LP bits 420 as applied by the second EDC encoder 310-b. If the calculated EDC is the same as the extracted EDC, the second error detector 510-d determines that it was able to successfully able to decode the second polar-encoded codeword and outputs the bit sequence of the HP bits 410 and the LP bits 420 with or without the second EDC bits 415-b.

If the calculated and extracted EDCs are not the same, the second error detector 510-b indicates a decoding failure for that bit sequence. The second error detector 510-b checks a bit sequence associated with a next highest path metric to see if that bit sequence passes error detection. The second error detector 510-b thus proceeds from bit sequence to bit sequence until one of the bit sequences passes or all fail. If all paths have been checked, the second error detector 510-b indicates a decoding failure.

Figure 8:
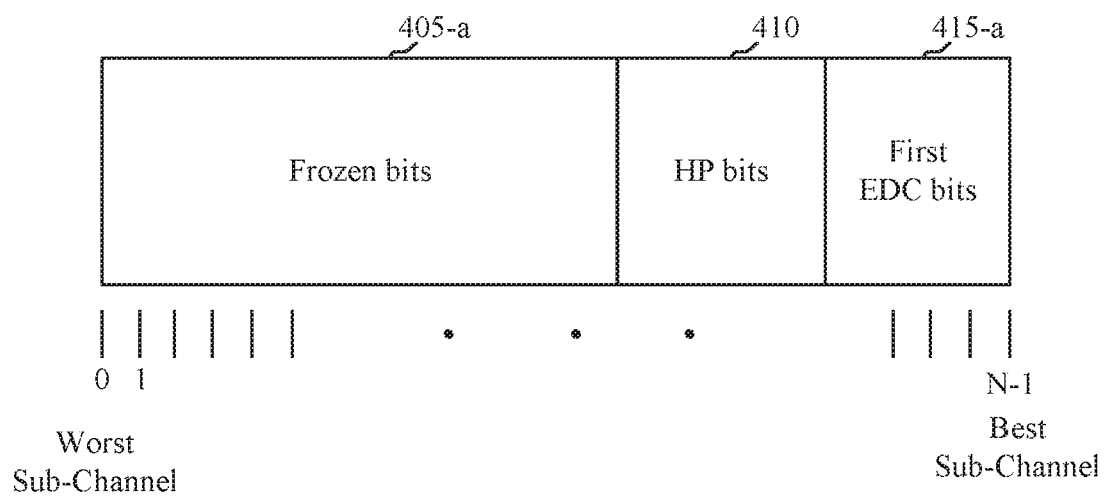
FIG. 8 illustrates an example of control information segmentations that support polar codes for uplink control information in accordance with aspects of the present disclosure.
Figure 8:
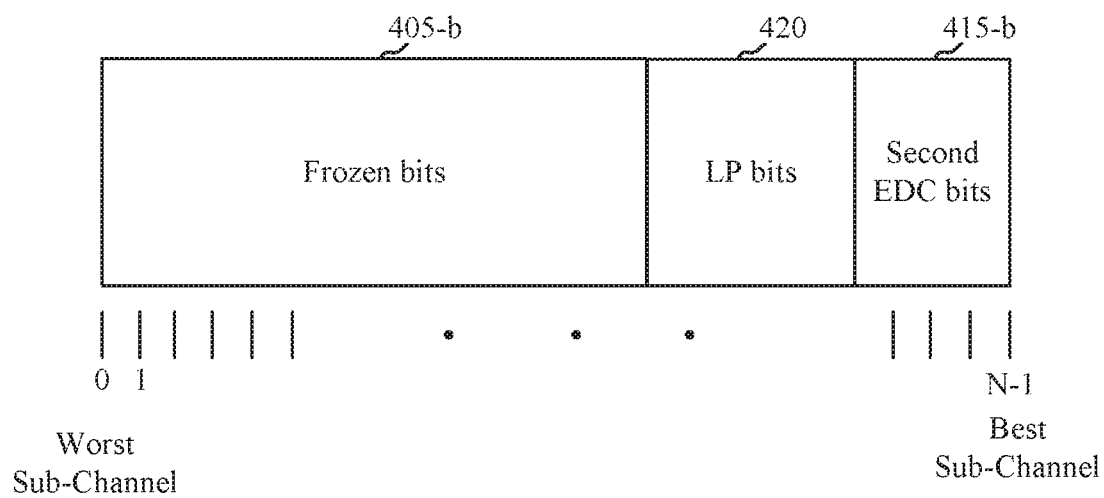

The benefits described herein may be achieved for segmentations in other arrangements, FIG. 8 illustrates an example diagram of control information segmentations 800-a, 800-b that support polar codes for uplink control information in accordance with various aspects of the present disclosure. The segmentor 210-a of FIG. 3 may be used to generate the first and second segmentations 800-a, 800-b. The first segmentation 800-a may be the same as or similar to the first segmentation 400-a. As depicted, the first segmentation 800-a may include frozen bits 405-a, HP bits 410, and first EDC bits 415-a.

The second segmentation 800-a may include the frozen bits 405-b, the LP bits 420, and the second EDC bits 415-b, but not the HP bits 410. The LP bits 420 may be the bits of the LP data output by the data allocator 305. The second EDC bits 415-b may be the bits of the second EDC generated by the second EDC encoder 310-b. The frozen bits 405-b may be bits set to a defined value that are known by each of the transmitter and receiver (e.g., each of base station 105-a and UE 115-a), and the number of and sub-channel location of the frozen bits 405-a may be known by each of the transmitter and receiver. Similar to the first and second segmentations 400-a, 400-b, bits of the first and second segmentations 800-a, 800-b may be loaded into sub-channels of a polar code based on the reliability of each sub-channel. relative to the other sub-channels. With reference to FIG. 2, the polar encoder 215 may respectively load the N bits of the first segmentation 800-a into N sub-channels of a polar code for polar encoding and output a first codeword of length N. The polar encoder 215 may similarly load N bits of the second segmentation 800-b into N sub-channels of a polar code for polar encoding and output a second codeword of length N. The polar encoder 215 may output the first and second codewords to the modulator 220 for transmission to the UE 115-a.

Figure 9:
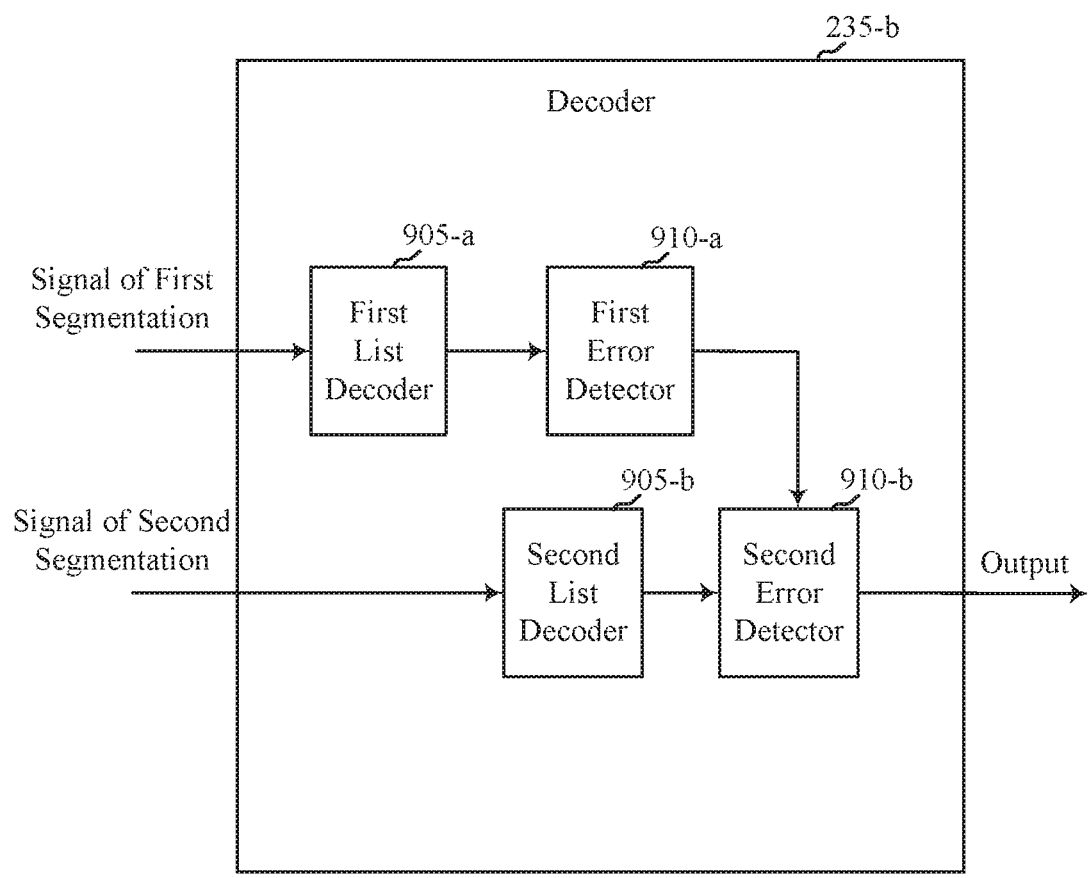
FIG. 9 illustrates an example of a decoder that supports polar codes for uplink control information in accordance with aspects of the present disclosure.

The UE 115-a may receive at least one signal that includes the first and second codewords and a decoder of the UE 115-a may attempt to retrieve the control information from the received codewords. FIG. 9 illustrates an example diagram 900 of a decoder 235-b that supports polar codes for uplink control information in accordance with various aspects of the present disclosure. In some. examples, decoder 235-*b* may implement aspects of decoder 235. A first list decoder 905-*a* of decoder 235-*b* may perform a path search algorithm, as described above in FIGS. 6-7, to search a code tree for decoding the received first polar-encoded codeword generated from the first segmentation 800-*a*. The first list decoder 905-*a* may determine a list size L of candidate paths through the code tree and output bit sequences corresponding to the L candidate paths to the first error detector 510-*a* for error detection. A first error detector 910-*a* may iteratively perform an error detection algorithm on the bit sequences in an order based on path metrics for each path. The first error detector 910-*a* may stop as soon as one of the bit sequences passes the error detection algorithm, or all of the bit sequences have been checked and none passed the error detection algorithm. If a bit sequence passes error detection, the first error detector 910-*a* may output the bit sequence as the HP bits 410 from the first segmentation 800-*a* to the second error detector 910-*b*. The decoder 235-*b* thus differs from decoder 235-*a* by having the first error detector 910-*a* output the HP bits 410 to the second error detector 910-*b* instead of to a second list decoder 905-*b*, and hence the second list decoder 905-*b* does not set the HP bits 410 as frozen bits.

The second list decoder 905-*b* may perform a path search algorithm, as described above in FIGS. 6-7, to search a code tree for decoding the received second polar-encoded codeword generated from the second segmentation 800-*b*. In some examples, the first and second list decoders 905-*a*, 905-*b* may operate simultaneously. The second list decoder 905-*b* may determine a list size L of candidate paths through the code tree and output bit sequences corresponding to the L candidate paths to the second error detector 910-*b* for error detection. The second error detector 910-*b* may iteratively perform an error detection algorithm on the bit sequences in an order based on path metrics for each path. As noted above, the second EDC bits 415-*b* are generated by jointly encoding the HP bits 410 and the LP bits 420. To perform error detection, the second error detector 910-*b* extracts bit sequences corresponding to the L candidate paths attempting to identify a bit sequence that is the same as the LP bits 420.

If a first bit sequence received from the first error detector 910-*a* is the same as the HP bits 420, and if a second bit sequence obtained by the second list decoder 905-*b* from a selected candidate path is the same as the bit sequence of the second segmentation 800-*b*, the second error detector 910-*b* should be able to extract the LP bits 420 and the second EDC bits 415-*b* from the second segmentation 800-*b*. The second error detector 910-*b* may then calculate an EDC using the HP bits 410 output by the first error detector 910-*a* and the extracted LP bits 420 from comparison with the extracted EDC. If the calculated EDC is the same as the extracted EDC, the second error detector 910-*b* determines that it was able to successfully able to decode the first and second polar-encoded codewords and outputs the HP bits 410 and the LP bits 420 with or without the EDC bits 415-*a* or 415-*b*.

If the calculated and received EDCs are not the same, the second error detector 910-*b* indicates a decoding failure for the second bit sequence associated with the selected candidate path. The second error detector 910-*b* then checks a next candidate path associated with a next highest path metric to see if a bit sequence of the next candidate path is able to pass error detection. The second error detector 910-*b* thus proceeds from bit sequence to bit sequence until one of the bit sequences passes (e.g., due to the bit sequence being the same as second segmentation 800-*b*) or all fail. If all paths have been checked, the second error detector 910-*b* indicates a decoding failure for the first and second codewords.

Figure 10:
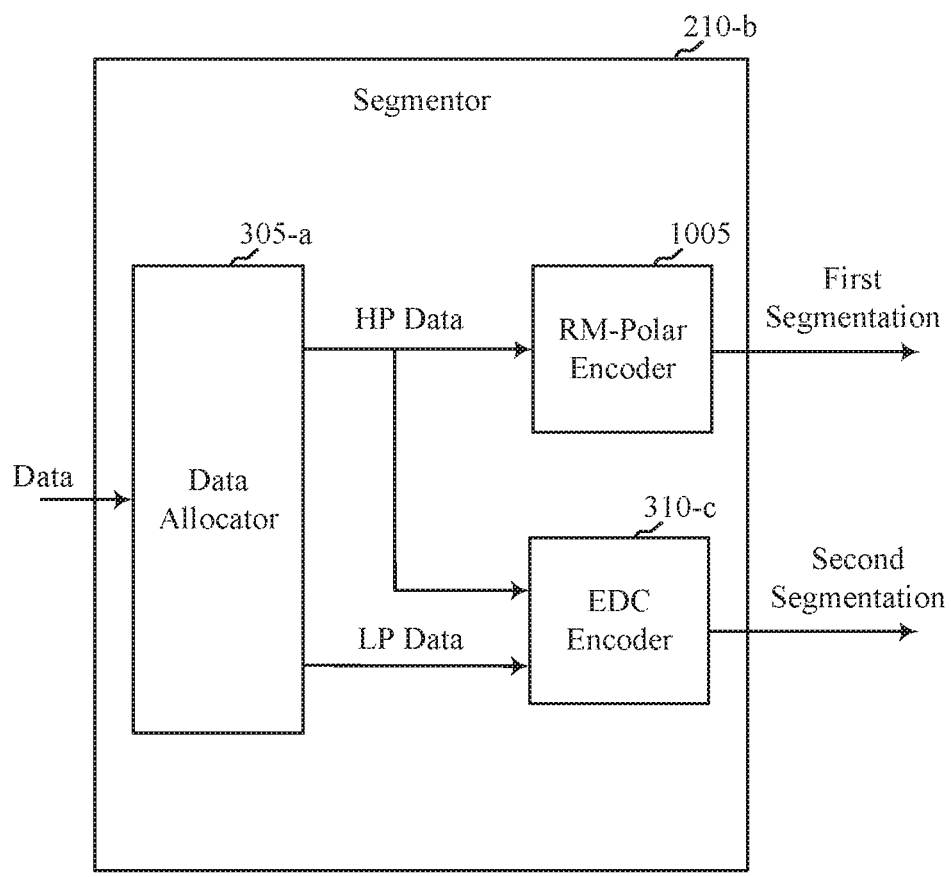
FIG. 10 illustrates an example of a segmentor that supports polar codes for uplink control information in accordance with aspects of the present disclosure.

In some examples, an EDC may not be included in the first segmentation. FIG. 10 illustrates an example diagram 1000 of a segmentor 210-*b* that supports polar codes for uplink control information in accordance with various aspects of the present disclosure, in some examples, segmentor 210-*b* may implement aspects of segmentor 210. The segmentor 210-*b* may receive control information and may generate segmentations from the control information that are output to the polar encoder 215. In an example, the segmentor 210-*b* may include a data allocator 305-*a*, a hybrid Reed-Muller (RM)-Polar encoder 1005, and an EDC encoder 310-*c*. The data allocator 305-*a* may allocate data into at least two subsets, in the same or similar as the data allocator 305 described in FIG. 3. The hybrid RM-Polar encoder 1005 may encode the HP data to generate a hybrid RM-Polar code that includes RM-Polar-encoded HP data using the below process that is a hybrid of polar and RM encoding. In an example, the RM-Polar encoder 1005 may obtain a generator matrix (e.g., Hadamard matrix) according to a coded block size, and determine a hamming distance (e.g., determine a maximum hamming distance) such that the number of rows of the matrix whose weight is not less than the hamming distance is larger than the bit length of the HP bits. The hybrid RM-Polar encoder 1005 may select rows from the generator matrix (e.g., find the best rows) from the rows whose weight is not less than the hamming distance according to the reliability of each sub-channel, and map bits of the HP data to the selected rows, Because RM-Polar encoding has better performance than polar encoding, the segmentor 210-*b* may not include an EDC in the first segmentation. In some examples, the gain of RM-Polar codes over polar codes may be 0.5 dB because of coding gain from a lower code rate. The RM-Polar encoder 1005 may output a first segmentation including the RM-encoded HP data to the polar encoder 215 for polar encoding. As above, the EDC encoder 310-*c* may jointly encode the HP data and the LP data to generate a single EDC that applies to both of the HP data and the LP data. The EDC encoder 310-*c* may output a second segmentation including the EDC to the polar encoder 215 for encoding using a polar code. Examples of the first and second segmentations are described below.

Figure 11:
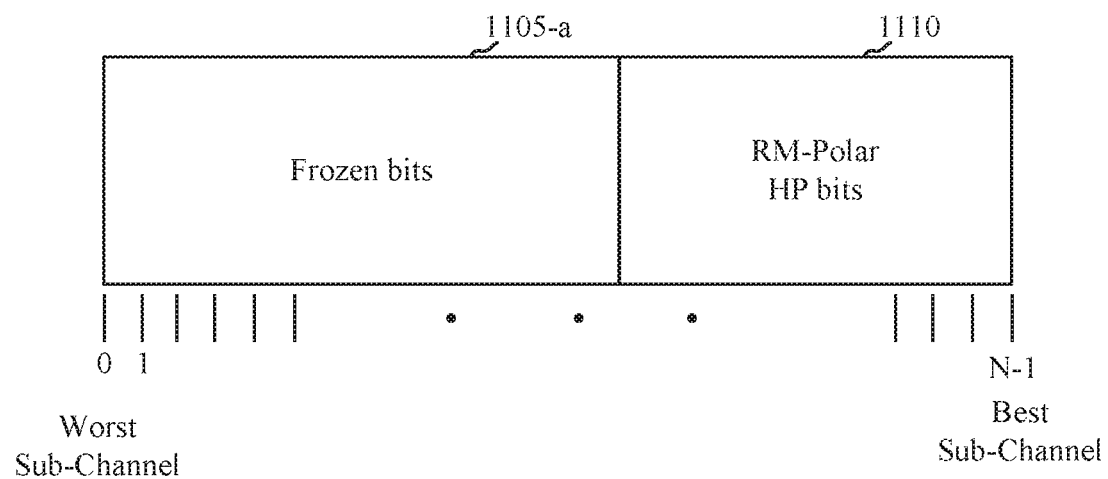
FIG. 11 illustrates an example of control information segmentations that support polar codes for uplink control information in accordance with aspects of the present disclosure.
Figure 11:
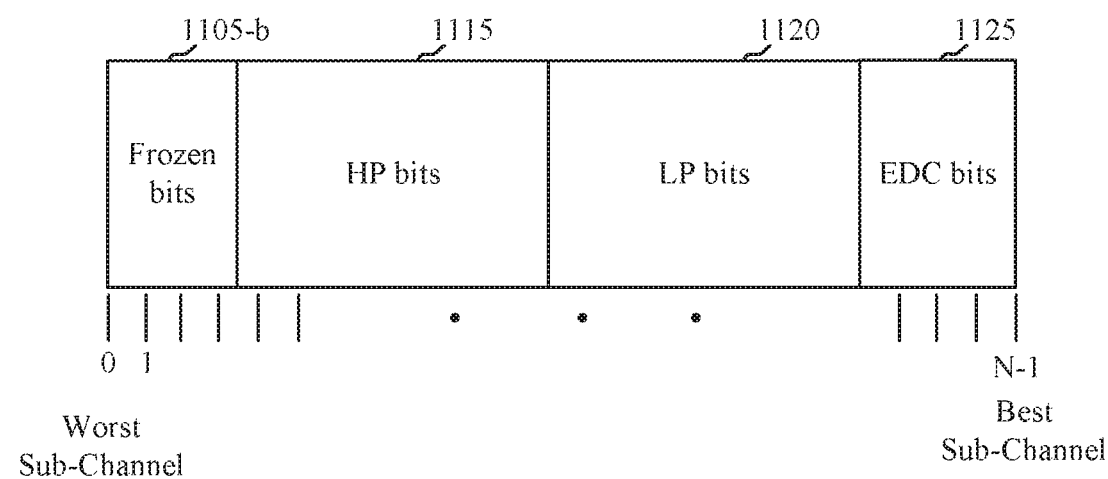

FIG. 11 illustrates an example of control information segmentations 1100-*a*, 1100-*b* that support polar codes for uplink control information in accordance with various aspects of the present disclosure. The segmentor 210-*b* of FIG. 10 may generate the control information segmentations 1100-*a*, 1100-*b*. First segmentation 1100-*a* may include frozen bits 1105-*a* and RM-Polar HP bits 1110. The RM-Polar HP bits 1110 may be the bits of the RM-Polar encoded HP data output by the RM-Polar encoder 1005. The frozen bits 1105-*a* may be bits set to a defined value that are known by each of the transmitter and receiver (e.g., each of base station 105-*a* and UE 115-*a*), and the number of and sub-channel location of the frozen bits 1105-*a* within the polar code may be known by each of the transmitter and receiver.

Second segmentation 1100-*b* may include frozen bits 1105-*b*, HP bits 1115, LP bits 1120, and EDC bits 1125. The HP bits 1110 may be the bits of the HP data output by the data allocator 305-*a* of FIG. 10. The LP bits 1120 may be the bits of the LP data output by the data allocator 305-*a*. The EDC bits 1125 may be the bits of the EDC generated by the EDC encoder 310-*c*. The frozen bits 1105-*b* may be bits set to a defined value that are known by each of the transmitter and receiver (e.g., each of base station 105-*a* and UE 115-*a*), and the number of and sub-channel location of the frozen bits 1105-*b* within the polar code may be known by each of the transmitter and receiver. Similar to the first and second segmentations 400-*a*, 400-*b*, bits of the first and second segmentations 1100-*a*, 1100-*b* may be loaded into sub-channels of a polar code based on the reliability of each sub-channel relative to the other sub-channels. With reference to FIG. 2, the polar encoder 215 may respectively load the N bits of the first segmentation 1100-*a* into N sub-channels of a polar code for polar encoding and output a first codeword of length N. The polar encoder 215 may similarly load N bits of the second segmentation 1100-*b* into N sub-channels of a polar code for polar encoding and output a second codeword of length N. The polar encoder 215 may output the first and second codewords to the modulator 220 for transmission to the UE 115-*a*.

Figure 12:
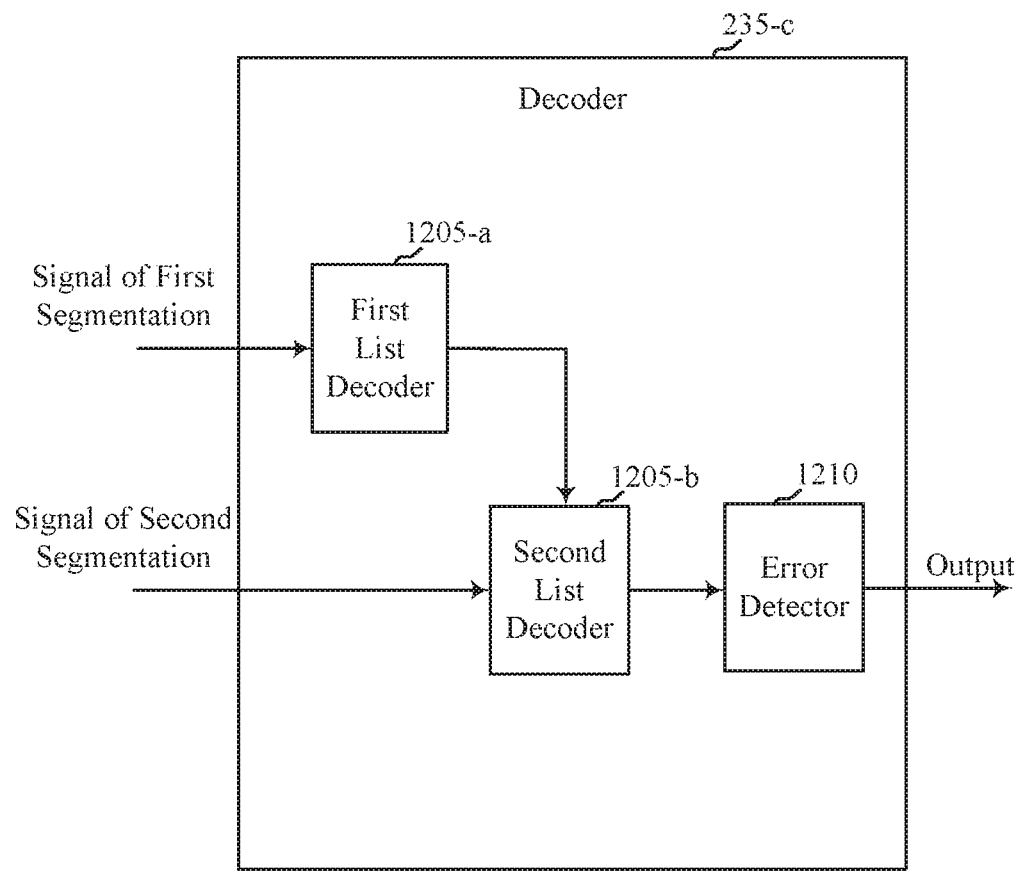
FIG. 12 illustrates an example of a decoder that supports polar codes for uplink control information in accordance with aspects of the present disclosure.

The UE 115-*a* may receive at least one signal that includes the first and second codewords and a decoder of the UE 115-*a* may attempt to retrieve the control information from the received codewords. FIG. 12 illustrates an example diagram 1200 of a decoder that supports polar codes for uplink control information in accordance with various aspects of the present disclosure. In some examples, decoder 235-*c* may implement aspects of decoder 235.

A first list decoder 1205-*a* of decoder 235-*c* may perform a path search algorithm, as described above in FIGS. 6-7, to search a code tree for decoding the received first polar-encoded codeword generated from the first segmentation 1100-*a*. The first list decoder 1205-*a* may determine a list size L of candidate paths through the code tree. If decoding of the first segmentation 1100-*a* is successful, the first list decoder 1205-*a* may select a bit sequence corresponding to the candidate path of the L candidate paths having the best path metric. The selected bit sequence may correspond to the first segmentation 1100-*a*. The first list decoder 1205-*a* may decode the RM-Polar HP bits 1110 of the first segmentation 1100-*a* to retrieve the HP bits 1115, and may output the HP bits 1115 to the second list decoder 1205-*b*. The second list decoder 1205-*b* may set the HP bits 1115 as frozen bits. Because the first segmentation 1100-*a* does not include an EDC, the decoder 235-*b* does not perform error detection on the output HP bits 1115 using an EDC included in the first segmentation 1100-*a*.

A second list decoder 1205-*b* of decoder 235-*c* may perform a path search algorithm, as described above in FIGS. 6-7, to search a code tree for decoding the received second polar-encoded codeword generated from the second segmentation 1100-*b*. The second list decoder 1205-*b* may determine a list size L of candidate paths through the code tree and output bit sequences corresponding to the L candidate paths to the error detector 1210 for error detection. The second list decoder 1205-*b* may use the HP bits 1115 set as frozen bits for calculating the path metrics of the respective candidate paths, and may assign a penalty to paths where a bit value at a particular node along a candidate path differs from the value of a HP bit 1115 set as a frozen bit.

An error detector 1210 of decoder 235-*c* may iteratively perform an error detection algorithm on the bit sequences corresponding to the L candidate paths in an order based on path metrics for each path. As noted above, if a bit sequence from a selected candidate paths is the same as the bit sequence of the second segmentation 1100-*b*, the error detector 1210 may extract the HP bits 1115, the LP bits 1120, and the EDC bits 1125 from the bit sequence. The error detector 1210 may calculate an EDC using the extracted HP bits 1115 and the extracted LP bits 1120 for comparison to the extracted EDC for determining whether the bit sequence passes error detection (e.g., calculated EDC is the same as the extracted EDC). The error detector 1210 may stop as soon as one of the bit sequences passes the error detection algorithm, or all of the bit sequences have been checked and none passed the error detection algorithm. If a bit sequence passes error detection, the error detector 1210 may output the extracted HP bits 1115 and the extracted LP bits 1120.

Figure 13:
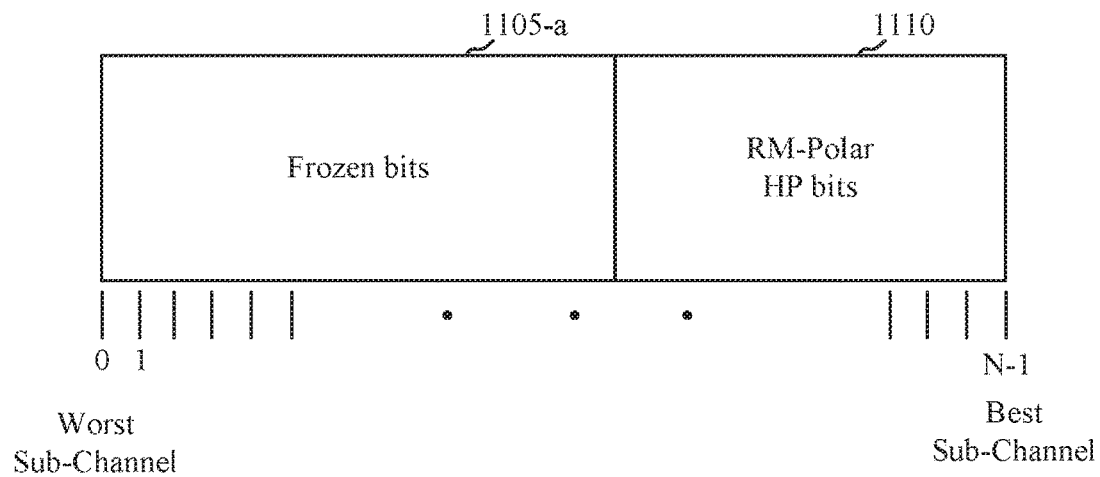
FIG. 13 illustrates an example of control information segmentations that support polar codes for uplink control information in accordance with aspects of the present disclosure.
Figure 13:
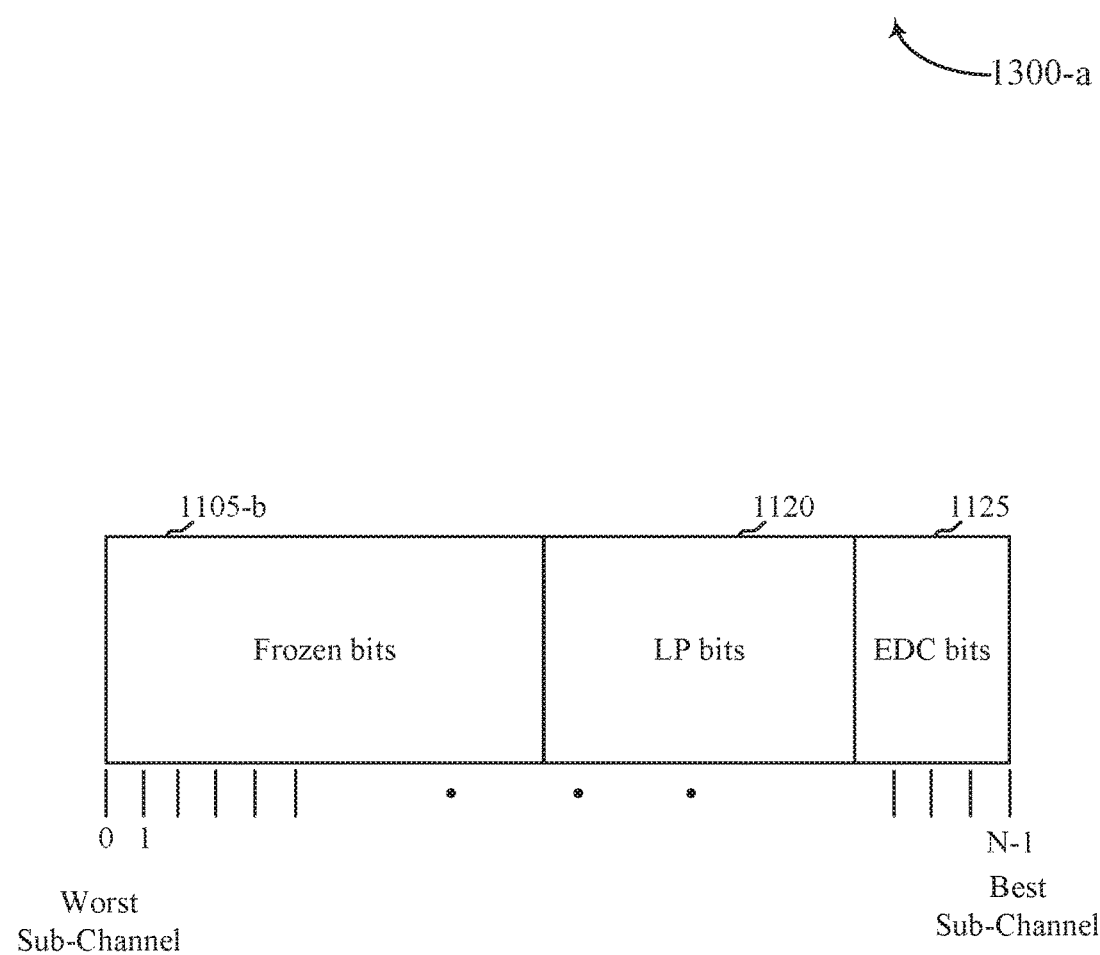

In some examples, the first segmentation may not include EDC bits and the second segmentation may not include HP bits. FIG. 13 illustrates an example of control information segmentations 1300-*a*, 1300-*b* that support polar codes for uplink control information in accordance with various aspects of the present disclosure. The segmentor 210-*b* of FIG. 10 may generate the first and second segmentations 1300-*a*, 1300-*b*. The first segmentation 1300-*a* may be the same as or similar to the first segmentation 1100-*a* and may include frozen bits 1105-*a* and RM-Polar HP bits 1110. The second segmentation 1300-*b* may include the LP bits 1120, frozen bits 1105-*b*, and EDC bits 1125, but not the HP bits 1115. The LP bits 1120 may be the bits of the LP data output by the data allocator 305-*a*, The EDC bits 1125 may be the bits of the EDC generated by the EDC encoder 310-*c*. The frozen bits 1105-*b* may be bits set to a defined value that are known by each of the transmitter and receiver (e.g., each of base station 105-*a* and UE 115-*a*), and the number of and sub-channel location of the frozen bits 1105-*b* within the polar code may be known by each of the transmitter and receiver.

Similar to the first and second segmentations 400-*a*, 400-*b*, bits of the first and second segmentations 1300-*a*, 1300-*b* may be loaded into sub-channels of a polar code based on the reliability of each sub-channel relative to the other sub-channels, With reference to FIG. 2, the polar encoder 215 may respectively load the N bits of the first segmentation 1300-*a* into N sub-channels of a polar code for polar encoding and output a first codeword of length N. The polar encoder 215 may similarly load N bits of the second segmentation 1300-*b* into N sub-channels of a polar code for polar encoding and output a second codeword of length N. The polar encoder 215 may output the first and second codewords to the modulator 220 for transmission to the UE 115-*a*.

Figure 14:
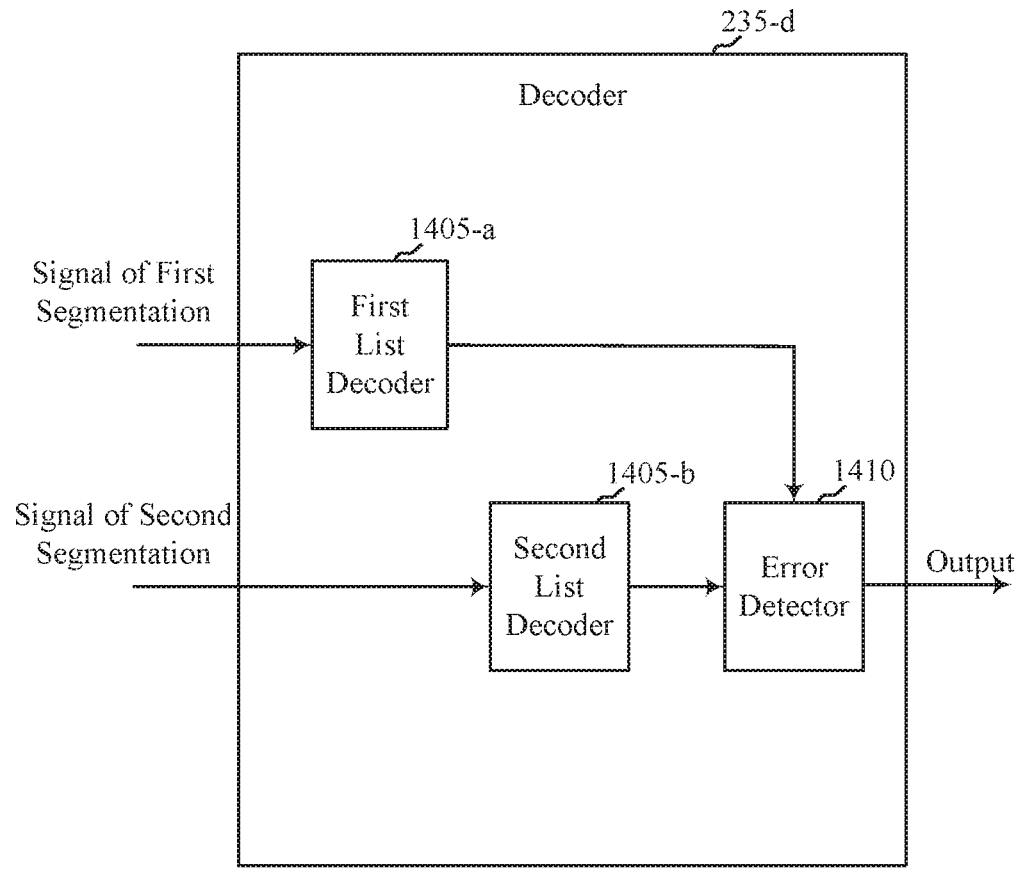
FIG. 14 illustrates an example of a decoder that supports polar codes for uplink control information in accordance with aspects of the present disclosure.

The UE 115-*a* may receive at least one signal that includes the first and second codewords and a decoder of the UE 115-*a* may attempt to retrieve the control information from the received codewords. FIG. 14 illustrates an example diagram 1400 of a decoder 235-*d* that supports polar codes for uplink control information in accordance with various aspects of the present disclosure. In some examples, decoder 235-*d* may implement aspects of decoder 235.

A first list decoder 1405-*a* of decoder 235-*d* may perform a path search algorithm, as described above in FIGS. 6-7, to search a code tree for decoding the received first polar-encoded codeword generated from the first segmentation 1300-*a*. The first list decoder 1405-*a* may determine a list size L of candidate paths through the code tree. If decoding of the first segmentation 1300-*a* is successful, the first list decoder 1405-*a* may select a bit sequence of length N corresponding to the candidate path of the L candidate paths having the best path metric. The selected bit sequence may correspond to the first segmentation 1300-*a*. The first list decoder 1205-*a* may decode the RM-Polar HP bits of the first segmentation 1300-*a* to retrieve the HP bits 1115, and may output the HP bits 1115 to the error detector 1410. Because the first segmentation 1300-*a* does not include an EDC, the decoder 235-d does not perform error detection on the output HP bits 1115 using an EDC from the first segmentation 1300-a.

A second list decoder 1405-b of decoder 235-d may perform a path search algorithm, as described above in FIGS. 6-7, to search a code tree for decoding the received second polar-encoded codeword generated from the second segmentation 1300-b. In some examples, the first and second list decoders 1405-a, 1405-b may operate simultaneously. The second list decoder 1405-b may determine a list size L of candidate paths through the code tree and output bit sequences of length N corresponding to the L candidate paths to the error detector 1410 for error detection. An error detector 1410 of decoder 235-d may iteratively perform an error detection algorithm on the bit sequences corresponding to the L candidate paths in an order based on path metrics for each path. The error detector 1410 may stop as soon as one of the bit sequences passes the error detection algorithm, or all of the bit sequences have been checked and none passed the error detection algorithm. As noted above, the EDC bits 1125 are generated by jointly encoding the HP bits 1115 and the LP bits 1120. To perform error detection, the error detector 1410 extracts bit sequences corresponding to the L candidate paths attempting to identify a bit sequence that is the same as the LP bits 1120.

If a first bit sequence received from the first list decoder 1405-a is the same as the bit sequence as the transmitted HP bits 1115, and if a second bit sequence obtained by the second list decoder 1405-b from a selected candidate path is the same as the bit sequence of the second segmentation 1300-b, the error detector 1410 should he able to extract the LP bits 1120 from the second segmentation 1300-b and calculate the EDC bits 1125 using the HP bits 1115 output by the first list decoder 1405-a and the extracted LP bits 1120 to match the transmitted HP bits 1115 and the transmitted LP bits 1120. To do so, the error detector 1410 may generate a calculated EDC using the first bit sequence and the extracted LP bits 1120 by applying the same algorithm as applied by the EDC encoder 310-c to the HP bits 1110 and the LP bits 1120 (see FIG. 10). If the calculated EDC is the same as the extracted EDC, the error detector 1410 determines that it was able to successfully able to decode the first and second polar-encoded codewords and outputs the HP bits 1110 and the LP bits 1120 with or without the EDC bits 1125.

If the calculated and received EDCs are not the same, the error detector 1410 indicates a decoding failure for the second bit sequence associated with the selected candidate path. The error detector 1410 then checks a next candidate path associated with a next highest path metric to see if a bit sequence of the next candidate path is able to pass error detection. The error detector 1410 thus proceeds from bit sequence to bit sequence until one of the bit sequences passes (e.g., due to the bit sequence being the same as the LP bits 1120) or all fail. If all paths have been checked, the error detector 1410 indicates a decoding failure for the first and second codewords.

Figure 15:
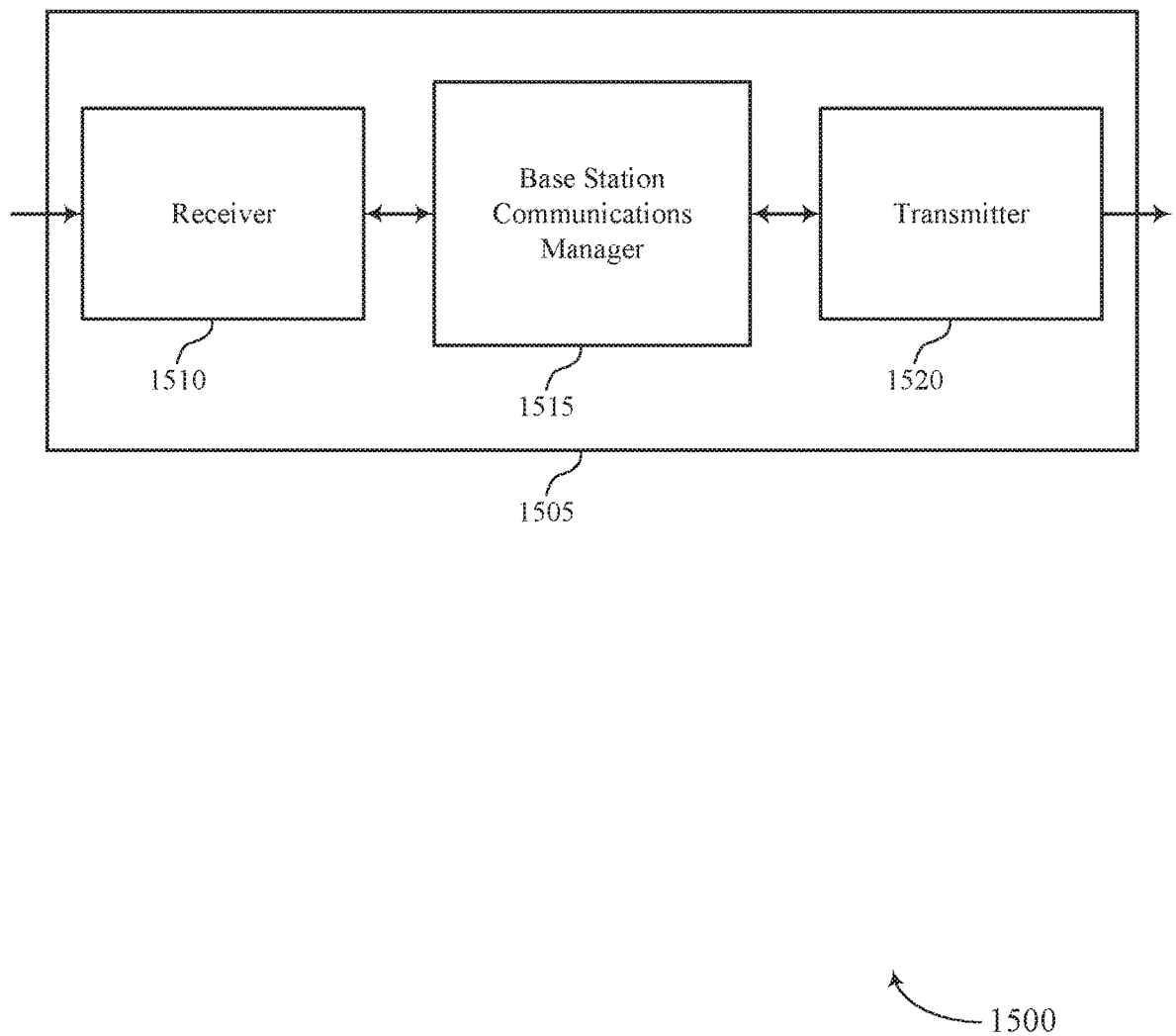
FIGS. 15 through 17 show block diagrams of a device that supports polar codes for uplink control information in accordance with aspects of the present disclosure.

Advantageously, the examples described herein may divide ICI data into at least two priority-based subsets and may provide differing levels of protection for different kinds of UCI information (e.g., ACK/NACK, RI, PMI and CQI). Segmentation beneficially improves power efficiency by enabling early termination of a decoding procedure such that the decoding of second segmentation may not be necessary if decoding of the first segmentation fails. The performance of the first segmentation may also be improved by using RM-Polar codes that reduce EDC (e.g., CRC) overhead, FIG. 15 shows a block. diagram 1500 of a wireless device 1505 that supports polar codes for uplink control information in accordance with aspects of the present disclosure. Wireless device 1505 may be an example of aspects of a base station 105 as described herein. Wireless device 1505 may include receiver 1510, base station communications manager 1515, and transmitter 1520. Wireless device 1505 may also include a processor. Each of these components may be in communication with one another (e.g., via one or more buses).

Receiver 1510 may receive one or more signals including one or more polar-encoded codewords. The receiver 1510 may be an example of aspects of the transceiver 1835 described with reference to FIG. 18, The receiver 1510 may utilize a single antenna or a set of antennas.

Base station communications manager 1515 may be an example of aspects of the base station communications manager 1815 described with reference to FIG. 18.

Base station communications manager 1515 and/or at least some of its various sub-components may be implemented in hardware, software executed by a processor, firmware, or any combination thereof. If implemented in software executed by a processor, the functions of the base station communications manager 1515 and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The base station communications manager 1515 and/or at least some of its various sub-components may be physically located at various positions, including being distributed such that portions of functions are implemented at different physical locations by one or more physical devices. In some examples, base station communications manager 1515 and/or at least some of its various sub-components may be a separate and distinct component in accordance with various aspects of the present disclosure. In other examples, base station communications manager 1515 and/or at least some of its various sub-components may be combined with one or more other hardware components, including but not limited to an i/O component, a transceiver, a network server, another computing device, one or more other components described in the present disclosure, or a combination thereof in accordance with various aspects of the present disclosure.

Base station communications manager 1515 may generate a first control information segmentation based on a first subset of control information, generate a second control information segmentation based on jointly encoding the first subset of the control information and a second subset of the control information, polar encode the first control information segmentation to generate a first codeword and the second control information segmentation to generate a second codeword, and transmit the first codeword and the second codeword.

Transmitter 1520 may transmit signals generated by other components of the device. In some examples, the transmitter 1520 may be collocated with a receiver 1510 in a transceiver module. For example, the transmitter 1520 may be an example of aspects of the transceiver 1835 described with reference to FIG. 18. The transmitter 1520 may utilize a single antenna or a set of antennas.

Figure 16:
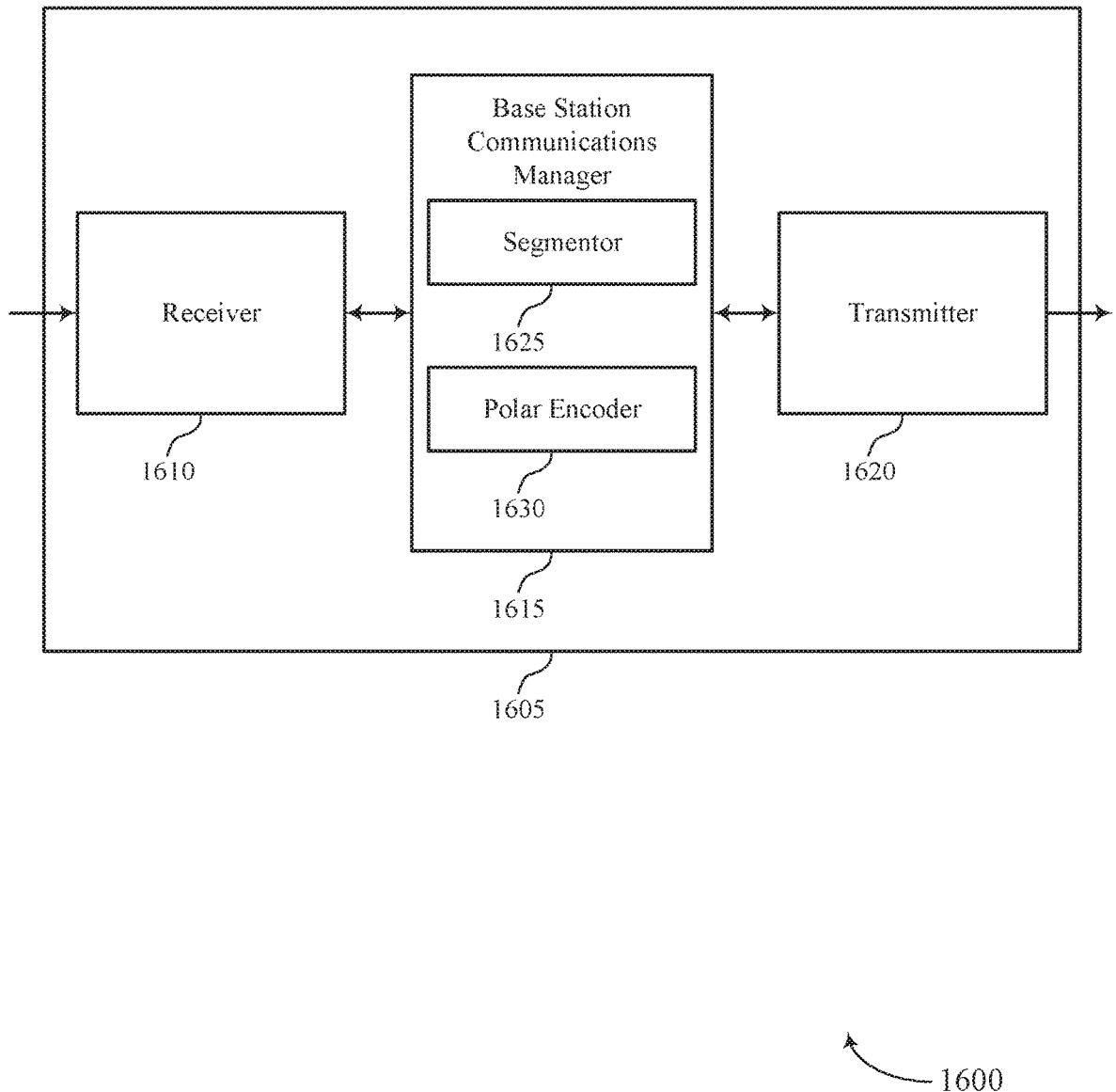

FIG. 16 shows a block diagram 1600 of a wireless device 1605 that supports polar codes for uplink control information in accordance with aspects of the present disclosure.

Wireless device 1605 may be an example of aspects of a wireless device 1505 or a base station 105 as described with reference to FIG. 15. Wireless device 1605 may include receiver 1610, base station communications manager 1615, and transmitter 1620. Wireless device 1605 may also include a processor, Each of these components may be in communication with one another (e.g., via one or more buses).

Receiver 1610 may receive one or more signals including one or more polar-encoded codewords. The receiver 1610 may be an example of aspects of the transceiver 1835 described with reference to FIG. 18. The receiver 1610 may utilize a single antenna or a set of antennas.

Base station communications manager 1615 may be an example of aspects of the base station communications manager 1815 described with reference to FIG. 18.

Base station communications manager 1615 may also include segmentor 1625 and polar encoder 1630.

Segmentor 1625 may generate a first control information segmentation based on a first subset of control information and generate a second control information segmentation based on jointly encoding the first subset of the control information and a second subset of the control information. In some cases, the second control information segmentation includes bits of the EDC, bits of the first subset of the control information, and bits of the second subset of the control information. In some cases, the second control information segmentation includes bits of the EDC and bits of the second subset of the control information. In some cases, generating the first control information segmentation further includes: determining an error detection code (EDC) based on the first subset of the control information. In some cases, the first control information segmentation includes bits of the EDC and bits of the first subset of the control information. In some cases, the first subset of the control information includes one or more of acknowledgement data, rank index data, precode matrix index data, or any combination thereof. In some cases, the second subset of the control information includes channel quality indicator data.

Polar encoder 1630 may polar encode the first control information segmentation to generate a first codeword and the second control information segmentation to generate a second codeword and transmit the first codeword and the second codeword. In some cases, polar encoding the second control information segmentation to generate the second codeword further includes: loading a set of frozen bits, bits of the EDC, bits of the first subset of the control information, and bits of the second subset of the control information into respective sub-channels of a polar code based on a reliability order of the sub-channels. In some cases, polar encoding the first control information segmentation to generate the first codeword includes: loading a set of frozen bits, the bits of the EDC, and the bits of the first subset of the control information into respective sub-channels of a polar code based on a reliability order of the sub-channels. In some cases, polar encoding the first control information segmentation to generate the first codeword includes: loading a set of frozen bits, the bits of the EDC, and the bits of the Reed-Muller code into respective sub-channels of a polar code based on a reliability order of the sub-channels.

Transmitter 1620 may transmit signals generated by other components of the device. In some examples, the transmitter 1620 may be collocated with a receiver 1610 in a transceiver module. For example, the transmitter 1620 may be an example of aspects of the transceiver 1835 described with reference to FIG. 18. The transmitter 1620 may utilize a single antenna or a set of antennas.

Figure 17:
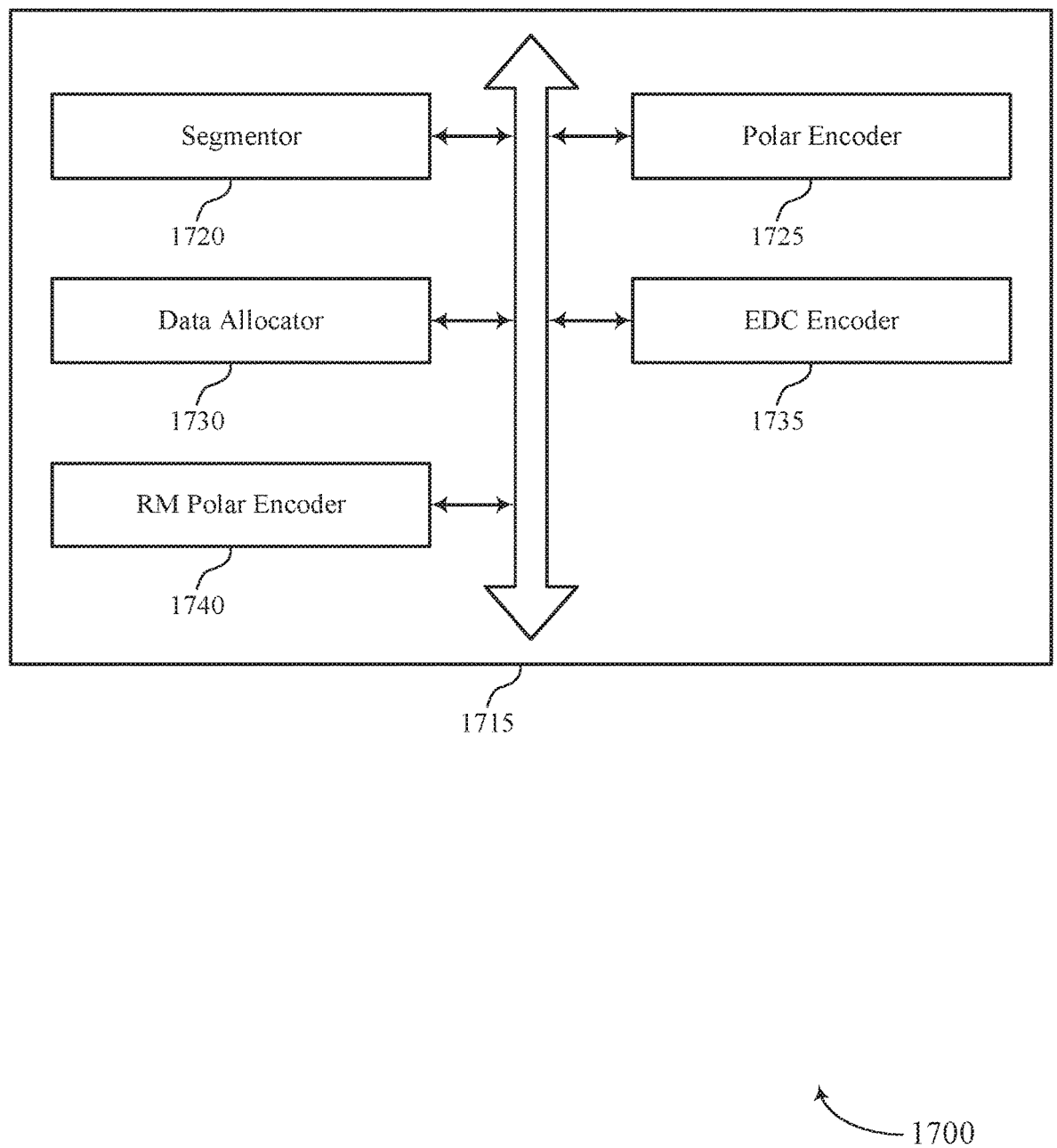

FIG. 17 shows a block diagram 1700 of a base station communications manager 1715 that supports polar codes for uplink control information in accordance with aspects of the present disclosure. The base station communications manager 1715 may be an example of aspects of a base station communications manager 1515, a base station communications manager 1615, or a base station communications manager 1815 described with reference to FIGS. 15, 16, and 18. The base station communications manager 1715 may include segmentor 1720, polar encoder 1725, data allocator 1730, EDC encoder 1735, and RM polar encoder 1740. Each of these modules may communicate, directly or indirectly, with one another (e.g., via one or more buses).

Segmentor 1720 may generate a first control information segmentation based on a first subset of control information and generate a second control information segmentation based on jointly encoding the first subset of the control information and a second subset of the control information. In some cases, the second control information segmentation includes bits of the EDC, bits of the first subset of the control information, and bits of the second subset of the control information. In some cases, the second control information segmentation includes bits of the EDC and bits of the second subset of the control information. In some cases, generating the first control information segmentation further includes: determining an EDC based on the first subset of the control information. In some cases, the first control information segmentation includes bits of the EDC and bits of the first subset of the control information. In some cases, the first subset of the control information includes one or more of acknowledgement data, rank index data, precode matrix index data, or any combination thereof. In some cases, the second subset of the control information includes channel quality indicator data.

Polar encoder 1725 may polar encode the first control information segmentation to generate a first codeword and the second control information segmentation to generate a second codeword and transmit the first codeword and the second codeword. In some cases, polar encoding the second control information segmentation to generate the second codeword further includes: loading a set of frozen bits, bits of the EDC, bits of the first subset of the control information, and bits of the second subset of the control information into respective sub-channels of a polar code based on a reliability order of the sub-channels. In some cases, polar encoding the first control information segmentation to generate the first codeword includes: loading a set of frozen bits, the bits of the EDC, and the bits of the first subset of the control information into respective sub-channels of a polar code based on a reliability order of the sub-channels. In some cases, polar encoding the first control information segmentation to generate the first codeword includes: loading a set of frozen bits, the bits of the EDC, and the bits of the Reed-Muller code into respective sub-channels of a polar code based on a reliability order of the sub-channels.

Data allocator 1730 may allocate the control information into the first subset and the second subset based on priority.

EDC encoder 1735 may determine a first EDC based on the first subset of the control information and a second subset of the control information and determine a second EDC based on the first subset of the control information, where a bit length of the first EDC differs from a bit length of the second EDC. In some cases, jointly encoding the first subset of the control information and the second subset of the control information includes: determining an EDC based on the first subset of the control information and the second subset of the control information.

RM polar encoder 1740 may generate a hybrid Reed-Muller Polar (RM-Polar) code based on the first subset of the control information, where the first control information segmentation includes bits of the RM-Polar code, determine a hamming distance such that a number of rows of the generator matrix with a weight exceeding the hamming distance at least is the same as a number of bits of the first subset of the control information, select a subset of the rows of the generator matrix based on a reliability of each sub-channel of a set of sub-channels of a polar code, and map the first subset of the control information to the selected subset of the rows. In some cases, generating the RM-Polar code includes: obtaining a generator matrix based on a coded block size.

Figure 18:
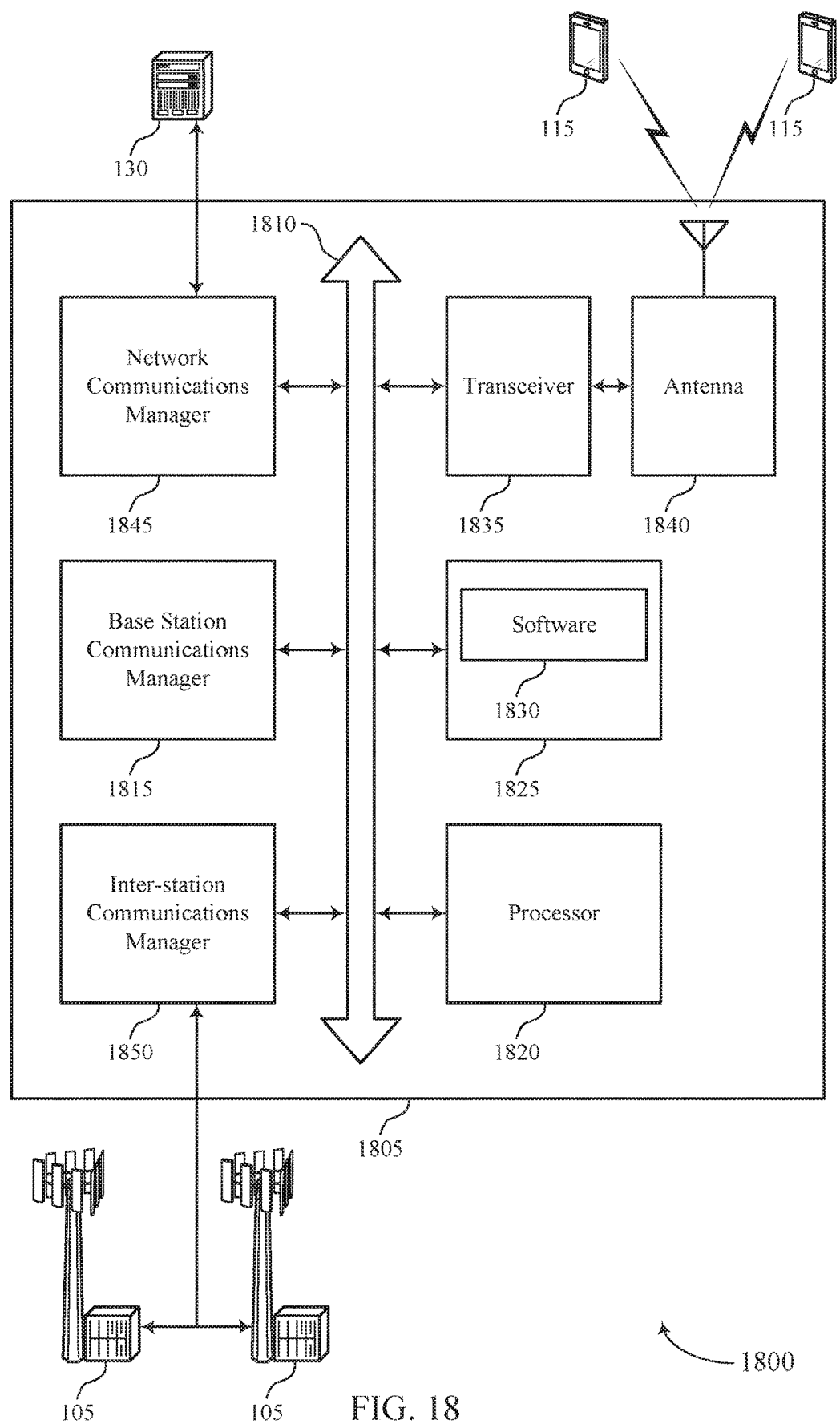
FIG. 18 illustrates a block diagram of a system including a base station that supports polar codes for uplink control information in accordance with aspects of the present disclosure.

FIG. 18 shows a diagram of a system 1800 including a device 1805 that supports polar codes for uplink control information in accordance with aspects of the present disclosure. Device 1805 may be an example of or include the components of wireless device 1505, wireless device 1605, or a base station 105 as described above, e.g., with reference to FIGS. 15 and 16. Device 1805 may include components for bi-directional voice and data communications including components for transmitting and receiving communications, including base station communications manager 1815, processor 1820, memory 1825, software 1830, transceiver 1835, antenna 1840, network communications manager 1845, and inter-station communications manager 1850. These components may be in electronic communication via one or more buses (e.g., bus 1810). Device 1805 may communicate wirelessly with one or more user equipment (UE)s 115.

Processor 1820 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 1820 may be configured to operate a memory array using a memory controller. In other cases, a memory controller may be integrated into processor 1820. Processor 1820 may be configured to execute computer-readable instructions stored in a memory to perform various functions (e.g., functions or tasks supporting polar codes for uplink control information).

Memory 1825 may include random access memory (RAM) and read only memory (ROM). The memory 1825 may store computer-readable, computer-executable software 1830 including instructions that, when executed, cause the processor to perform various functions described herein. In some cases, the memory 1825 may contain, among other things, a basic input/output system (BIOS) which may control basic hardware or software operation such as the interaction with peripheral components or devices.

Software 1830 may include code to implement aspects of the present disclosure, including code to support polar codes for uplink control information. Software 1830 may be stored in a non-transitory computer-readable medium such as system memory or other memory. In some cases, the software 1830 may not be directly executable by the processor but may cause a computer (e.g., when compiled and executed) to perform functions described herein.

Transceiver 1835 may communicate bi-directionally, via one or more antennas, wired, or wireless links as described above. For example, the transceiver 1835 may represent a wireless transceiver and may communicate bi-directionally with another wireless transceiver. The transceiver 1835 may also include a modem to modulate the packets and provide the modulated packets to the antennas for transmission, and to demodulate packets received from the antennas.

In some cases, the wireless device may include a single antenna 1840. However, in some cases the device may have more than one antenna 1840, which may be capable of concurrently transmitting or receiving multiple wireless transmissions.

Network communications manager 1845 may manage communications with the core network (e.g., via one or more wired backhaul links). For example, the network communications manager 1845 may manage the transfer of data communications for client devices, such as one or more UEs 115.

Inter-station communications manager 1850 may manage communications with other base station 105, and may include a controller or scheduler for controlling communications with UEs 115 in cooperation with other base stations 105. For example, the inter-station communications manager 1850 may coordinate scheduling for transmissions to UEs 115 for various interference mitigation techniques such as beamforming or joint transmission. In some examples, inter-station communications manager 1850 may provide an X2 interface within an Long Term Evolution (LTE)/LTE-A wireless communication network technology to provide communication between base stations 105.

Figure 19:
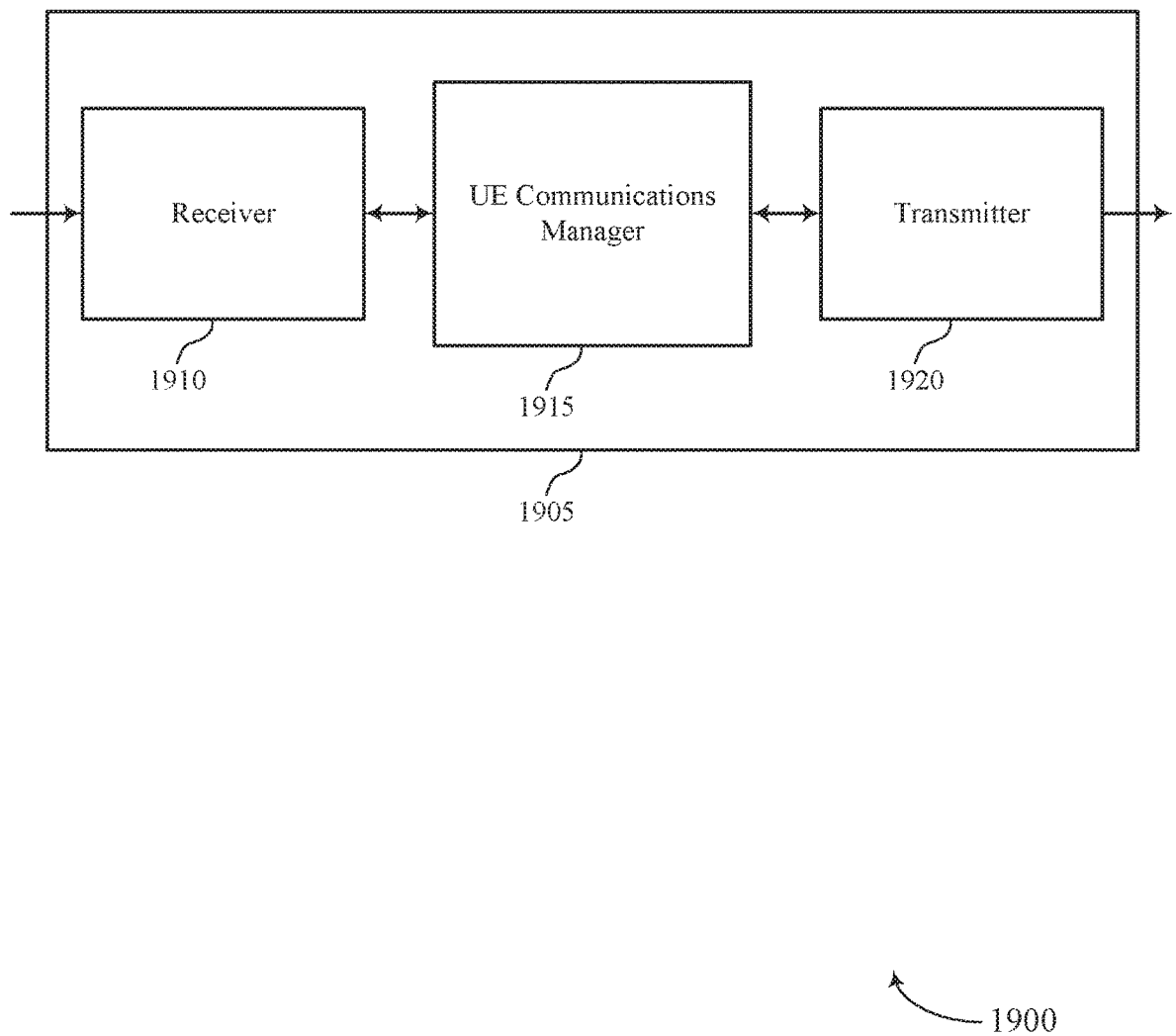
FIGS. 19 through 21 show block diagrams of a device that supports polar codes for uplink control information in accordance with aspects of the present disclosure.

FIG. 19 shows a block diagram 1900 of a wireless device 1905 that supports polar codes for uplink control information in accordance with aspects of the present disclosure. Wireless device 1905 may be an example of aspects of a UE 115 as described herein. Wireless device 1905 may include receiver 1910, UE communications manager 1915, and transmitter 1920. Wireless device 1905 may also include a processor. Each of these components may be in communication with one another (e.g., via one or more buses).

Receiver 1910 may receive one or more signals including one or more polar-encoded codewords. The receiver 1910 may be an example of aspects of the transceiver 2235 described with reference to FIG. 22. The receiver 1910 may utilize a single antenna or a set of antennas.

UE communications manager 1915 may be an example of aspects of the UE communications manager 2215 described with reference to FIG. 22.

UE communications manager 1915 and/or at least some of its various sub-components may be implemented in hardware, software executed by a processor, firmware, or any combination thereof. If implemented in software executed by a processor, the functions of the UE, communications manager 1915 and/or at least some of its various sub-components may be executed by a general-purpose processor, a DSP, an ASIC, an FPGA or other programmable logic device, discrete gate or transistor logic, discrete hardware components, or any combination thereof designed to perform the functions described in the present disclosure. The UE communications manager 1915 and/or at least some of its various sub-components may be physically located at various positions, including being distributed such that portions of functions are implemented at different physical locations by one or more physical devices. In some examples, UE communications manager 1915 and/or at least some of its various subcomponents may be a separate and distinct component in accordance with various aspects of the present disclosure. In other examples, UE communications manager 1915 and/or at least some of its various sub-components may be combined with one or more other hardware components, including but not limited to an I/O component, a transceiver, a network server, another computing device, one or more other components described in the present disclosure, or a combination thereof in accordance with various aspects of the present disclosure.

UE communications manager 1915 may determine a first bit sequence corresponding to a first subset of control information based on decoding a first polar-encoded codeword, determine an EDC and a second bit sequence corresponding to a second subset of the control information based on decoding a second polar-encoded codeword, perform error detection on the first bit sequence and the second bit sequence based on the determined EDC, and output, based on the error detection, one of: a combination of the first bit sequence and the second bit sequence or a decoding error.

Transmitter 1920 may transmit signals generated by other components of the device. In some examples, the transmitter 1920 may be collocated with a receiver 1910 in a transceiver module. For example, the transmitter 1920 may be an example of aspects of the transceiver 2235 described with reference to FIG. 22, The transmitter 1920 may utilize a single antenna or a set of antennas.

Figure 20:
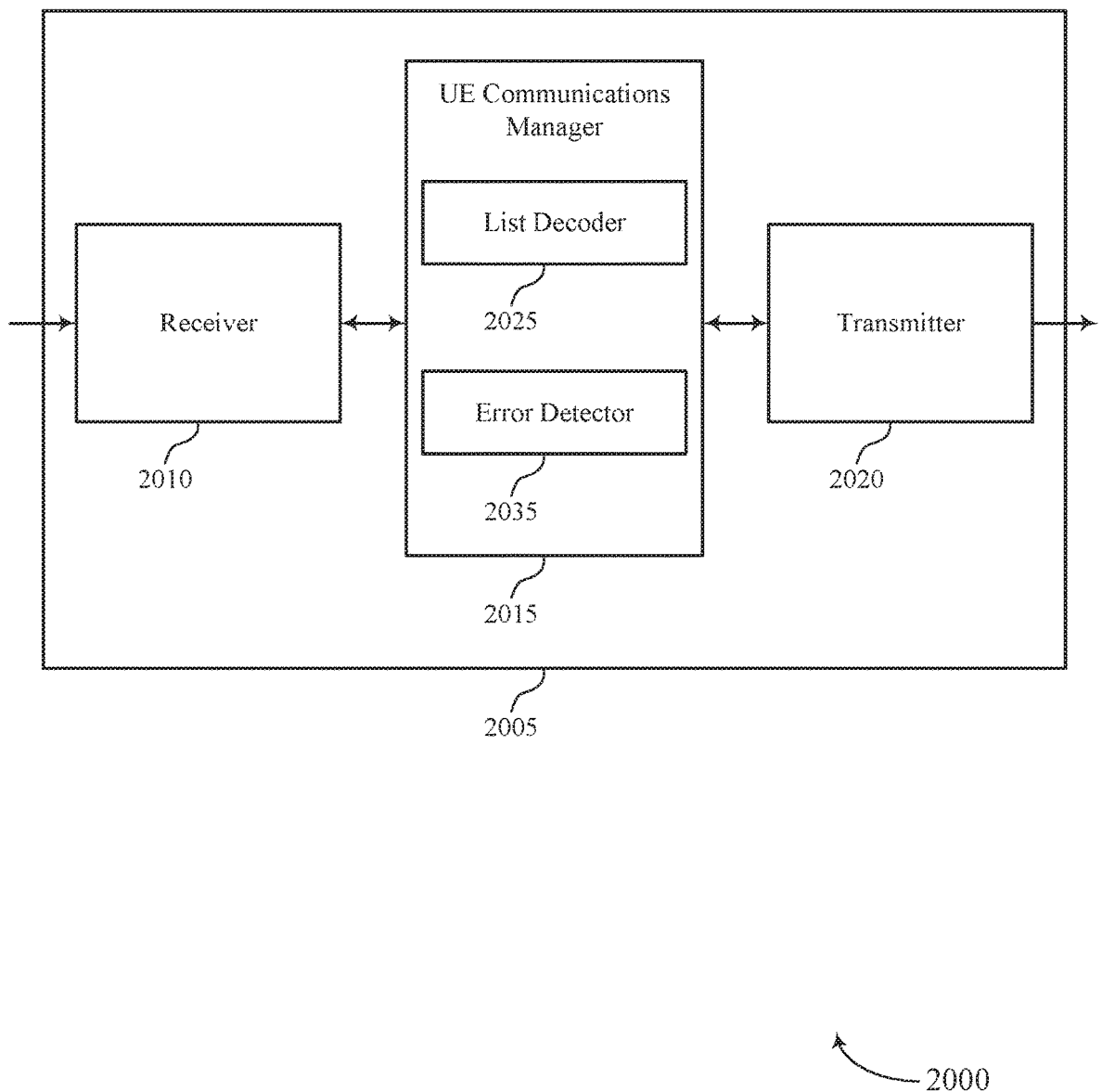

FIG. 20 shows a block diagram 2000 of a wireless device 2005 that supports polar codes for uplink control information in accordance with aspects of the present disclosure. Wireless device 2005 may be an example of aspects of a wireless device 1905 or a UE 115 as described with reference to FIG. 19. Wireless device 2005 may include receiver 2010, UE communications manager 2015, and transmitter 2020. Wireless device 2005 may also include a processor. Each of these components may be in communication with one another (e.g., via one or more buses)

Receiver 2010 may receive one or more signals including one or more polar-encoded codewords. The receiver 2010 may be an example of aspects of the transceiver 2235 described with reference to FIG. 22. The receiver 2010 may utilize a single antenna or a set of antennas.

UE communications manager 2015 may be an example of aspects of the UE communications manager 2215 described with reference to FIG. 22.

UE communications manager 2015 may also include list decoder 2025 and error detector 2030.

List decoder 2025 may determine a first bit sequence corresponding to a first subset of control information based on decoding a first polar-encoded codeword. List decoder 2025 may determine an EDC and a second bit sequence corresponding to a second subset of the control information based on decoding a second polar-encoded codeword.

Error detector 2030 may determine that the first bit sequence passes error detection based on the second EDC, perform error detection on the first bit sequence and the second bit sequence based on the determined EDC, output, based on the error detection, one of: a combination of the first bit sequence and the second bit sequence or a decoding error, and calculate an EDC based on the first bit sequence and the second bit sequence, where performing the error detection is based at least in a comparison of the calculated EDC and the determined EDC. In some cases, decoding the second polar-encoded codeword further includes: calculating an EDC based on the first bit sequence and the second bit sequence, where performing the error detection is based at least in a comparison of the calculated EDC and the determined EDC.

Transmitter 2020 may transmit signals generated by other components of the device. In some examples, the transmitter 2020 may be collocated with a receiver 2010 in a transceiver module. For example, the transmitter 2020 may be an example of aspects of the transceiver 2235 described with reference to FIG. 22. The transmitter 2020 may utilize a single antenna or a set of antennas.

Figure 21:
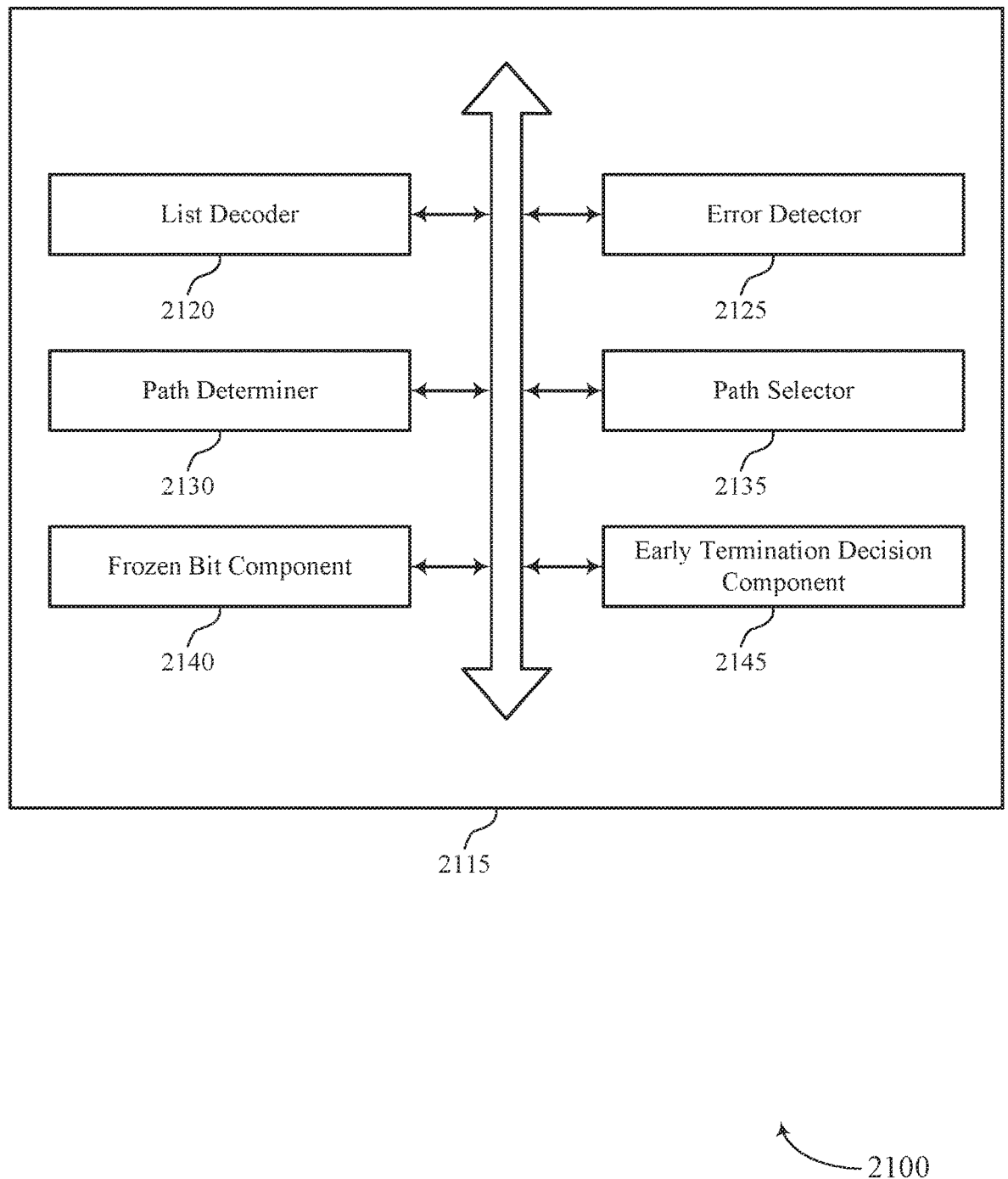

FIG. 21 shows a block diagram 2100 of a UE communications manager 2115 that supports polar codes for uplink control information in accordance with aspects of the present disclosure. The UE communications manager 2115 may be an example of aspects of a UE communications manager 2215 described with reference to FIGS. 19, 20, and 22. The UE communications manager 2115 may include list decoder 2120, error detector 2125, path determiner 2130, path selector 2135, frozen bit component 2140, and early termination decision component 2145. Each of these modules may communicate, directly or indirectly, with one another (e.g., via one or more buses).

List decoder 2120 may determine a first bit sequence corresponding to a first subset of control information based on decoding a first polar-encoded codeword, and may determine an EDC and a second bit sequence corresponding to a second subset of the control information based on decoding a second polar-encoded codeword.

Error detector 2125 may determine that the first bit sequence passes error detection based on the second EDC, perform error detection on the first bit sequence and the second bit sequence based on the determined EDC, output, based on the error detection, one of: a combination of the first bit sequence and the second bit sequence or a decoding error, and calculate an EDC based on the first bit sequence and the second bit sequence, where performing the error detection is based at least in a comparison of the calculated EDC and the determined EDC. In some cases, decoding the second polar-encoded codeword further includes: calculating an EDC based on the first bit sequence and the second bit sequence, where performing the error detection is based at least in a comparison of the calculated EDC and the determined EDC.

Path determiner 2130 may determine a second set of candidate paths through a second code tree based on the SCL decoding algorithm and generate a set of candidate paths through a code tree based on the SCL decoding algorithm. In some cases, decoding the first polar-encoded codeword further includes: determining a set of candidate paths through a code tree. In some cases, decoding the second polar-encoded codeword further includes: generating a second set of candidate paths through a second code tree based on a SCL decoding algorithm. In some cases, decoding the first polar-encoded codeword further includes: determining a set of candidate paths through a code tree. In some cases, decoding the first polar-encoded codeword further includes: determining a set of candidate paths through a code tree. In some cases, decoding the second polar-encoded codeword further includes: generating a second set of candidate paths through a second code tree based on a SCL decoding algorithm.

Path selector 2135 may select a candidate path of the set of candidate paths, obtain the second bit sequence and the determined EDC from the selected candidate path, select a second candidate path of the second set of candidate paths, obtain the first bit sequence, the second bit sequence, and the determined EDC from the second candidate path, obtain the second bit sequence and the determined EDC from the second candidate path, obtain the first bit sequence and a second EDC from the selected candidate path, and obtain the first bit sequence from the selected candidate path.

Frozen bit component 2140 may set the first bit sequence as frozen bits in a SCL decoding algorithm. In some cases, decoding the second polar-encoded codeword further includes: setting the first bit sequence as frozen bits in a SCL decoding algorithm.

Early termination decision component 2145 may make a decision on early termination of decoding of the second polar-encoded codeword based on the second EDC.

Figure 22:
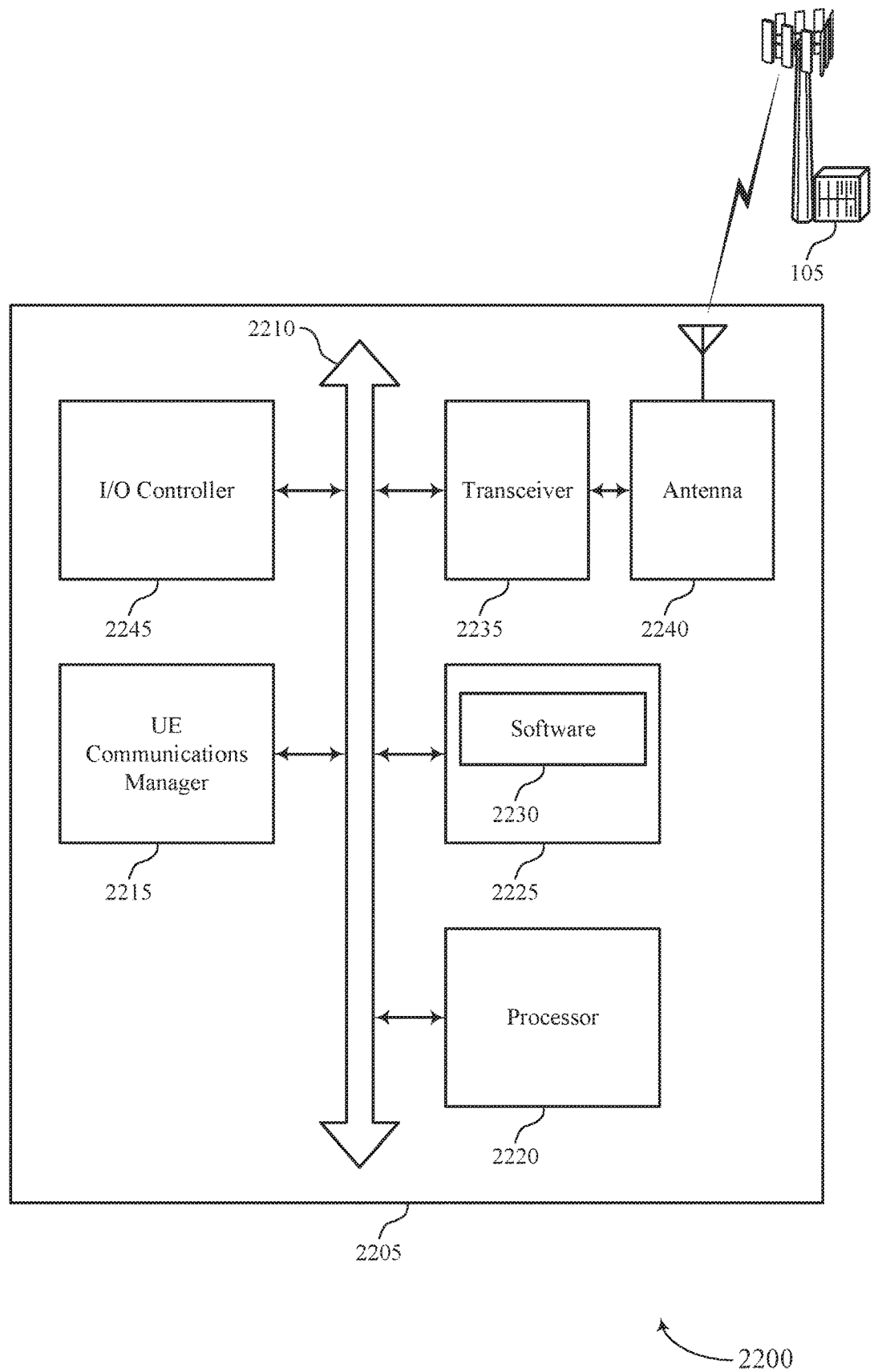
FIG. 22 illustrates a block diagram of a system including a UE that supports polar codes for uplink control information in accordance with aspects of the present disclosure.

FIG. 22 shows a diagram of a system 2200 including a device 2205 that supports polar codes for uplink control information in accordance with aspects of the present disclosure. Device 2205 may be an example of or include the components of UE 115 as described above, e.g., with reference to FIG. 1. Device 2205 may include components for bi-directional voice and data communications including components for transmitting and receiving communications, including UE communications manager 2215, processor 2220, memory 2225, software 2230, transceiver 2235, antenna 2240, and I/O controller 2245. These components may be in electronic communication via one or more buses (e.g., bus 2210). Device 2205 may communicate wirelessly with one or more base stations 105.

Processor 2220 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, processor 2220 may be configured to operate a memory array using a memory controller. In other cases, a memory controller may be integrated into processor 2220. Processor 2220 may be configured to execute computer-readable instructions stored in a memory to perform various functions (e.g., functions or tasks supporting polar codes for uplink control information).

Memory 2225 may include RAM and ROM, The memory 2225 may store computer-readable, computer-executable software 2230 including instructions that, when executed, cause the processor to perform various functions described herein. In some cases, the memory 2225 may contain, among other things, a BIOS which may control basic hardware or software operation such as the interaction with peripheral components or devices.

Software 2230 may include code to implement aspects of the present disclosure, including code to support polar codes for uplink control information. Software 2230 may be stored in a non-transitory computer-readable medium such as system memory or other memory. In some cases, the software 2230 may not be directly executable by the processor but may cause a computer (e.g., when compiled and executed) to perform functions described herein.

Transceiver 2235 may communicate bi-directionally, via one or more antennas, wired, or wireless links as described above. For example, the transceiver 2235 may represent a wireless transceiver and may communicate bi-directionally with another wireless transceiver. The transceiver 2235 may also include a modem to modulate the codewords and provide the modulated codewords to the antennas for transmission, and to demodulate codewords received from the antennas.

In some cases, the wireless device may include a single antenna 2240. However, in some cases the device may have more than one antenna 2240, which may be capable of concurrently transmitting or receiving multiple wireless transmissions.

I/O controller 2245 may manage input and output signals for device 2205. I/O controller 2245 may also manage peripherals not integrated into device 2205. In some cases, I/O controller 2245 may represent a physical connection or port to an external peripheral. In some cases, I/O controller 2245 may utilize an operating system such as iOS®, ANDROID®, MS-DOS®, MS-WINDOWS®, OS/2®, UNIX®, LINUX®, or another known operating system. In other cases, I/O controller 2245 may represent or interact with a modem, a keyboard, a mouse, a touchscreen, or a similar device. In some cases, I/O controller 2245 may be implemented as part of a processor. In some cases, a user may interact with device 2205 via I/O controller 2245 or via hardware components controlled by I/O controller 2245.

Figure 23:
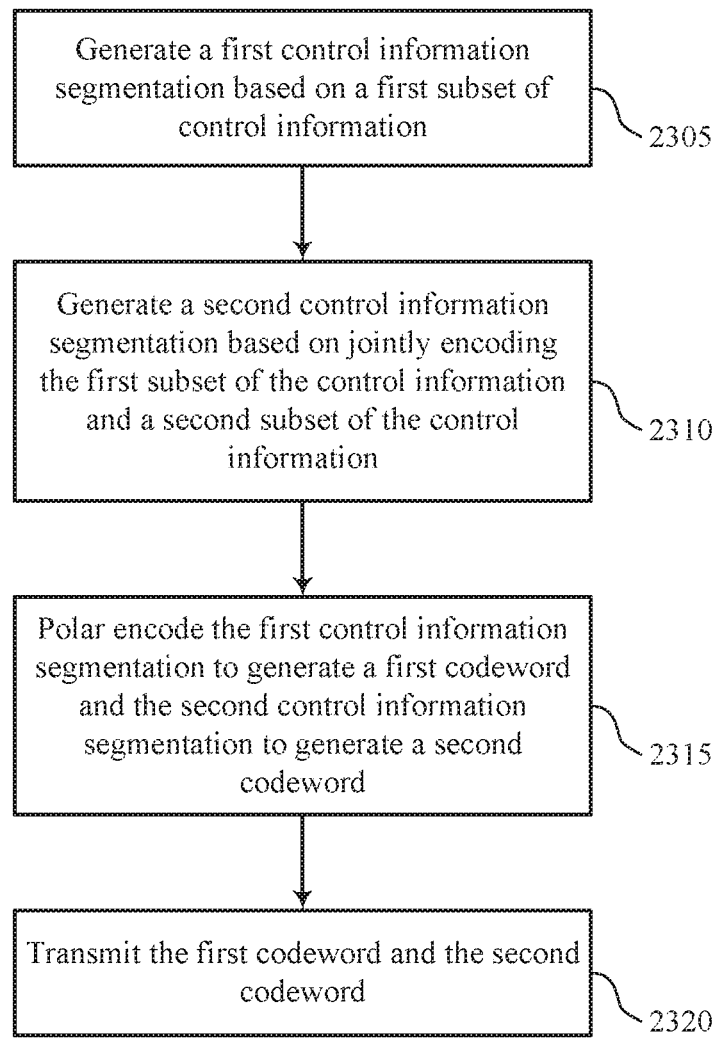
FIGS. 23 through 26 illustrate methods for polar codes for uplink control information in accordance with aspects of the present disclosure.

FIG. 23 shows a flowchart illustrating a method 2300 for polar codes for uplink control information in accordance with aspects of the present disclosure. The operations of method 2300 may be implemented by a base station 105 or its components as described herein. For example, the operations of method 2300 may be performed by a base station communications manager as described with reference to FIGS. 15 through 18. In some examples, a base station 105 may execute a set of codes to control the functional elements of the device to perform the functions described below. Additionally or alternatively, the base station 105 may perform aspects of the functions described below using special-purpose hardware.

At block 2305 the base station 105 may generate a first control information segmentation based at least in part on a first subset of control information. The operations of block 2305 may be performed according to the methods described herein. In certain examples, aspects of the operations of block 2305 may be performed by a segmentor as described with reference to FIGS. 15 through 18.

At block 2310 the base station 105 may generate a second control information segmentation based at least in part on jointly encoding the first subset of the control information and a second subset of the control information. The operations of block 2310 may be performed according to the methods described herein. In certain examples, aspects of the operations of block 2310 may be performed by a segmentor as described with reference to FIGS. 15 through 18.

At block 2315 the base station 105 may polar encode the first control information segmentation to generate a first codeword and the second control information segmentation to generate a second codeword. The operations of block 2315 may be performed according to the methods described herein. In certain examples, aspects of the operations of block 2315 may be performed by a polar encoder as described with reference to FIGS. 15 through 18.

At block 2320 the base station 105 may transmit the first codeword and the second codeword. The operations of block 2320 may be performed according to the methods described herein. In certain examples, aspects of the operations of block 2320 may be performed by a polar encoder as described with reference to FIGS. 15 through 18.

Figure 24:
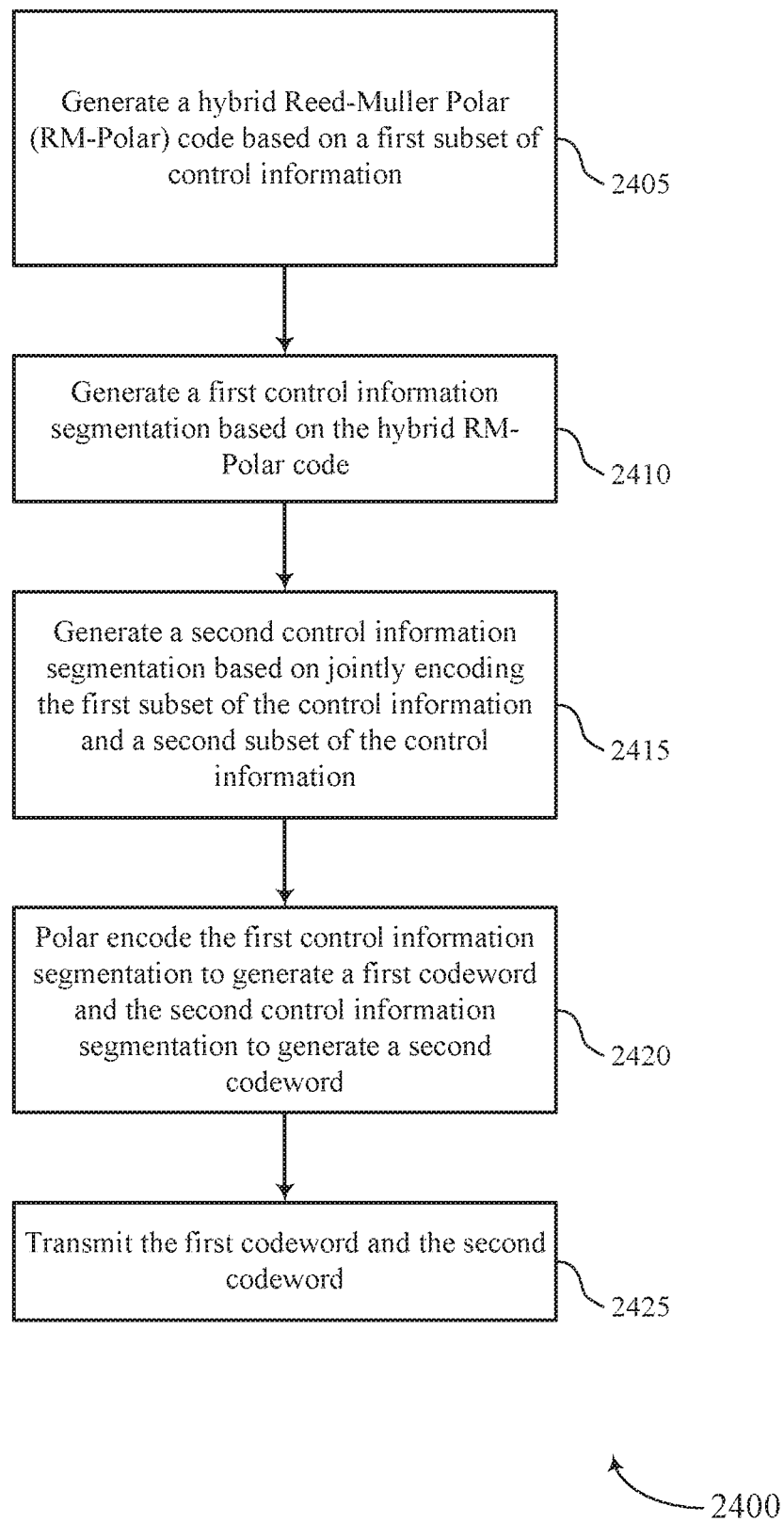

FIG. 24 shows a flowchart illustrating a method 2400 for polar codes for uplink control information in accordance with aspects of the present disclosure, The operations of method 2400 may be implemented by a base station 105 or its components as described herein. For example, the operations of method 2400 may be performed by a base station communications manager as described with reference to FIGS. 15 through 18. In some examples, a base station 105 may execute a set of codes to control the functional elements of the device to perform the functions described below. Additionally or alternatively, the base station 105 may perform aspects of the functions described below using special-purpose hardware.

At block 2405 the base station 105 may generate a hybrid Reed-Muller Polar (RM-Polar) code based at least in part on a first subset of control information, wherein the first control information segmentation comprises bits of the RM-Polar code. The operations of block 2405 may be performed according to the methods described herein. In certain examples, aspects of the operations of block 2405 may be performed by a RM polar encoder as described with reference to FIGS. 15 through 18.

At block 2410 the base station 105 may generate a first control information segmentation based at least in part on the hybrid Reed-Muller Polar code. The operations of block 2410 may be performed according to the methods described herein. In certain examples, aspects of the operations of block 2410 may be performed by a segmentor as described with reference to FIGS. 15 through 18.

At block 2415 the base station 105 may generate a second control information segmentation based at least in part on jointly encoding the first subset of the control information and a second subset of the control information. The operations of block 2415 may be performed according to the methods described herein. In certain examples, aspects of the operations of block 2415 may be performed by a segmentor as described with reference to FIGS. 15 through 18.

At block 2420 the base station 105 may polar encode the first control information segmentation to generate a first codeword and the second control information segmentation to generate a second codeword. The operations of block 2420 may be performed according to the methods described herein. In certain examples, aspects of the operations of block 2420 may be performed by a polar encoder as described with reference to FIGS. 15 through 18.

At block 2425 the base station 105 may transmit the first codeword and the second codeword. The operations of block 2425 may be performed according to the methods described herein. In certain examples, aspects of the operations of block 2425 may be performed by a polar encoder as described with reference to FIGS. 15 through 18.

Figure 25:
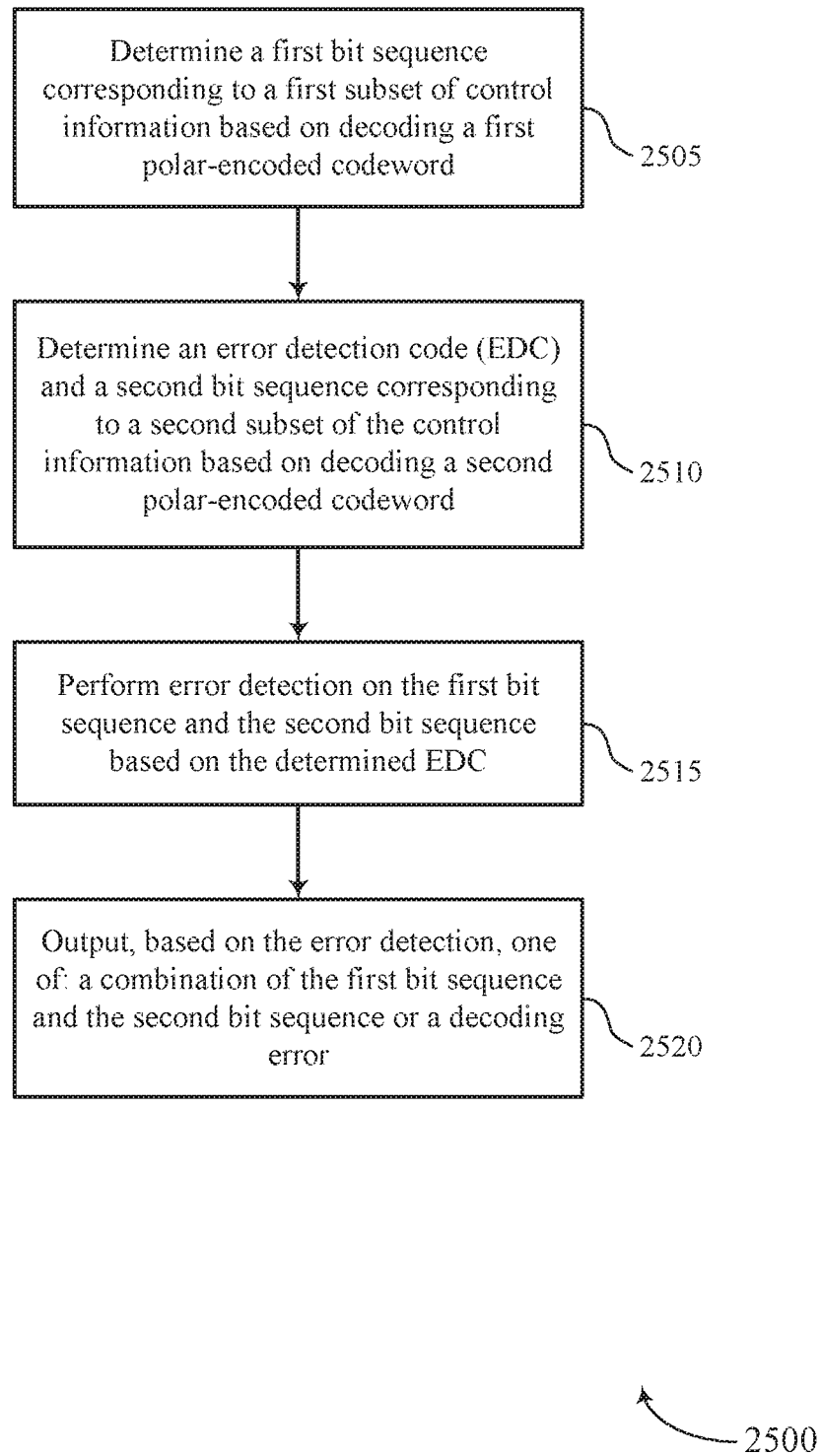

FIG. 25 shows a flowchart illustrating a method 2500 for polar codes for uplink control information in accordance with aspects of the present disclosure. The operations of method 2500 may be implemented by a UE 115 or its components as described herein, For example, the operations of method 2500 may be performed by a UE communications manager as described with reference to FIGS. 19 through 22. In some examples, a UE 115 may execute a set of codes to control the functional elements of the device to perform the functions described below. Additionally or alternatively, the UE 115 may perform aspects of the functions described below using special-purpose hardware.

At block 2505 the UE 115 may determine a first bit sequence corresponding to a first subset of control information based at least in part on decoding a first polar-encoded codeword. The operations of block 2505 may be performed according to the methods described herein. In certain examples, aspects of the operations of block 2505 may be performed by a list decoder as described with reference to FIGS. 19 through 22.

At block 2510 the UE 115 may determine an error detection code (EDC) and a second bit sequence corresponding to a second subset of the control information based at least in part on decoding a second polar-encoded codeword. The operations of block 2510 may be performed according to the methods described herein. In certain examples, aspects of the operations of block 2510 may be performed by a list decoder as described with reference to FIGS. 19 through 22.

At block 2515 the UE 115 may perform error detection on the first bit sequence and the second bit sequence based at least in part on the determined EDC. The operations of block 2515 may be performed according to the methods described herein. In certain examples, aspects of the operations of block 2515 may be performed by an error detector as described with reference to FIGS. 19 through 22.

At block 2520 the UE 115 may output, based at least in part on the error detection, one of: a combination of the first bit sequence and the second bit sequence or a decoding error. The operations of block 2520 may be performed according to the methods described herein. In certain examples, aspects of the operations of block 2520 may be performed by an error detector as described with reference to FIGS. 19 through 22.

Figure 26:
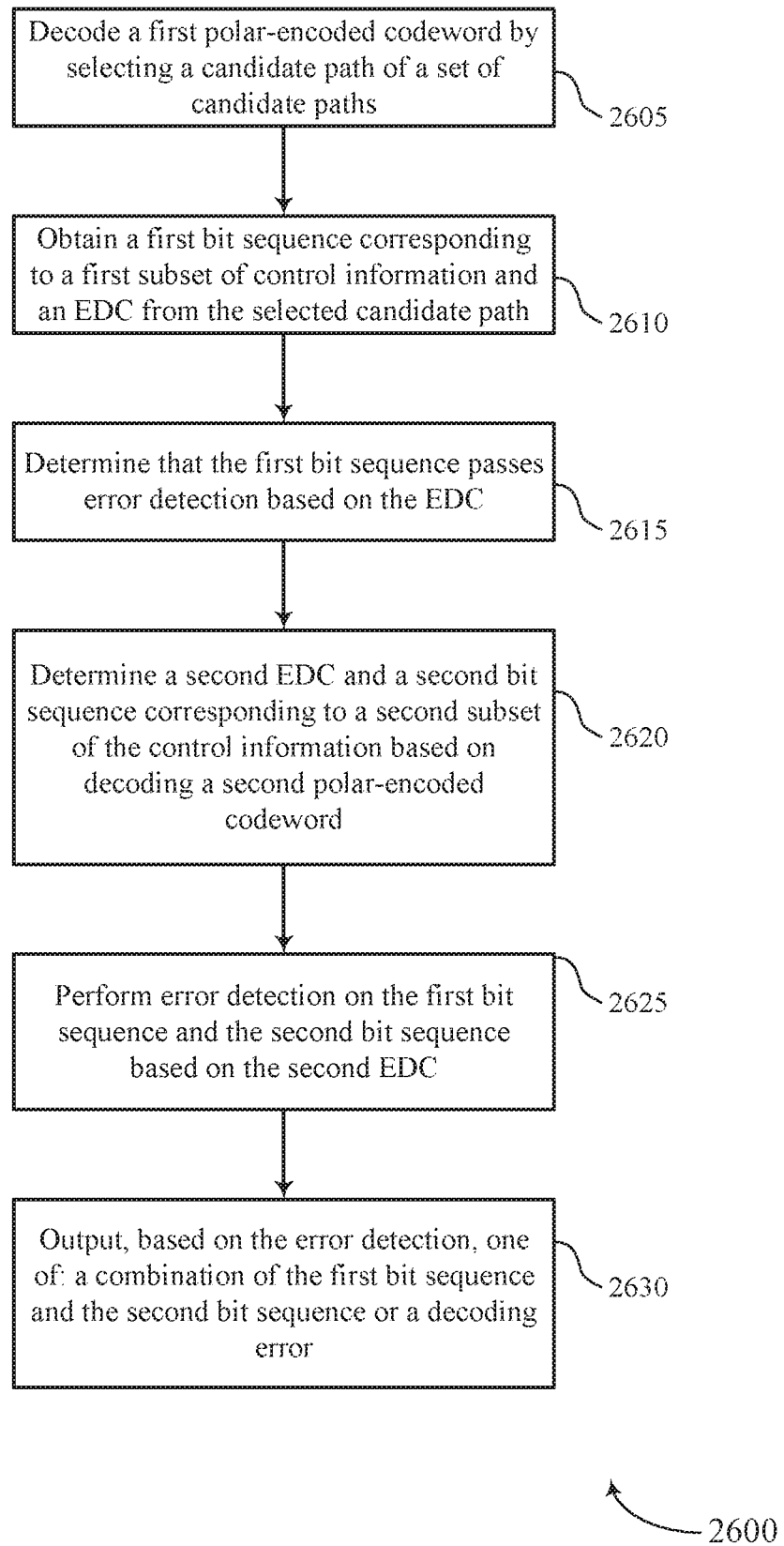

FIG. 26 shows a flowchart illustrating a method 2600 for polar codes for uplink control information in accordance with aspects of the present disclosure, The operations of method 2600 may be implemented by a UE 115 or its components as described herein. For example, the operations of method 2600 may be performed by a UE communications manager as described with reference to FIGS. 19 through 22. In some examples, a UE 115 may execute a set of codes to control the functional elements of the device to perform the functions described below. Additionally or alternatively, the UE 115 may perform aspects of the functions described below using special-purpose hardware.

At block 2605 the UE 115 may decode a first polar-encoded codeword by selecting a candidate path of a plurality of candidate paths. The operations of block 2610 may be performed according to the methods described herein. In certain examples, aspects of the operations of block 2610 may be performed by a path selector as described with reference to FIGS. 19 through 22.

At block 2610 the UE 115 may obtain a first bit sequence corresponding to a first subset of control information and an EDC from the selected candidate path. The operations of block 2615 may be performed according to the methods described herein. In certain examples, aspects of the operations of block 2615 may be performed by a path selector as described with reference to FIGS. 19 through 22.

At block 2615 the UE 115 may determine that the first bit sequence passes error detection based at least in part on the EDC. The operations of block 2620 may be performed according to the methods described herein. In certain examples, aspects of the operations of block 2620 may be performed by an error detector as described with reference to FIGS. 19 through 22.

At block 2620 the UE 115 may determine a second EDC and a second bit sequence corresponding to a second subset of the control information based at least in part on decoding a second polar-encoded codeword. The operations of block 2625 may be performed according to the methods described herein. In certain examples, aspects of the operations of block 2625 may be performed by a list decoder as described with reference to FIGS. 19 through 22.

At block 2625 the UE 115 may perform error detection on the first bit sequence and the second bit sequence based at least in part on the second EDC. The operations of block 2630 may be performed according to the methods described herein. In certain examples, aspects of the operations of block 2630 may be performed by an error detector as described with reference to FIGS. 19 through 22.

At block 2630 the UE 115 may output, based at least in part on the error detection, one of: a combination of the first bit sequence and the second bit sequence or a decoding error. The operations of block 2635 may be performed according to the methods described herein. In certain examples, aspects of the operations of block 2635 may be performed by an error detector as described with reference to FIGS. 19 through 22.

It should be noted that the methods described above describe possible implementations, and that the operations and the steps may be rearranged or otherwise modified and that other implementations are possible. Furthermore, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. The terms "system" and "network" are often used interchangeably. A code division multiple access (CDMA) system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE and LTE-A are releases of UMTS that use E-UTRA. UTRA, E-UTRA, UMTS, LTE, LTE-A, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned above as well as other systems and radio technologies. While aspects of an LTE or an NR system may be described for purposes of example, and LTE or NR terminology may be used in much of the description, the techniques described herein are applicable beyond LTE or NR applications.

In LTE/LTE-A networks, including such networks described herein, the term evolved node B (eNB) may be generally used to describe the base stations. The wireless communications system or systems described herein may include a heterogeneous LTE/LTE-A or NR network in which different types of eNBs provide coverage for various geographical regions. For example, each eNB, next generation NodeB (gNB), or base station may provide communication coverage for a macro cell, a small cell, or other types of cell, The term "cell" may be used to describe a base station, a carrier or component carrier associated with a base station, or a coverage area (e.g., sector, etc.) of a carrier or base station, depending on context.

Base stations may include or may be referred to by those skilled in the art as a base transceiver station, a radio base station, an access point, a radio transceiver, a NodeB, eNodeB (eNB), gNB, Home NodeB, a Home eNodeB, or some other suitable terminology. The geographic coverage area for a base station may be divided into sectors making up only a portion of the coverage area. The wireless communications system or systems described herein may include base stations of different types (e.g., macro or small cell base stations). The UEs described herein may be able to communicate with various types of base stations and network equipment including macro eNBs, small cell eNBs, gNBs, relay base stations, and the like. There may be overlapping geographic coverage areas for different technologies.

A macro cell generally covers a relatively large geographic area (e.g., several kilometers in radius) and may allow unrestricted access by UEs with service subscriptions with the network provider. A small cell is a lower-powered base station, as compared with a macro cell, that may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB, eNB may support one or multiple (e.g., two, three, four, and the like) cells (e.g., component carriers).

The wireless communications system or systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

The downlink transmissions described herein may also be called forward link transmissions while the uplink transmissions may also be called reverse link transmissions. Each communication link described herein—including, for example, wireless communications system 100 and 200 of FIGS. 1 and 2—may include one or more carriers, where each carrier may be a signal made up of multiple sub-carriers (e.g., waveform signals of different frequencies).

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may he practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands. information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions, For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:

generating a first uplink control information segmentation based at least in part on a first subset of uplink control information comprising high priority data, wherein the first uplink control information segmentation comprises a first error detection code that applies to the first subset of the uplink control information;

generating a second uplink control information segmentation based at least in part on jointly encoding the first subset of the uplink control information comprising the high priority data and a second subset of the uplink control information comprising low priority data, wherein the second uplink control information segmentation indicates the first subset of the uplink control information and the second subset of the uplink control information, wherein the second uplink control information segmentation comprises a second error detection code that applies to both the first subset of the uplink control information and the second subset of the uplink control information, wherein the second error detection code is based at least in part on jointly encoding the first subset and the second subset, and wherein a quantity of bits in the first error detection code for the first uplink control information segmentation is fewer than a quantity of bits in the second error detection code for the second uplink control information segmentation;

polar encoding the first uplink control information segmentation to generate a first codeword;

polar encoding the second uplink control information segmentation by loading first bits of the low priority data into first sub-channels of a polar code and second bits of the high priority data into second sub-channels of the polar code to generate a second codeword, the first sub-channels associated with higher reliability than the second sub-channels; and transmitting a signal that includes the first codeword associated with the first subset of the uplink control information and the second codeword associated with both the first subset of the uplink control information and the second subset of the uplink control information.

2. The method of claim 1, further comprising:

allocating the uplink control information into the first subset and the second subset based at least in part on priority, wherein the first subset comprises the high priority data and the second subset comprises the low priority data, and wherein the second uplink control information segmentation indicates both the high priority data and the low priority data.

3. The method of claim 1, wherein jointly encoding the first subset of the uplink control information and the second subset of the uplink control information comprises:
determining the second error detection code based at least in part on the first subset of the uplink control information and the second subset of the uplink control information.

4. The method of claim 3, wherein polar encoding the second uplink control information segmentation to generate the second codeword further comprises:
loading a plurality of frozen bits into third sub-channels of the polar code and bits of the second error detection code into fourth sub-channels of the polar code, the third sub-channels associated with a lower reliability than the second sub-channels, and the fourth sub-channels associated with a higher reliability than the first sub-channels.

5. The method of claim 3, wherein:
the second uplink control information segmentation comprises bits of the second error detection code, bits of the first subset of the uplink control information, and bits of the second subset of the uplink control information.

6. The method of claim 3, wherein:
the second uplink control information segmentation comprises bits of the second error detection code and bits of the second subset of the uplink control information.

7. The method of claim 3, wherein the second error detection code comprises cyclic redundancy check (CRC) bits.

8. The method of claim 1, wherein generating the first uplink control information segmentation further comprises:
determining the first error detection code based at least in part on the first subset of the uplink control information.

9. The method of claim 8, wherein polar encoding the first uplink control information segmentation to generate the first codeword comprises:
loading a plurality of frozen bits, bits of the first error detection code, and bits of the first subset of the uplink control information into respective sub-channels of a second polar code based at least in part on a reliability order of the sub-channels of the second polar code.

10. The method of claim 8, wherein:
the first uplink control information segmentation comprises bits of the first error detection code and bits of the first subset of the uplink control information.

11. The method of claim 1, further comprising:
generating a hybrid Reed-Muller Polar (RM-Polar) code based at least in part on the first subset of the uplink control information, wherein the first uplink control information segmentation comprises bits of the RM-Polar code.

12. The method of claim 11, wherein polar encoding the first uplink control information segmentation to generate the first codeword comprises:
loading a plurality of frozen bits and the bits of the RM-Polar code into respective sub-channels of a second polar code based at least in part on a reliability order of the sub-channels of the second polar code.

13. The method of claim 11, wherein generating the RM-Polar code comprises:
obtaining a generator matrix based at least in part on a coded block size;
determining a hamming distance such that a number of rows of the generator matrix with a weight exceeding the hamming distance at least is the same as a number of bits of the first subset of the uplink control information;
selecting a subset of the rows of the generator matrix based at least in part on a reliability of each sub-channel of a plurality of sub-channels of a second polar code; and
mapping the first subset of the uplink control information to the selected subset of the rows.

14. The method of claim 1, further comprising:
determining the second error detection code based at least in part on the first subset of the uplink control information and the second subset of the uplink control information; and
determining the first error detection code based at least in part on the first subset of the uplink control information.

15. The method of claim 1, wherein:
the first subset of the uplink control information includes one or more of acknowledgement data, rank index data, precode matrix index data, or any combination thereof.

16. The method of claim 1, wherein:
the second subset of the uplink control information includes channel quality indicator data.

17. A method for wireless communication, comprising:
determining a first error detection code and a first bit sequence corresponding to a first subset of uplink control information comprising high priority data based at least in part on decoding a first polar-encoded codeword, the first polar-encoded codeword indicating the first subset of the uplink control information, wherein the first bit sequence comprises the first error detection code that applies to the first subset of the uplink control information;
determining a second error detection code and a second bit sequence corresponding to a second subset of the uplink control information comprising low priority data based at least in part on decoding a second polar-encoded codeword, the second polar-encoded codeword indicating the low priority data of the second subset of the uplink control information based at least in part on first sub-channels of a polar code and indicating the high priority data of the first subset of the uplink control information based at least in part on second sub-channels of the polar code, the first sub-channels associated with a higher reliability than the second sub-channels, wherein the second bit sequence comprises the second error detection code that applies to both the first subset of the uplink control information and the second subset of the uplink control information, wherein the second error detection code is based at least in part on a joint encoding of the first subset and the second subset, and wherein a quantity of bits in the first error detection code is fewer than a quantity of bits in the second error detection code;
performing error detection on the first bit sequence and the second bit sequence based at least in part on the determined second error detection code; and
outputting, based at least in part on the error detection, one of: a combination of the first bit sequence and the second bit sequence or a decoding error.

18. The method of claim 17, wherein decoding the first polar-encoded codeword further comprises:
determining a plurality of candidate paths through a code tree;
selecting a candidate path of the plurality of candidate paths;

obtaining the first bit sequence and the first error detection code from the selected candidate path; and determining that the first bit sequence passes error detection based at least in part on the first error detection code.

19. The method of claim 18, wherein decoding the second polar-encoded codeword further comprises:
setting the first bit sequence as frozen bits in a successive cancellation list (SCL) decoding algorithm;
determining a second plurality of candidate paths through a second code tree based at least in part on the SCL decoding algorithm;
selecting a second candidate path of the second plurality of candidate paths; and
obtaining the first bit sequence, the second bit sequence, and the determined second error detection code from the second candidate path.

20. The method of claim 19, wherein decoding the second polar-encoded codeword further comprises:
calculating an error detection code based at least in part on the first bit sequence and the second bit sequence, wherein performing the error detection is based at least in part on a comparison of the calculated error detection code and the determined second error detection code.

21. The method of claim 18, wherein decoding the second polar-encoded codeword further comprises:
generating a second plurality of candidate paths through a second code tree based at least in part on a successive cancellation list (SCL) decoding algorithm;
selecting a second candidate path of the second plurality of candidate paths;
obtaining the second bit sequence and the determined second error detection code from the second candidate path; and
calculating an error detection code based at least in part on the first bit sequence and the second bit sequence, wherein performing the error detection is based at least in part on a comparison of the calculated error detection code and the determined second error detection code.

22. The method of claim 17, wherein decoding the first polar-encoded codeword further comprises:
determining a plurality of candidate paths through a code tree;
selecting a candidate path of the plurality of candidate paths;
obtaining the first bit sequence and the first error detection code from the selected candidate path; and
making a decision on early termination of decoding of the second polar-encoded codeword based at least in part on the first error detection code.

23. The method of claim 17, wherein decoding the second polar-encoded codeword further comprises:
setting the first bit sequence as frozen bits in a successive cancellation list (SCL) decoding algorithm;
generating a plurality of candidate paths through a code tree based at least in part on the SCL decoding algorithm;
selecting a candidate path of the plurality of candidate paths;
obtaining the second bit sequence and the determined second error detection code from the selected candidate path; and
calculating an error detection code based at least in part on the first bit sequence and the second bit sequence, wherein performing the error detection is based at least in part on a comparison of the calculated error detection code and the determined second error detection code.

24. The method of claim 17, wherein decoding the first polar-encoded codeword further comprises:
determining a plurality of candidate paths through a code tree;
selecting a candidate path of the plurality of candidate paths; and
obtaining the first bit sequence from the selected candidate path.

25. The method of claim 24, wherein decoding the second polar-encoded codeword further comprises:
generating a second plurality of candidate paths through a second code tree based at least in part on a successive cancellation list (SCL) decoding algorithm;
selecting a second candidate path of the second plurality of candidate paths;
obtaining the second bit sequence and the determined second error detection code from the selected second candidate path; and
calculating an error detection code based at least in part on the first bit sequence and the second bit sequence, wherein performing the error detection is based at least in part on a comparison of the calculated error detection code and the determined second error detection code.

26. The method of claim 17, wherein the second error detection code comprises cyclic redundancy check (CRC) bits.

27. The method of claim 17, wherein the first error detection code comprises 8 bits and the second error detection code comprises 11 bits.

28. An apparatus for wireless communication, comprising:
a processor;
memory in electronic communication with the processor; and
instructions stored in the memory, wherein the instructions are executable by the processor to:
generate a first uplink control information segmentation based at least in part on a first subset of uplink control information comprising high priority data, wherein the first uplink control information segmentation comprises a first error detection code that applies to the first subset of the uplink control information;
generate a second uplink control information segmentation based at least in part on jointly encoding the first subset of the uplink control information comprising the high priority data and a second subset of the uplink control information comprising low priority data, wherein the second uplink control information segmentation indicates the first subset of the uplink control information and the second subset of the uplink control information, wherein the second uplink control information segmentation comprises a second error detection code that applies to both the first subset of the uplink control information and the second subset of the uplink control information, wherein the second error detection code is based at least in part on jointly encoding the first subset and the second subset, and wherein a quantity of bits in the first error detection code for the first uplink control information segmentation is fewer than a quantity of bits in the second error detection code for the second uplink control information segmentation;
polar encode the first uplink control information segmentation to generate a first codeword;
polar encode the second uplink control information segmentation by loading first bits of the low priority data into first sub-channels of a polar code and second bits of the high priority data into second sub-channels of the polar code to generate a second codeword, the first sub-channels associated with higher reliability than the second sub-channels; and
transmit a signal that includes the first codeword associated with the first subset of the uplink control information and the second codeword associated with both the first subset of the uplink control information and the second subset of the uplink control information.

29. The apparatus of claim 28, wherein the instructions are further executable by the processor to:
allocate the uplink control information into the first subset and the second subset based at least in part on priority, wherein the first subset comprises the high priority data and the second subset comprises the low priority data, and wherein the second uplink control information segmentation indicates both the high priority data and the low priority data.

30. The apparatus of claim 28, wherein the instructions executable by the processor to jointly encode the first subset of the uplink control information and the second subset of the uplink control information comprise instructions executable by the processor to:
determine the second error detection code based at least in part on the first subset of the uplink control information and the second subset of the uplink control information.

31. The apparatus of claim 30, wherein the instructions executable by the processor to polar encode the second uplink control information segmentation to generate the second codeword comprise instructions executable by the processor to:
load a plurality of frozen bits into third sub-channels of the polar code and bits of the second error detection code into fourth sub-channels of the polar code, the third sub-channels associated with a lower reliability than the second sub-channels, and the fourth sub-channels associated with a higher reliability than the first sub-channels.

32. The apparatus of claim 30, wherein:
the second uplink control information segmentation comprises bits of the second error detection code and bits of the second subset of the uplink control information.

33. The apparatus of claim 28, wherein:
the second uplink control information segmentation comprises bits of the second error detection code, bits of the first subset of the uplink control information, and bits of the second subset of the uplink control information.

34. The apparatus of claim 28, wherein the instructions executable by the processor to generate the first uplink control information segmentation comprise instructions executable by the processor to:
determine the first error detection code based at least in part on the first subset of the uplink control information.

35. The apparatus of claim 34, wherein the instructions executable by the processor to polar encode the first uplink control information segmentation to generate the first codeword comprise instructions executable by the processor to:
load a plurality of frozen bits, bits of the first error detection code, and bits of the first subset of the uplink control information into respective sub-channels of a second polar code based at least in part on a reliability order of the sub-channels of the second polar code.

36. The apparatus of claim 34, wherein:
the first uplink control information segmentation comprises bits of the first error detection code and bits of the first subset of the uplink control information.

37. The apparatus of claim 28, wherein the instructions are further executable by the processor to:
generate a hybrid Reed-Muller Polar (RM-Polar) code based at least in part on the first subset of the uplink control information, wherein the first uplink control information segmentation comprises bits of the RM-Polar code.

38. The apparatus of claim 37, wherein the instructions executable by the processor to polar encode the first uplink control information segmentation to generate the first codeword comprise instructions executable by the processor to:
load a plurality of frozen bits and the bits of the RM-Polar code into respective sub-channels of a second polar code based at least in part on a reliability order of the sub-channels of the second polar code.

39. The apparatus of claim 37, wherein the instructions executable by the processor to generate the RM-Polar code comprise instructions executable by the processor to:
obtain a generator matrix based at least in part on a coded block size;
determine a hamming distance such that a number of rows of the generator matrix with a weight exceeding the hamming distance at least is the same as a number of bits of the first subset of the uplink control information;
select a subset of the rows of the generator matrix based at least in part on a reliability of each sub-channel of a plurality of sub-channels of a second polar code; and
map the first subset of the uplink control information to the selected subset of the rows.

40. The apparatus of claim 28, wherein the instructions are further executable by the processor to:
determine the second error detection code based at least in part on the first subset of the uplink control information and the second subset of the uplink control information; and
determine the first error detection code based at least in part on the first subset of the uplink control information.

41. The apparatus of claim 28, wherein:
the first subset of the uplink control information includes one or more of acknowledgement data, rank index data, precode matrix index data, or any combination thereof.

42. The apparatus of claim 28, wherein:
the second subset of the uplink control information includes channel quality indicator data.

43. An apparatus for wireless communication, comprising:
a processor;
memory in electronic communication with the processor; and
instructions stored in the memory, wherein the instructions are executable by the processor to:
determine a first error detection code and a first bit sequence corresponding to a first subset of uplink control information comprising high priority data based at least in part on decoding a first polar-encoded codeword, the first polar-encoded codeword indicating the first subset of the uplink control information, wherein the first bit sequence comprises the first error detection code that applies to the first subset of the uplink control information;
determine a second error detection code and a second bit sequence corresponding to a second subset of the uplink control information comprising low priority data based at least in part on decoding a second polar-encoded codeword, the second polar-encoded codeword indicating the low priority data of the second subset of the uplink control information based at least in part on first sub-channels of a polar code and indicating the high priority data of the first subset of the uplink control information based at least in part on second sub-channels of the polar code, the first sub-channels associated with a higher reliability than the second sub-channels, wherein the second bit sequence comprises the second error detection code that applies to both the first subset of the uplink control information and the second subset of the uplink control information, wherein the second error detection code is based at least in part on a joint encoding of the first subset and the second subset, and wherein a quantity of bits in the first error detection code is fewer than a quantity of bits in the second error detection code;

perform error detection on the first bit sequence and the second bit sequence based at least in part on the determined second error detection code; and output, based at least in part on the error detection, one of: a combination of the first bit sequence and the second bit sequence or a decoding error.

44. The apparatus of claim 43, wherein the instructions executable by the processor to decode the first polar-encoded codeword comprise instructions executable by the processor to:

determine a plurality of candidate paths through a code tree;

select a candidate path of the plurality of candidate paths;

obtain the first bit sequence and the first error detection code from the selected candidate path; and determine that the first bit sequence passes error detection based at least in part on the first error detection code.

45. The apparatus of claim 44, wherein the instructions executable by the processor to decode the second polar-encoded codeword comprise instructions executable by the processor to:

set the first bit sequence as frozen bits in a successive cancellation list (SCL) decoding algorithm;

determine a second plurality of candidate paths through a second code tree based at least in part on the SCL decoding algorithm;

select a second candidate path of the second plurality of candidate paths; and obtain the first bit sequence, the second bit sequence, and the determined second error detection code from the second candidate path.

46. The apparatus of claim 45, wherein the instructions executable by the processor to decode the second polar-encoded codeword comprise instructions executable by the processor to:

calculate an error detection code based at least in part on the first bit sequence and the second bit sequence, wherein performing the error detection is based at least in part on a comparison of the calculated error detection code and the determined second error detection code.

47. The apparatus of claim 44, wherein the instructions executable by the processor to decode the second polar-encoded codeword comprise instructions executable by the processor to:

generate a second plurality of candidate paths through a second code tree based at least in part on a successive cancellation list (SCL) decoding algorithm;

select a second candidate path of the second plurality of candidate paths;

obtain the second bit sequence and the determined second error detection code from the second candidate path; and calculate an error detection code based at least in part on the first bit sequence and the second bit sequence, wherein performing the error detection is based at least in part on a comparison of the calculated error detection code and the determined second error detection code.

48. The apparatus of claim 43, wherein the instructions executable by the processor to decode the first polar-encoded codeword comprise instructions executable by the processor to:

determine a plurality of candidate paths through a code tree;

select a candidate path of the plurality of candidate paths;

obtain the first bit sequence and the first error detection code from the selected candidate path; and make a decision on early termination of decoding of the second polar-encoded codeword based at least in part on the first error detection code.

49. The apparatus of claim 43, wherein the instructions executable by the processor to decode the second polar-encoded codeword comprise instructions executable by the processor to:

set the first bit sequence as frozen bits in a successive cancellation list (SCL) decoding algorithm;

generate a plurality of candidate paths through a code tree based at least in part on the SCL decoding algorithm;

select a candidate path of the plurality of candidate paths;

obtain the second bit sequence and the determined second error detection code from the selected candidate path; and calculate an error detection code based at least in part on the first bit sequence and the second bit sequence, wherein performing the error detection is based at least in part on a comparison of the calculated error detection code and the determined second error detection code.

50. The apparatus of claim 43, wherein the instructions executable by the processor to decode the first polar-encoded codeword comprise instructions executable by the processor to:

determine a plurality of candidate paths through a code tree;

select a candidate path of the plurality of candidate paths; and obtain the first bit sequence from the selected candidate path.

51. The apparatus of claim 50, wherein the instructions executable by the processor to decode the second polar-encoded codeword comprise instructions executable by the processor to:

generate a second plurality of candidate paths through a second code tree based at least in part on a successive cancellation list (SCL) decoding algorithm;

select a second candidate path of the second plurality of candidate paths;

obtain the second bit sequence and the determined second error detection code from the selected second candidate path; and calculate an error detection code based at least in part on the first bit sequence and the second bit sequence, wherein performing the error detection is based at least in part on a comparison of the calculated error detection code and the determined second error detection code.

52. An apparatus for wireless communication, comprising:
- means for generating a first uplink control information segmentation based at least in part on a first subset of uplink control information comprising high priority data, wherein the first uplink control information segmentation comprises a first error detection code that applies to the first subset of the uplink control information;
- means for generating a second uplink control information segmentation based at least in part on jointly encoding the first subset of the uplink control information comprising the high priority data and a second subset of the uplink control information comprising low priority data, wherein the second uplink control information segmentation indicates the first subset of the uplink control information and the second subset of the uplink control information, wherein the second uplink control information segmentation comprises a second error detection code that applies to both the first subset of the uplink control information and the second subset of the uplink control information, wherein the second error detection code is based at least in part on jointly encoding the first subset and the second subset, and wherein a quantity of bits in the first error detection code for the first uplink control information segmentation is fewer than a quantity of bits in the second error detection code for the second uplink control information segmentation;
- means for polar encoding the first uplink control information segmentation to generate a first codeword;
- means for polar encoding the second uplink control information segmentation by loading first bits of the low priority data into first sub-channels of a polar code and second bits of the high priority data into second sub-channels of the polar code to generate a second codeword, the first sub-channels associated with higher reliability than the second sub-channels; and
- means for transmitting a signal that includes the first codeword associated with the first subset of the uplink control information and the second codeword associated with both the first subset of the uplink control information and the second subset of the uplink control information.

53. An apparatus for wireless communication, comprising:
- means for determining a first error detection code and a first bit sequence corresponding to a first subset of uplink control information comprising high priority data based at least in part on decoding a first polar-encoded codeword, the first polar-encoded codeword indicating the first subset of the uplink control information, wherein the first bit sequence comprises the first error detection code that applies to the first subset of the uplink control information;
- means for determining a second error detection code and a second bit sequence corresponding to a second subset of the uplink control information comprising low priority data based at least in part on decoding a second polar-encoded codeword, the second polar-encoded codeword indicating the low priority data of the second subset of the uplink control information based at least in part on first sub-channels of a polar code and indicating the high priority data of the first subset of the uplink control information based at least in part on second sub-channels of the polar code, the first sub-channels associated with a higher reliability than the second sub-channels, wherein the second bit sequence comprises the second error detection code that applies to both the first subset of the uplink control information and the second subset of the uplink control information, wherein the second error detection code is based at least in part on a joint encoding of the first subset and the second subset, and wherein a quantity of bits in the first error detection code is fewer than a quantity of bits in the second error detection code;
- means for performing error detection on the first bit sequence and the second bit sequence based at least in part on the determined second error detection code; and
- means for outputting, based at least in part on the error detection, one of: a combination of the first bit sequence and the second bit sequence or a decoding error.

54. A non-transitory computer readable medium storing code for wireless communication at a transmitter, the code comprising instructions executable to:
- generate a first uplink control information segmentation based at least in part on a first subset of uplink control information comprising high priority data, wherein the first uplink control information segmentation comprises a first error detection code that applies to the first subset of the uplink control information;
- generate a second uplink control information segmentation based at least in part on jointly encoding the first subset of the uplink control information comprising the high priority data and a second subset of the uplink control information comprising low priority data, wherein the second uplink control information segmentation indicates the first subset of the uplink control information and the second subset of the uplink control information, wherein the second uplink control information segmentation comprises a second error detection code that applies to both the first subset of the uplink control information and the second subset of the uplink control information, wherein the second error detection code is based at least in part on jointly encoding the first subset and the second subset, and wherein a quantity of bits in the first error detection code for the first uplink control information segmentation is fewer than a quantity of bits in the second error detection code for the second uplink control information segmentation;
- polar encode the first uplink control information segmentation to generate a first codeword;
- polar encode the second uplink control information segmentation by loading first bits of the low priority data into first sub-channels of a polar code and second bits of the high priority data into second sub-channels of the polar code to generate a second codeword, the first sub-channels associated with higher reliability than the second sub-channels; and
- transmit a signal that includes the first codeword associated with the first subset of the uplink control information and the second codeword associated with both the first subset of the uplink control information and the second subset of the uplink control information.

55. A non-transitory computer readable medium storing code for wireless communication at a receiver, the code comprising instructions executable to:
- determine a first error detection code and a first bit sequence corresponding to a first subset of uplink control information comprising high priority data based at least in part on decoding a first polar-encoded codeword, the first polar-encoded codeword indicating the first subset of the uplink control information, wherein the first bit sequence comprises the first error detection code that applies to the first subset of the uplink control information;

determine a second error detection code and a second bit sequence corresponding to a second subset of the uplink control information comprising low priority data based at least in part on decoding a second polar-encoded codeword, the second polar-encoded codeword indicating the low priority data of the second subset of the uplink control information based at least in part on first sub-channels of a polar code and indicating the high priority data of the first subset of the uplink control information based at least in part on second sub-channels of the polar code, the first sub-channels associated with a higher reliability than the second sub-channels, wherein the second bit sequence comprises the second error detection code that applies to both the first subset of the uplink control information and the second subset of the uplink control information, wherein the second error detection code is based at least in part on a joint encoding of the first subset and the second subset, and wherein a quantity of bits in the first error detection code is fewer than a quantity of bits in the second error detection code;

perform error detection on the first bit sequence and the second bit sequence based at least in part on the determined second error detection code; and output, based at least in part on the error detection, one of: a combination of the first bit sequence and the second bit sequence or a decoding error.

* * * * *